(12) United States Patent
Wootton

(10) Patent No.: US 8,686,644 B2
(45) Date of Patent: Apr. 1, 2014

(54) LIGHT GENERATOR SYSTEMS AND METHODS

(75) Inventor: Gerald R. Wootton, Cambridge (CA)

(73) Assignee: ATS Automation Tooling Systems Inc., Cambridge, Ontario (CA)

( * ) Notice: Subject to any disclaimer, the term of this patent is extended or adjusted under 35 U.S.C. 154(b) by 142 days.

(21) Appl. No.: 13/077,617

(22) Filed: Mar. 31, 2011

(65) Prior Publication Data

US 2011/0241549 A1   Oct. 6, 2011

Related U.S. Application Data

(60) Provisional application No. 61/319,732, filed on Mar. 31, 2010.

(51) Int. Cl.
*H01J 7/24* (2006.01)
*H01L 33/08* (2010.01)

(52) U.S. Cl.
USPC ........... 315/117; 315/113; 315/154; 315/151; 315/118

(58) Field of Classification Search
USPC ........... 315/117, 113, 154, 76, 151, 153, 152, 315/291
See application file for complete search history.

(56) References Cited

U.S. PATENT DOCUMENTS

| | | | |
|---|---|---|---|
| 4,122,383 A | 10/1978 | Von Roos et al. | |
| 4,641,227 A | 2/1987 | Kusuhara | |
| 5,568,366 A | 10/1996 | Jefferies | |
| 5,623,149 A | 4/1997 | Kilmer | |
| 5,984,484 A | 11/1999 | Kruer | |
| 6,541,754 B2 | 4/2003 | Matsuyama | |
| 6,548,819 B1 | 4/2003 | Lovelady | |
| 7,387,400 B2 * | 6/2008 | Nakata et al. | 362/192 |
| 7,934,841 B2 * | 5/2011 | Erchak et al. | 353/94 |
| 8,162,526 B2 * | 4/2012 | Erchak et al. | 362/612 |
| 8,251,520 B2 * | 8/2012 | Erchak et al. | 353/94 |
| 8,264,155 B2 * | 9/2012 | Negley et al. | 315/129 |
| 2002/0122305 A1 | 9/2002 | Adelhelm | |

(Continued)

FOREIGN PATENT DOCUMENTS

| | | |
|---|---|---|
| EP | 1998154 | 12/2008 |
| GB | 2 451 467 | 2/2009 |
| WO | 2008047528 | 4/2008 |

OTHER PUBLICATIONS

Canadian Intellectual Property Office (ISA/CA), Form PCT/ISA/237 Written Opinion of the International Searching Authority dated Jul. 22, 2011, International patent application No. PCT/CA2011/050179, Quebec Canada.

(Continued)

*Primary Examiner* — Vibol Tan
(74) *Attorney, Agent, or Firm* — Borden Ladner Gervais LLP; Neil Henderson

(57) ABSTRACT

A light generating system comprising: a plurality of solid state emitters (SSEs) and a stability control system for controlling the spectral stability of the SSEs. In a particular case, the stability control system may comprise: a power regulator to regulate power supplied to a sub-set of the plurality of SSEs; a constant current circuit connected to the power regulator to provide a constant current to the sub-set of SSEs; a current regulation set point connected to the constant current circuit; and a controller configured to set the regulation set point based on metrology relating to the state of the SSEs.

10 Claims, 36 Drawing Sheets

(56) References Cited

U.S. PATENT DOCUMENTS

| | | | |
|---|---|---|---|
| 2004/0223325 | A1 | 11/2004 | Ahrens et al. |
| 2005/0279949 | A1* | 12/2005 | Oldham et al. ............ 250/458.1 |
| 2006/0028168 | A1* | 2/2006 | Nishida ........................ 320/106 |
| 2006/0238750 | A1 | 10/2006 | Shimotomai |
| 2009/0261802 | A1 | 10/2009 | Askins et al. |
| 2009/0261810 | A1 | 10/2009 | Askins et al. |
| 2009/0279277 | A1 | 11/2009 | Jungwirth et al. |
| 2010/0001648 | A1* | 1/2010 | De Clercq et al. ............ 315/113 |
| 2010/0014080 | A1 | 1/2010 | Jungwirth et al. |
| 2011/0042709 | A1* | 2/2011 | Stark et al. ...................... 257/99 |

OTHER PUBLICATIONS

Canadian Intellectual Property Office (ISA/CA), Form PCT/ISA/210 International Search Report dated Jul. 22, 2011, International patent application No. PCT/CA2011/050179 Quebec Canada.

Luo, Y., Lange, R.F.M., Beljean, P.R.; "An All LED-Based Photovoltaic Testing System with Tunable Spectrum and User-Defined Illumination Modes"; 24th European Photovoltaic Solar Energy Conference; Sep. 21-25, 2009; Hamburg, Germany. http://www.eupvsec-proceedings.com/proceedings?paper=4188.

http://www.cresttech.com.au/.

Zaid, Ghufron; Park, Seongchong; Lee, Dong-Hoon; Park, Seung-Nam; "Linearity Measurements in LED-based Differential Spectral Responsivity Comparator of Photovoltaic Detectors"; Korea Research Institute of Standard and Science (KRISS); Daejeon, South Korea. http://photometry.kriss.re.kr/wiki/img_auth.php/d/d1/NEWRAD08.pdf.

Tsuno, Yuki; Koichi, Kamisako; Kurokawa, Kosuke; "New Generation of PV Module Rating by LED Solar Simulator—A Novel Approach and its Capabilities"; p. 1-5; Photovoltaic Specialists Conference; San Diego, CA 2008. http://ieeexplore.ieee.org/xpl/freeabs_all.jsp?arnumber=4922582, 2008.

http://www.cree.com/products/pdf/XLampXR-E_lumen_maintenance.pdf.

* cited by examiner

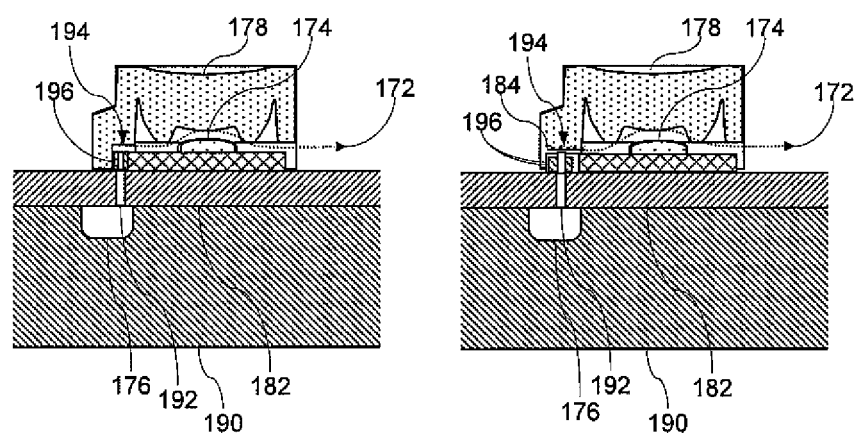

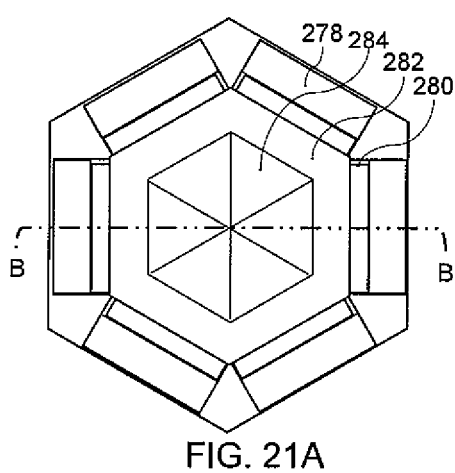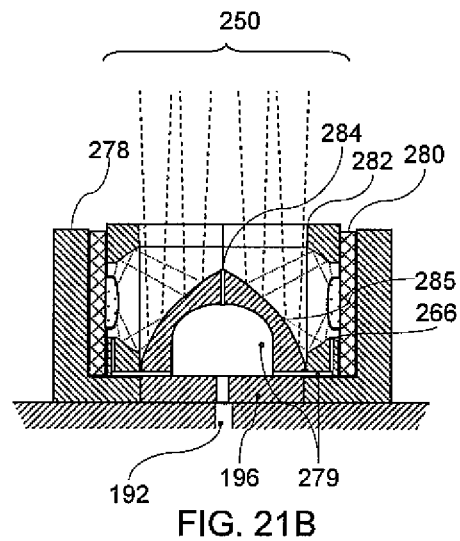
FIG. 21A
FIG. 21B

LIGHT GENERATOR SYSTEMS AND METHODS

CROSS-REFERENCE TO RELATED APPLICATIONS

This application claims priority from U.S. Provisional Patent Application No. 61/319,732, filed Mar. 31, 2009, which is hereby incorporated herein by reference.

FIELD

The present document relates generally to a light generator and methods of operating and using the light generator. More particularly, the present document relates to a light generator using solid state emitters and with application as a solar simulator.

BACKGROUND

A light generator is a device used to generate various types of lighting conditions for various applications that may require a particular brightness, spectrum or other characteristic of light. Light generators may be used in a variety of applications including, but not limited to, evaluation and processing of light sensitive products, controlling photochemical reactions with high accuracy and versatility and colour testing.

One particular application of a light generator is as a solar simulator, which is a device used to simulate solar radiation. While much of the following discussion relates to solar simulators, it will be understood that at least some of the principles and improvements described will apply to other light generator applications.

Solar simulators may be used in a variety of applications including, but not limited to, determining the response of a device or object when exposed to sunlight. Solar simulators allow this testing to be performed at will in a controlled and reproducible fashion.

A common application of a solar simulator is performance testing and classification of photovoltaic ("PV") cells and modules. In this application, the basic requirement of the solar simulator is to provide a fair approximation of sunlight so that performance of PV devices can be qualified and the outdoor performance of modules can be estimated from indoor production metrology. Such testing is useful during photovoltaic design and fabrication activities, as well as quality assurance in the factory and field. An advantage of a simulator is that the simulator may provide a reproducible set of conditions for obtaining performance measurements. It is important to be able to determine and optimize cell performance prior to field installation, as well as in-field testing.

Other applications of a solar simulator include performance testing and production quality control of sun-block or other Ultra-Violet (UV) protective products, measuring weatherability and fade resistance of materials, quality assurance for color matching of paint finishes, and performance testing of outdoor signs and other products that are generally used outdoors where cosmetic features are important. In these applications, spectral match with real sunlight over the entire spectrum may not be necessary. In accelerating lifetime testing intensity in excess of typical solar irradiation may be required.

Solar simulators generally consist of a source or sources to generate the light, delivery optics to direct the light and related drivers and controls. The design of the delivery optics influences the divergence and uniformity of the light over a target, such as a PV module or the like.

The prototypical source is a short arc xenon lamp. There are also alternatives to the xenon lamp, including mercury, mercury-xenon, quartz halogen lamps, metal halide and tungsten lamps. Conventional solar simulators using lamps can have a number of limitations or difficulties that are well documented in the literature, including: poor spectral match with nominal solar spectra, capability, stability, versatility, cost, and size.

More recently, solid state emitters have gained some attention with regard to solar simulators. While some improvements seem to have been made, current academic and known solar simulators using solid state emitters continue to have limitations or difficulties with regard to poor spectral matching, consistency of brightness, versatility of testing applications, complexity of control systems, and the like. A lack of versatility can severely limit what measurements (methods, systems, and applications) individual solar simulators can accomplish and can also limit their cost compared to their benefit.

In order to better understand the limitations of existing solar simulators, it is useful to understand the basics of solar radiation and current standards for solar simulators, and in particular, to standards relating to solar simulators for use with photovoltaic (PV) cells or modules (solar cells or modules).

The sun is, approximately, an incandescent source with a coordinated color temperature (CCT) of ~5600° K. The resulting spectrum spans from ultraviolet to infra-red (IR). Sunlight is filtered by the solar and the Earth's atmospheres with some strong absorption bands presented by the Earth's atmosphere. The resulting spectrum is therefore highly structured, and covers the ultraviolet to infra-red. A 'Standard' spectral power distribution for sunlight, known as air mass 1.5 global radiation or AM1.5G, is codified in the standard ASTM G173-03. This is a data set, which represents idealized sunlight under average atmospheric conditions for the continental USA at the average latitude of the continental USA at sea level (including direct and indirect radiation). It further assumes irradiance on a surface tilted towards the sun at noon at latitude where the total air mass in the path of the sunlight is 1.5 times the air mass ("AM") straight overhead. This defines a nominal spectral irradiance against which solar simulators may be judged. There are other possible standards that could be applied in certain cases such as AM00—extra-terrestrial radiation—and AM 1.5D—direct radiation only. It is typically the goal of a full spectrum solar simulator to provide a reasonable replica of this irradiation. Note that this standard irradiance (AM1.5G) includes direct sunlight with a subtended angle of ~0.53 degrees and diffuse sunlight, which has a much broader subtended angle, affected by atmospheric conditions, but is mostly contained within ~15 degrees.

A standard level of noon-time solar irradiance, generally referred to as '1 sun', assuming the AM1.5 atmospheric condition is taken to be 1 kW/m$^2$ although this is somewhat arbitrary as the ASTM standard provides a value which is slightly less and may be approximately 0.995. By convention, average solar irradiation at top of atmosphere is taken to have an irradiance of 1366 W/m$^2$, although satellite observations average closer to 1362 W/m$^2$ (which would change the ASTM model). In any case, the exact value would vary somewhat at different times of the year due to eccentricities in the terrestrial orbit with longer term cyclic variations.

The existing standards for photovoltaic solar simulators (e.g. IEC 60904-9, ASTM E927-05, JIS C 8912) divide the standard spectrum into six wavelength bands, and consider only the proportion of power within each band, with no concern of how spectral power is distributed within a band. The simulators are then classified in terms of how well their output compares to standard sunlight according to three criteria: spectral match, uniformity of intensity over the output area, and stability with time. Classifications include A, B and C, A being the best generally for spectral match, spatial uniformity and stability. Spectral class limits A, B & C are further discussed below. Directionality and out of-band irradiation levels are not specified.

TABLE 1

Classification Standards of Solar Simulators

| | Organization | | | | | | | | |
|---|---|---|---|---|---|---|---|---|---|
| | ASTM | | | IEC Standard | | | JIS | | |
| | E927-05 | | | 60904-9 Class | | | C 8912 | | |
| | A | B | C | A | B | C | A | B | C |
| Spectral match (low/high) | 0.75 1.25 | 0.60 1.40 | 0.40 2.00 | 0.75 1.25 | 0.60 1.40 | 0.40 2.00 | 0.75 1.25 | 0.60 1.40 | 0.40 2.00 |
| Irradiation uniformity (±%) | 3 | 5 | 10 | 2 | 5 | 10 | 2 | 3 | 10 |
| Short term stability (±%) | — | — | — | 0.5 | 2 | 10 | — | — | — |
| Temporal stability (±%) | 2 | 5 | 10 | 2 | 5 | 10 | 1 | 3 | 10 |

Solar simulators are typically expected to produce a nominal irradiance of approximately 1 kW/m$^2$; however, performance testing for other conditions such as equatorial (AM1.0) or high elevation or extraterrestrial conditions may require as much as 37% greater irradiance. Similarly, accelerated lifetime testing and light soaking applications will often require higher irradiance. Low light level performance may also be of interest, particularly when testing photovoltaic or solar thermal devices. The noted standards do not fully address this issue nor do conventional solar simulators allow for these additional types of testing.

In the context of PV devices, the most commonly measured parameters are related to the PV device's electrical characteristics (so called current versus voltage ("IV") curve) under one or more light levels and a prediction of the PV device's power production capability. In a PV testing environment, reference cells play an important part by providing a means to accurately quantify the light output from the solar simulator, and calibrate the testing system. Traceable reference cells calibrated to a standard solar spectrum are generally supplied by recognized test labs such as NIST.

Currently, solar simulators are typically used to measure photoelectrical conversion efficiency and possibly some other properties in two or three places in the production process of photovoltaic cells and modules: cell testing & sorting (after metallization), cell string testing (after tabbing and stringing and during bussing and layup, TF module after back-contact formation), module testing and certification (after final assembly). There may be other opportunities to apply solar simulators in the manufacturing process; however, this is not generally done, possibly due to the cost and bulk of conventional solar simulators.

There are various platforms of photovoltaic cell technologies in the market place, such as mono and poly-crystalline silicon and amorphous silicon, thin film arrays, Ge and GaAs based multi-junction, CdTe, CIS, CIGS, concentration strategies, as well as several emerging technologies. Each of these platform technologies has different optical and electrical properties, and, as such, a different set of requirements with regard to how to test with an equivalent of standard sunlight. These differences are generally not easily handled by conventional solar simulators and are also generally not reflected in current standards for solar simulator performance.

A study of European test labs showed that state of the art reproducibility was no better than ±2.5% for conventional (Si) devices. Photometric accuracy, which is not addressed in the previous standards, should also be required. A recent inter-comparison of recognized test lab results showed power ratings for mono-Si, a-Si, and CIS modules deviated by 7.4%, 16.9%, and 11.6%, respectively. ISO considers "Lack of Performance Data" & "Uncertainty in Module Performance Ratings" to be barriers to adoption of PV, referring to the current uncertainty in ratings estimated to be +/−6%. These are enormous uncertainties to be introduced into large-scale commercial ventures such as large-scale solar farms, which can exceed $1 B in capitalization. Issues of non-reproducibility have at least two kinds of impact: the ability to research, develop and optimize technologies and processes depends on the precision of the available metrology; the ability to accurately predict performance is a substantial commercial issue since product selling price is largely tied to power ratings of the devices.

There have been several formal studies into this area. The EC 'Performance' project is conducting extensive studies including two consecutive round robin inter-comparisons where solar simulators results from several test labs are being compared—the end goal being reproducibility of +/−1% while initial results showed −2/+3%. These results are obtained after normalizing the results to an outdoor reference and consequently, do not represent the total spread in data that might be seen in convention practice with production line meteorology Also, these results were obtained using primarily c-Si PV modules and averaging results, where this is the least problematic PV technology to measure. In a related project 'PC-Catapult' a similar round robin trial was performed—in this case, sources of variability were examined using formal gage capability studies revealing measurement uncertainty a large as 7% (Pmax) based on module type and 8% based on simulator model. Another EC project 'Crystal Clear' performed similar studies. Photon Labs, produces an annual comparison of real world module performance to ratings which also shows a substantial spread, +6.3/−3.9%, which has significant commercial implications and can, at least in part, be attributed to problems with in-house metrology and/or lack of agreement between test labs. The general conclusion from this information was that there is room for improvement.

Of note, test labs that are responsible for certifying PV modules, providing reference cells and qualified cell and module sample sets, are currently reduced to using the same or similar devices as manufacturers. The same may be said for research labs and other technology developers and for Q/A metrology in the industry. This is at variance with the rule of thumb that metrology should have a precision to tolerance ratio (P/T) of <0.33 for production management, <0.20 for process control and <0.1 for quality assurance and <0.01 for standards. This would imply a structured regime where devices with performance ranging from fair to good to excellent are available on the market. This is currently not the case.

Based on the above issues and difficulties with conventional solar simulators, there is a need for improved light generators that can be used as solar simulators and in other applications.

SUMMARY

In one aspect herein, there is provided a light generator or solar simulator using solid state emitters (SSEs) as the source of radiation. The light generator incorporates methods of combining and managing these SSEs including a system and method of current regulation and a system and method of integrating thermal management into optical elements.

The embodiments of a solar simulator herein are intended to have output that is better spectrally matched to standard solar light, to be more versatile, more reproducible, more compact, longer lived, more efficient, more accurate and stable, and more scalable than conventional solar simulators. This provides improved performance and/or cost and/or versatility compared to existing solar simulators.

In overview, a solar simulator is provided that is intended to be able to combine solid state emitters with a preferred selection of spectral output to achieve good spectral match to standard sunlight along with controls and feedback devices to produce a solar simulator that may allow an increase in resulting performance. There are several advantages that may result including, but not limited to:
  better spectral match to solar radiation;
  ability to vary spectrum rapidly and without moving parts;
  better stability and accuracy of intensity and spectrum, both short term and long term;
  better reproducibility of intensity and spectrum (gauge to gauge);
  more versatile operation, such as programmable modulation of light intensity;
  spectrum, pulse duration and spatial distribution of light;
  improved spatial illumination uniformity;
  improved TCO including reduced maintenance, energy use and use of floor-space; and
  improved capability with reduced capital costs by displacement of other test equipment, for example, color checking, carrier mobility and QE measurement, and photoluminescence testing.

In one aspect, a solar simulator is provided that makes use of a combination of SSEs in a two dimensional arrangement. This arrangement can provide a smaller or larger (extended) source, which can be spatially matched to the size and shape of the object being illuminated, and may therefore be an efficient use of light, providing precise regional control of intensity of the illumination field. Further, the solar simulator may be constructed in a modular manner such that smaller solar simulators may be combined together to make a larger solar simulator. This scalability and modularity can generally be accomplished while maintaining functionality, general space requirements (i.e. working distances), and not necessarily requiring increased complexity. It should be noted that, in some cases, spatial distribution of illumination may also be controlled optically.

In one aspect, a solar simulator is provided that is comprised of solid state emitters with a variety of emission spectra that can be combined to provide a broad spectrum, which by use of appropriately selected peak wavelengths and intensity control may provide a sufficiently good spectral match, which can be readily adjusted and calibrated. Given the quality of spectral match, spatial uniformity and stability, new classes of performance (defined below) such as classes X, Y, Z, A+, A++ or existing classes A, B or C can be accomplished economically when a number of emitters with different wavelengths are combined.

In another aspect, solid state emitters of multiple different peak wavelengths may be controlled to provide a variable spectrum with rapid modulation. This aspect may be advantageous for various advanced measurement methods including determining the relative efficiency of sub-cells in a tandem/multi-junction solar cell, measuring carrier mobility, measuring quantum efficiency and cell efficiency. It may also provide for the bias lighting required for some advanced measurement methods without the need for an additional lighting device/solar simulator. It may be useful when integrating luminescence or thermographic imaging with normal testing as wavelengths used for imaging can be briefly suppressed during the imaging system exposure times.

In a further aspect, a solar simulator is provided that drives the SSEs with improved precision, both for steady state operation, pulsed or step-pulse operation, control of pulse duration or a mixture of the two, and transient control of pulse shape. For time scales greater than 5 μs, arbitrary intensity waveforms (intensity vs. time) are provided. Programmable control may allow for any waveform, limited only by the 5 μs time constant. This is an arbitrary time scale as frequency response of SSE devices is typically much higher but represents a practical limit where PLC I/O can be practically employed for control as well as being a time domain where thermal effects are small. It may be contemplated that, in future, industrial control technologies will permit still finer time resolution, for example, Beckhof XFC technology which supports subsampling down to 0.01 μs resolution. In a typical 'flash' tester, pulse duration is in the order of 2 to 10 milliseconds so this time resolution resolves a pulse into at least 400 parts. This aspect may allow intensity stability better than 1% and 0.1% to be accomplished, as well as protection for the SSEs from over-current improving their lifetime, precision controlled intensity over a full 10× or greater turndown ratio, precise repeatability, and versatile optical biasing and light soaking techniques.

In one aspect, a precision emitter driver may use feedback information of spectral output and spatial illumination uniformity to better control stability and calibration. In addition, thermal feedback information looped into the driver may be used to compensate for thermal drift of intensity and spectral output of the solid state emitter assembly. In addition, feedforward control using predictive heuristics may also be used.

In another aspect, SSE control is programmable. Programmable controls permit a great range of versatility of the spectral output, amount of irradiance, temporal pulse shape, and illumination spatial distribution. Stability and repeatability may be enhanced; feedback of the electrical, optical and thermal performance may be available to the programmable logic, allowing the system to self-learn and adjust.

The embodiments of the solar simulator may include measurement of junction temperature of the emitters, and provides information on the thermal management of the emitters and current supply to the emitters.

The embodiments of the solar simulator may have several means of thermal management of the SSEs both individual emitters and collectively. This thermal management may allow for better intensity and spectral, stability and reproducibility. These means may include regulated air flow controlled for temperature, flow rate and directionality, regulated heatsink temperature and runtime measurement or prediction of solid state emitter junction temperature that may be used to compensate in order to minimize thermal drift of the solid state emitter.

The embodiments of the solar simulator may also have optical means for achieving the desired low collimated light or divergence illumination throughout the target area. The necessary degree of collimation depends on the performance requirements and classification of the simulator. In this apparatus, collimating optics may be reflective, refractive, diffractive or a combination thereof. Collimating optics may be further used to combine the output of several SSEs and may also incorporate features to further shape and/or homogenize the light output such as micro optical reflective or refractive surfaces.

Combination of the SSEs may also be achieved optically and may result in good spatial uniformity at the target. In general, the minimum working distance is defined to be sufficient that any illuminated area is in the far field of at least several SSEs so that the desired spatial uniformity is obtained. This may be readily obtained by combining the typical spatial distribution of the several devices and associated optics, if any. Solid state emitters may be combined in a regular matrix where a square matrix is preferred for possible convenience of assembly but a hexagonal matrix may provide better uniformity for a given working distance.

Additionally, micro-optic surfaces may be used to reformat the light output from the collimating optic to a distribution that is more like the device matrix; for example, a square pattern for a square matrix or a hexagonal pattern for a hexagonal matrix.

Optical means may also be incorporated to allow segmentation of the target area into smaller regions, while maintaining the desired collimation and intensity uniformity. This may consist of reflective baffles, which are configured with a slight draft angle in such a way that the reflected (virtual) image of nearby emitters is of the same intensity as the direct image allowing for reflectance losses.

The simulator may also be equipped with light level and spectral sensing of the target illumination. In addition, a traceable reference cell may be used for calibration of the unit. This apparatus may have optical sensors integrated into the light source without any shadowing or occlusion of the target, which may be advantageous and may serve to extend the capability of the light source to support concurrent measurements of various properties and automated calibration.

Advanced testing capabilities may be provided by using the embodiments of the solar simulator. The solar simulator may have the ability to perform quantum efficiency ("QE") testing of the device under test, color inspection of the target, spectral reflectance measurement of the target, IV testing.

According to an embodiment herein, there is provided a light generating system comprising: a plurality of solid state emitters (SSEs); a stability control system for controlling the spectral stability of the SSEs.

In a particular case, the stability control system may comprise: a power regulator to regulate power supplied to a sub-set of the plurality of SSEs; a constant current circuit connected to the power regulator to provide a constant current to the sub-set of SSEs; a current regulation set point connected to the constant current circuit; and a controller configured to set the regulation set point based on metrology relating to the state of the SSEs.

In this case, the stability control system may further comprise: a junction voltage monitor that senses the voltage for at least one junction of the sub-set of SSEs and provides metrology data to the controller for adjusting the regulation set point.

Alternatively or in additionally, the stability control system may further comprise: a temperature sensor that senses the temperature of at least one junction of the sub-set of SSEs and provides metrology data to the controller for adjusting the regulation set point.

In another particular case, the plurality of SSEs may comprise an encapsulant and the light generator system may further comprise: a thermal management system configured to cool at least one solid state emitter including direct cooling of its encapsulant or window and/or other optical elements. In this case, the thermal management system may comprise a gas cooling system comprising: a gas delivery system; and a gas jet configured to receive gas from the gas delivery system and direct it over the encapsulant.

According to another aspect herein, there is provided a solid state emitter element comprising: at least one solid state emitter; an encapsulant covering the at least one solid state emitter; and a thermal management system configured to cool at least one of the encapsulant and the at least one solid state emitter.

In this case, the thermal management system may comprise: a gas cooling system comprising: a gas delivery system; and a gas jet configured to receive gas from the gas delivery system and direct it over the encapsulant. In this case, the gas jet may comprise an airfoil to provide gas flow with the Coanda effect.

According to another aspect herein, there is provided a solid state emitter module comprising: a plurality of solid state emitter elements; a plurality of optical elements; and a support structure, wherein the support structure is configured such that each solid state emitter element is oriented perpendicular to the intended direction of light emission and the plurality of optical elements are configured to direct light from each solid state emitter element in the intended direction of light emission.

According to another aspect herein, there is provided a solid state emitter module comprising: a plurality of solid state emitter elements; a plurality of optical elements; and a support structure, wherein the support structure is configured such that each solid state emitter element is oriented planar to the intended direction of light emission and the plurality of optical elements are configured to direct light from each solid state emitter element in the intended direction of light emission.

According to another aspect herein, there is provided a solid state emitter module comprising: a plurality of solid state emitter elements; and a support structure for supporting the plurality of solid state emitter elements in a radial arrangement, wherein the support structure is configured such that each solid state emitter element is positioned at a side of the radial arrangement. One particular form of radial arrangement is hexagonal.

In a particular case, the solid state emitters may be arranged in clusters.

In another particular case, the support structure may incorporate optical elements.

In yet another particular case, the support structure incorporates air passages for the distribution of cooling air to the optical elements.

In still another particular case, the support structure may have a multiplicity of facets, at least 3, and up to at least 16 facets.

In still yet another particular case, the support structure incorporates pluggable electrical and pneumatic connections.

In a further particular case, the solid state emitter module may further comprise a light sensor and wherein the support structure is configured such that the light sensor is positioned at a central point of the radial arrangement. In this case, the optical sensor may be an intensity sensor, a color sensor, a reference cell or a traceable reference cell which may further be a single element, line or array sensor. It will be understand that the light sensor may be positioned at other locations such that light sensors are interspersed in a light generating apparatus.

Optical sensors can be used for many purposes, including: used in conjunction with standard reflectance targets to calibrate the spatial uniformity of the light produced by the light generating system; used in conjunction with standard reflectance targets to calibrate the spectrum of the light produced by the light generating system; used in conjunction with standard reflectance targets to calibrate the spatial uniformity of the spectrum of light produced by the light generating system; used in conjunction with standard reflectance targets to calibrate the dynamic thermal constants of the light produced by the light generating system; used to measure the reflectance of an object being illuminated by the light generating system; used to measure the color of an object being illuminated by the light generating system; used to perform visual inspection of the object being illuminated including any or all of direct visual imaging, spectrographic imaging and luminescence imaging; used to measure the gloss of the object being illuminated;

Alternatively, a smaller or greater number of solid state emitters and or sensors may be combined in a similar arrangement with an appropriate geometric configuration, for example, triangular, square, pentagonal, heptagonal, octagonal, etc.

In another particular case, the support structure may be configured such that each solid state emitter element is oriented perpendicular to the intended direction of light emission and a plurality of optical elements are configured to direct light from each solid state emitter element in the intended direction of light emission.

According to another aspect herein, there is provided a light generating system comprising: a plurality of solid state emitter elements; a barrier for dividing the plurality of solid state emitter elements into one or more regions.

In a particular case, the barrier may comprise a reflective wall arranged substantially perpendicular to a plane of the solid state emitter elements and having a predetermined length and having a predetermined taper from the plane of the solid state emitter elements over the length of the reflective barrier.

In another particular case, the one or more regions may comprise substantially all of the plurality of solid state emitter elements such that the barrier is an edge barrier around a module formed of solid state emitter elements.

In another particular case, the one or more regions may be independently controlled.

Embodiments herein are intended to provide a light generating system wherein: the spectrum and intensity can be independently controlled within portions of the illuminated area; intensity and spectrum may be varied in a controlled sequence; the spectrum can be optimized to the spectral response of the object being illuminated; the light generating system is capable of exceeding standard solar simulator class A performance including classes A'A+, A++, Z, Y, X (classes are further defined herein) as needed.

In particular, it is expected that intensity and spectrum can be varied to a resolution of 10 microseconds and preferably 5 microseconds and preferably 1 microsecond and produced with a precision of at least 1 microsecond and preferably 0.1 microsecond and preferably 0.01 microsecond. Further, overall intensity and intensity of individual spectral components are expect to be varied by at least 10:1 and preferably 20:1 and 100:1.

This ability to control spectrum and intensity is intended to allow: the spectrum to be optimized for functional testing of PV devices, such as cells, strings, layups or modules, in order to minimize unnecessary heating; the spectrum to be optimized for functional testing of PV devices, such as cells, strings, layups or modules, in order to enable functional elements of the device such as window layer activation and sub-cell performance in stacked or multi-junction devices; optimization for testing of particular PV devices including c-Si, a-Si, CdTe, CIS, CIGS and triple junction devices; optimization for testing of UV sensitive materials and UV protective materials; optimization for the testing of color, in particular, where dominant wavelengths have been selected to coincide with peak pigments or colorants spectral response; and optimization for luminescence imaging.

Based on at least some of the improvements disclosed, embodiments of the solar simulator are intended to provide increased temporal stability and spatial uniformity. In various embodiments, solar simulators exceeding class A performance (performance classes are defined further herein) for superior production control or class Z performance for quality assurance and product certification applications or class X performance for scientific applications can be accomplished. They are also intended to have operating lifetimes that are better than existing solutions.

Alternatively, embodiments of the solar simulator herein may achieve B or C class performance, while being less costly than current technology, more compact, and more versatile.

BRIEF DESCRIPTION OF FIGURES

Embodiments will now be described, by way of example only, with reference to the attached Figures, wherein:

FIG. 11A illustrates refractive collimating optics with added flow features;

FIG. 11B illustrates refractive collimating optics with molded flow features;

FIG. 21A is a plan view of a cluster of SSEs arranged around a multifaceted reflector to form a modular SSE array subassembly;

FIG. 21B is a cross section view of FIG. 21A at line B-B;

DETAILED DESCRIPTION

Figure 1:
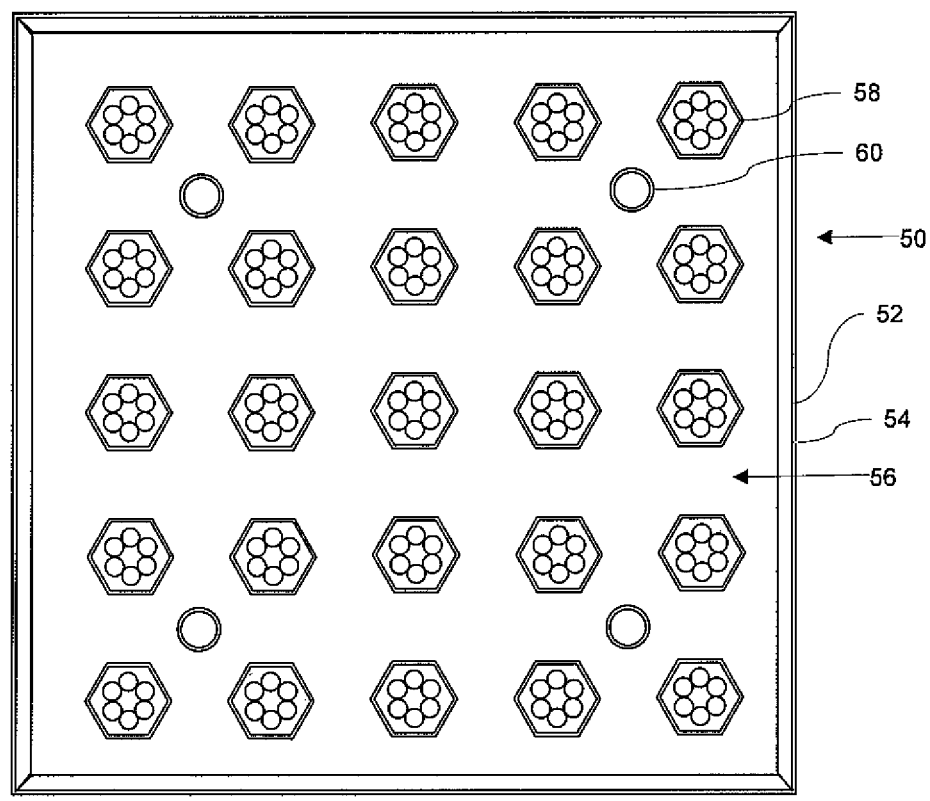
FIG. 1 is a plan view of a solar simulator.

In the following description, numerous specific details are set forth in order to provide a thorough understanding of the example embodiments described herein. However, it will be understood by those of ordinary skill in the art that the embodiments described herein may be practiced without these specific details. In other instances, well-known methods, procedures and components have not been described in detail so as not to obscure the embodiments described herein. Furthermore, this description is not to be considered as limiting the scope of the embodiments described herein in any way, but rather as merely describing the implementation of the various embodiments. The embodiments are not intended to be limited to the specific details of any one example embodiment or to specific details that may be common to multiple, or all, example embodiments. The applicants, inventors or owners reserve all rights that they may have in any embodiments disclosed herein, for example the right to embodiments claimed in a continuing application, and do not intend to abandon, disclaim or dedicate to the public any such embodiments by disclosure of this document.

The following description makes use of various terms that are defined generally here for ease of reference:

Photovoltaic (PV) device: A photovoltaic device converts electro-magnetic-radiation into electrical energy and is typically a two terminal device and is sometimes referred to as a solar cell or solar device;

Light: The term "light" is used in a broad sense and is intended to include regions of the electro-magnetic-spectrum beyond the visible light spectrum, including both the ultra-violet and near infra-red;

Cell: A solar cell, or PV cell is an individual photovoltaic device which is typically an element combined with additional cells on an individual substrate or platform to produce a PV or solar module or battery;

Module: A module is a group of cells electrically and mechanically connected, which are integrated into an enclosed package. The electrical connection may be partially series and partially parallel. The mechanical arrangement is typically planar, and is sometimes referred to as "flat plate", however other mechanical arrangements can be used;

Source: Refers to any source of light;

Emitter: A device that is a source of light;

LED: A light emitting diode is a solid state emitter that uses a junction in forward bias to induce irradiative carrier recombination. LED devices may incorporate phosphors or quantum dot coatings to absorb and reradiate light altering the spectrum of the radiated light (Sometimes called white, phosphor converted or PLEDs and QLEDs respectively). Some devices use lattice structures, Bragg filters or other elements to the light emission. In many cases, 'high brightness' LEDs are composed of multiple chips integrated into a single device. Hence the term LED is quite broadly used to refer to LEDs per se and to simple devices where LEDs are the primary source of light;

Solid State Emitter (SSE): A device that emits light from the recombination of electrons and holes within a semiconductor, though subsequent methods or mechanisms may be used to modify or enhance the light output. Many lighting class devices employ mechanisms that go beyond the simple carrier decay mechanism of an LED and often use photon conversion techniques to modify the spectral output. Spectral output may be modified by the application of secondary materials such as phosphors and quantum dots; as an example, white LEDs are most commonly bi-modal devices consisting of a short wavelength emitter combined with wavelength converting phosphor resulting in broad spectral output (similar in operation to a fluorescent lamp). Another approach is the use of narrow spectrum wavelength conversion material to create high efficiency emitters with output wavelengths where the semiconductor technology does not currently support high efficiency devices (e.g. green and yellow emitters). Other similar devices may also be used to produce light; laser diodes being one example, particularly VCSELs and edge emitting devices which have radiation patterns which roughly resemble LEDs but are more tightly constrained. Laser diodes may be particularly useful because of their ability to produce light in parts of the IR spectrum where LEDs are deficient, particularly at wavelengths where they are a mature commercial commodity. Organic LEDs (OLEDs) produce light by recombination generally facilitated by the injection of carriers from adjacent semiconductor material into a layer which is often combined with a phosphor so that light may be produced by electroluminescence and/or fluorescence. Also, in some cases, a single lighting device may, for various reasons of brightness, spectrum, thermal management, light distribution, etc., incorporate multiple semiconductor chips, with various other optical and electronic parts including temperature sensors. For these reasons, we use the term 'solid state emitter' and SSE to cover the range of lighting devices that use semiconductor devices to provide the primary conversion of electrical energy into light. Any of these various devices may be incorporated into a solid state solar simulator.

As noted above, various standards exist for solar simulators (such as those from ASTM, IEC, JIS). It is submitted that these standards do not address matters such as: providing the requirements for achieving gauge repeatability and reproducibility ("R&R") of better than 1% on key product parameters; special requirements for new technologies such as spatial uniformity for thin film arrays, spectral uniformity for multi-junction cells; collimation and aiming for concentrator modules; detailed spectral match requirements; no detailed stability or uniformity requirements. The lack of detailed spectral match, stability and uniformity can be problematic for multi-junction devices and situations where reference cell spectral response differs substantially from that of the product under test. It should be clearly noted that these existing standards, in addition to having loose spectral requirements, do not cover the entire spectrum to which some PV technologies are sensitive, nor do they specify temporal stability of spectrum.

In order to provide a framework to better understand improved solar simulators based on embodiments described herein, extensions to the classification scheme with classifications superior to "class A" are proposed here. The goal is to improve the gauge R&R of test systems using solar simulators and to improve the correlation of test results with actual outdoor performance as well as improve the metrology used for research and development; all of which clearly requires higher levels of performance than currently considered in the standards. These new classifications call for improved spectral match, stability and uniformity of irradiance. These classifications also allow for 'cold' simulators which would be suitable for PV testing of some technologies and/or photoluminescence based testing, and 'hot' simulators which would be suitable for testing PV devices which incorporate pyrophotonic or photon stacking technologies as well as thermal solar modules and hybrid PV modules. As described in more detail herein, embodiments of the light generator herein are intended to provide capability to meet these new standards classifications.

New classifications proposed include:

Extensions to the existing standards such as:

1. Class A': same as existing class A but with specification of radiation above and below the currently defined bands as illustrated in FIG. 27B;

2. Class A+: similar to class A' with improved more tightly specified performance such as gage R&R as illustrated in FIG. 27B; and 3. Class A++: similar to class A+ with very tightly specified performance as illustrated in FIG. 27B.

Figure 28:
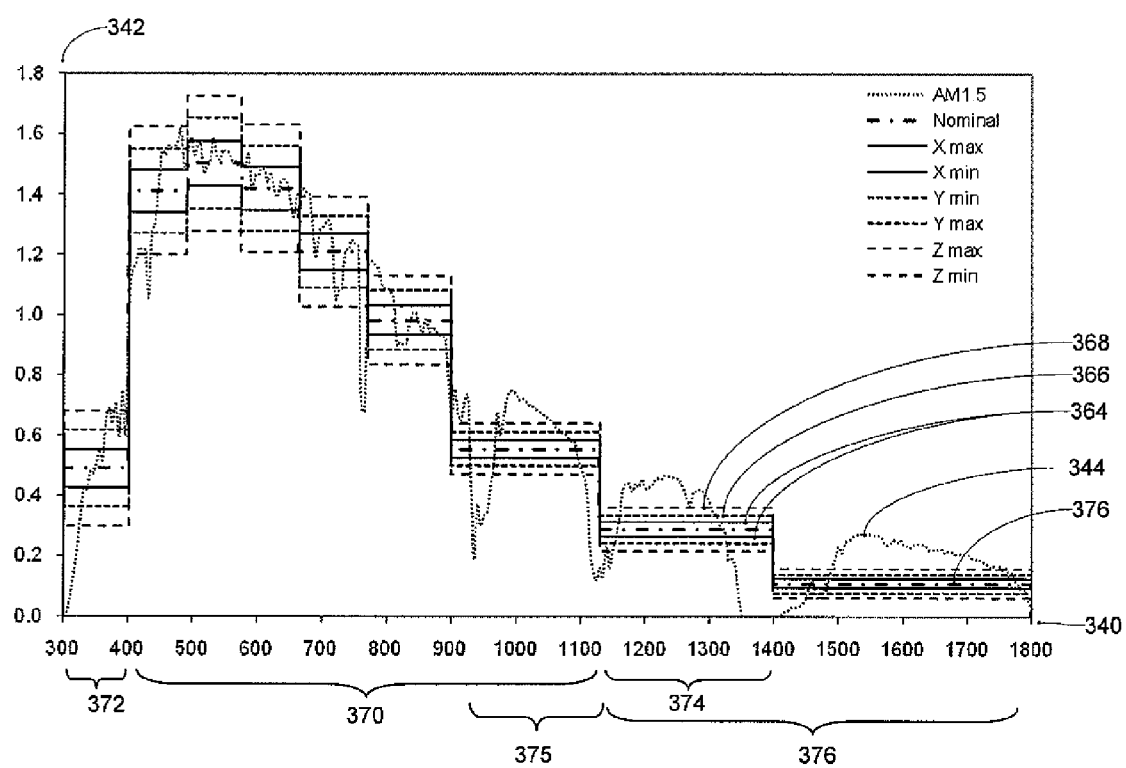
FIG. 28 is a graph shown graphical representation of new spectral match class X, Y and Z limits versus AM 1.5 spectrum.

A new standard based on more uniformly distributed spectral bands as illustrated in FIG. 28 and tight specifications, which is a particular innovation described here:

1. Class Z: significantly higher performance than class A with tighter specifications and broader spectral range;

2. Class Y: similar to class Z but more tightly specified; and

3. Class X: highest technical performance solar simulator.

Introduction of sub-classes for more application-specific functionality which is another particular innovation described here (illustrated in FIG. 27B & FIG. 28):

1. Subclass U: add a UV band;

2. Subclass H: add an IR band;

3. Subclass T: add two IR bands; and

4. Subclass C: drop the NIR band.

These new classifications are introduced here as terms of reference as a convenience in describing higher levels of performance than the current standards provide for.

TABLE 2

Comparison of Selected Advanced Classification Schemes

| | Class | | | | | |
|---|---|---|---|---|---|---|
| | X | Z | A+ | A | B | C |
| Standard | Novel new classifications | | | IEC 60904-9 | | |
| Description | Research grade | Quality standard | Production | Current best | Non-critical | Non-guaging |
| Nominal gage R&R | ±1% | ±1.5% | ±2% | ±4% | ±10% | N/A |
| Operating range | 0.2-1.3 suns | 0.3-1.2 suns | 0.5-1.2 suns | N/S | N/S | N/S |
| | Spectral content (nm) | | | | | |
| Standard | 400 ... 1130 | 400 ... 1130 | 400 ... 1100 | 400 ... 1100 | 400 ... 1100 | 400 ... 1100 |
| Out of band | <2% | <4% | <5% | N/S | N/S | N/S |
| *.C (cold) | UL = 900 | UL = 900 | UL = 900 | N/S | N/S | N/S |
| *.U (UV) | LL = 300 | LL = 300 | LL = 300 | N/S | N/S | N/S |
| *.H (hot) | UL = 1400 | UL = 1400 | UL = 1400 | N/S | N/S | N/S |
| *.T (thermal) | UL = 1800 | UL = 1800 | N/S | N/S | N/S | N/S |
| Sample area | Same as uniformity | Same as uniformity | Same as uniformity | N/S | N/S | N/S |
| Spectral Match | 0.95-1.05 | 0.85-1.15 | 0.85-1.15 | 0.75-1.25 | 0.6-1.4 | 0.4-2.0 |
| AM 1.5 correlation | ≤0.45 W/m$^2$/nm | N/S | N/S | N/S | N/S | N/S |
| | Spatial distribution | | | | | |
| Uniformity | ≤1% | ≤2% | ≤2% | ≤2% | ≤5% | ≤10% |
| Divergence | ≤5 deg | ≤7.5 deg | ≤10 deg | N/S | N/S | N/S |
| Sample area | <1/64th & <100 cm$^2$ | <1/64th & <100 m$^2$ | <1/64th & <200 cm$^2$ | <1/64th & <400 cm$^2$ | <1/64th & <400 cm$^2$ | <1/64th & <400 cm$^2$ |
| Spectral uniformity | ≤2% | ≤5% | ≤5% | N/S | N/S | N/S |
| | Stability & reproducibility | | | | | |
| Short term stability | <0.2% | <0.5% | <0.5% | <0.5% | <2% | <10% |
| Long term stability | <0.5% | <1.5% | <1% | <2% | <5% | <10% |
| Spectral instability | <1% | <3% | <3% | N/S | N/S | N/S |
| Reproducibility | <2% | <3% | <4% | N/S | N/S | N/S |
| Sample size | 100 | 200 | 250 | Arbitrary | Arbitrary | Arbitrary |

In particular, the spectral match specification is suggested to be improved as follows:

Out-of-band content has a specified upper limit on spectral power to avoid unpredictable results with technologies that have a response outside of the defined spectrum.

Spectral match is extended to cover a larger amount of the solar spectrum:

Subclasses with IR bands are added or removed to support cold and thermal testing options.

A subclass with a UV band has been added (Note: 340 nm is the approximate cut-off for white glass).

IR bands are synchronized with minima in sun spectrum.

Measurement of temporal stability according to the IEC standard allows arbitrary sampling rates or, more exactly, sampling rates of an arbitrary measurement system as well as an arbitrary number of samples. Consequently, classification is dependent on a specific undefined metrology and classification has indeterminate statistical significance. The proposal here is to define a specific sampling rate with a minimum sample size for new classifications.

All variances are defined and calculated as $\Delta i=[i_{max}-i_{min}]/[i_{max}+i_{min}]$ consistent with the IEC standard.

For new classes, STI may be measured using at least 10 sample intervals in comparison with existing standards that have no minimum sample size creating the possibility of statistical anomalies.

Spectral correlation is defined as $\Delta s=\sqrt{\Sigma(i_n-a_n)^2/N}$ where irradiance of the light source (i) is correlated to the standard solar spectrum (a) as defined in ASTM G173 using 5 nm sampling intervals over the specified spectral range.

According to the above classification scheme, spectral match is proposed to be evaluated using spectral bands of approximately equal solar spectral irradiance between the standard range of approximately 400 nm and 1100 nm rather than arbitrary fixed intervals. Irradiance outside of this range of spectral bands for which there is a specified irradiance is considered to be of little consequence; however, the maximum allowable amount of radiation is also specified.

FIG. 1 shows a general example of a light generator using SSEs that is configured to operate as a solar simulator 50. The solar simulator 50 includes an enclosure 52, a perimeter reflector 54 around the edges of the enclosure, a lamp base 56, sometimes referred to as array surface, on which are mounted a plurality of SSE modules (sometimes called SSE pods or emitter pods), and one or more light detectors or sensors for detecting light. Lamp base 56 provides a supporting structure that may incorporate thermal management, optics airflow manifolds, wiring harnesses, etc. which interconnects providing plug replacement of emitters and sensors. The enclosure for the solar simulator (and the lamp base 56) typically includes a support plate, a heat sink plate supported on the support plate, and a plurality of SSE modules arranged on the heat sink plate. The solar simulator also includes a control system for controlling the SSE modules and other elements of the solar simulator. As described in further detail below, the SSE modules include SSEs that emit light that may be collimated and conditioned by optical devices such as lenses or reflectors. The SSEs may be stability and thermally managed by including various elements, including regulated current sources, regulated power supplies, by providing various heat-sink related elements and including a regulated flow of air across the SSEs and also including various sensors such as current sensors and temperature-sensing systems to provide feedback. Stability and thermal management allows for controlled intensity and wavelength output of the SSEs and the determination of and compensation for SSE operating temperature changes that can impact SSE characteristics such as brightness, spectrum and life span. Further aspects of the solar simulator will be described in more detail below.

As noted above, the source of light in the present embodiment is the plurality of SSEs. One example of an SSE is an LED (light emitting diode). LED devices emit a relatively narrow spectrum (20→40 nm FWHM for visible wavelengths). Peak wavelength is dictated by the semiconductor band-gap. High brightness devices are available with wavelengths in the range 365 nm (UV)→1550 nm (NIR), covering most of the solar spectrum. Recently, multi-wavelength devices have been demonstrated. Many lighting class devices employ mechanisms that go beyond the simple carrier decay mechanism of an LED and often use photon conversion techniques to modify the spectral output. Spectral output may be modified by the application of secondary materials such as phosphors and quantum dots; as an example, white LEDs are most commonly bi-modal devices consisting of a short wavelength emitter combined with wavelength converting phosphor resulting in broad spectral output (similar in operation to a fluorescent lamp). Recently, light conversion using quantum dots has been developed which is more efficient and versatile than phosphor conversion and is currently finding application in LCD backlight and other display applications. It is also possible to use a narrow spectrum wavelength conversion material to create high efficiency emitters with output wavelengths where the semiconductor technology does not currently support high efficiency devices (e.g. green and yellow emitters based on a blue primary source).

Other types of SSEs may be combined with or used instead of LEDs, laser diodes being one example, particularly VCSELs and edge emitting devices, which have radiation pattern that roughly resemble LEDs but are more tightly constrained. Laser diodes may be particularly useful because of their ability to produce light in parts of the IR spectrum where LEDs are deficient or particularly at wavelengths where they are a mature commercial commodity. Organic LEDs (OLEDs) produce light by recombination generally facilitated by the injection of carriers from adjacent semiconductor material into a layer which is often combined with a phosphor so that light may be produced by electroluminescence and/or fluorescence. These devices have been shown to be capable of the same level of performance as LEDs with potentially longer lifetimes. Also, an SSE may have multiple emitting devices (sub-emitters) or chips packaged in close proximity as one discrete component. Each sub-emitter may possibly, but not necessarily, be controlled individually. Each sub-emitter may possibly emit in a different spectral band and/or may emit in a different direction or spatial distribution than the other sub-emitters of the SSE. Commonly available commercial product includes multi-chip devices for increased brightness and/or improved reproducibility (binning), improved thermal management and spectrum trimming. Chip combinations can include multiples of the same chip and/or several different chips. Other components may be mounted within the SSE package, such as optical detectors, thermal sensors. Typically, all components are mounted to a common thermal and mechanical mount, and hermitically sealed with an encapsulant. This encapsulant may function as a weak lens. Alternative encapsulation methods may also be used with a glass window or lens being a common option and dielectric thin-film being another.

Most recently, experimental SSEs have demonstrated luminous efficacy in excess of 200 lm/W, while devices exhibiting 165 lm/W typically efficacy are commercially available, placing them above conventional lighting technologies in terms of efficiency. For comparison, sunlight has a luminous efficacy of ~93 lm/W or 9.3 lm/cm$^2$, while a typical warm white 3W LED produces 100 lm from a 0.135 cm$^2$ package or 740 lm/cm$^2$ clearly indicating that a planar array of SSEs may exceed 1 sun irradiance by a large margin if necessary or that 1 sun can be achieved with a packing density of only 1.25%; for example, a square matrix of these devices on 30 mm pitch (assuming only 85% efficiency of associated optics.). Also, devices now in production rival 65 W incandescent lamps but in a much smaller package producing 969 lumens from a 1.8 cm$^2$ package providing an aperture irradiance of ~13 suns. Initially, LEDs were developed for indicator and remote control applications consequently, devices were primarily visible or IR spectrum. Emerging applications for sterilization, curing and biological imaging drove the market for high intensity blue and UV devices which have the advantages of very good stability and narrow spectrum and are able to produce intense radiation with substantially less ozone production than other sources. Traffic monitoring and outdoor security applications, among others, have created a strong market for high intensity infrared devices.

Laser diodes have also experienced an impressive technological evolution. Due to the mechanisms that may be exploited in a resonant cavity, laser diodes can be an effective source of certain wavelengths where there is no simple band-gap that can be exploited. Certain application spaces such as telecom apps and laser pumping have created an available supply of high-power/low cost devices. One limiting aspect is the relatively narrow line width of these devices; however, since they are somewhat tunable, in combination they may provide a broader spectrum. OLED devices are rapidly developing; one key aspect is that wavelength is essentially tunable by adjusting the stoichiometry of the light emitting layer(s). This may make OLEDs a particularly advantageous SSE since, to a large degree, peak wavelength or wavelengths and spectral line width can be tailored. Broader line widths, for example wider than typical LEDs, would be advantageous when configuring solar simulators or other light sources where an exacting correlation to nominal spectrum is desired. Recently, quantum dots have been introduced to the field of lighting. These materials provide a highly tunable wavelength conversion since their behavior is encoded in their physical dimensions, not their physical-chemical structure as with phosphors, and can be used to convert obtainable light sources to light sources with arbitrary spectrum. This material can be applied to any potential SSE device as a component of the encapsulation or externally as a component of the optics. Recent examples of this include pink, aqua and peach LEDs. Of particular importance, when phosphors, quantum-dots or other wavelength conversion materials are used, it may be possible to use a single type of light emitting device which simplifies the mounting and drive requirements.

SSE light intensity and spectral stability issues have been studied and thermal management has been identified as a key parameter affecting both short-term and long-term stability. In the short term, the efficiency and dominant wavelength of a device, as well as the underlying IV characteristic, can vary with junction temperature, which can affect the drive condition. In the longer term, operating temperature can affect lifetime performance. In particular, it has been determined that ~90% of loss of lumen maintenance can be attributed to thermalization of encapsulant materials and that careful control of ambient operating temperature of the encapsulent can greatly retard long term drift in brightness and increase the usable lifetime of an SSE. In technical lighting applications, light output may be stabilized by external controls as described below; consequently, the solar simulator apparatus is intended to reduce the issue of lumen maintenance. Aging devices may continue to exhibit a drift in dominant wavelength over time but the magnitude of this drift is inconsequential in typical solar simulator applications. Thermal management of encapsulant is further described below.

As indicated above, the present embodiment of the solar simulator makes use of a plurality of SSEs that are subject to stability (intensity and wavelength) and thermal management using a variety of techniques. The thermal management and stability management is intended to stabilize the SSEs in terms of brightness and wavelength and can also serve to lengthen the life of the SSEs.

SSE Current Regulation and Thermal Management

Figure 2:
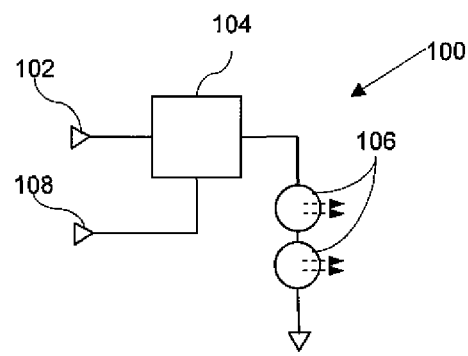
FIG. 2 is a basic emitter brightness control scheme.

A first element of stability management involves regulation of the current to the SSEs. In order to illustrate the use of regulated current, FIG. 2 illustrates a basic brightness control circuit 100. In this circuit 100, power is received from a power supply 102 that is connected to a current regulator 104. The current regulator 104 is then connected to one or more SSEs 106. Conventionally, SSEs are operated in a constant current mode. A number of SSEs 106 can be connected in series. In this case, the SSEs 106 are arranged in a string 107. Typically, SSEs are somewhat or closely matched by employing matched emitters from a binning program so that regulation of the current commonly flowing through them results in a consistent level of control. The current regulator 104 can be used to control brightness and allows for intensity control of the whole string 107 of SSEs 106. It will be understood that a logic circuit (not shown) can be provided for additional control or sensing with regard to the SSEs 106.

The current regulator 104, which may also be known as a constant current source, accepts power from the power supply 102 and delivers a constant current to its output. This current regulator 104 may be a linear circuit but is commonly a buck, boost or buck/boost switch mode topology. Current regulation may be accomplished using feedback from a sensing resistor or current probe (not shown). In addition to controlling drive current, the current regulator 104 may also provide the function of lowering or boosting the supply voltage to match the voltage requirement of the string 107 of SSEs 106. A current regulation set-point 108 is generally used for modulation of the output current of the current regulator 104 by other controls (not shown).

The SSEs 106 produce the light for the solar simulator, providing conversion for the electrical power provided by the power supply 102 into optical energy delivered to a target. The current regulation set point 108 provides the ability to control the current delivered to the string 107, and therefore control SSE brightness. SSEs may be controlled individually or in small groups (such as string 107) to facilitate calibration and modulation of light output in intensity, spectrum and spatial distribution. The schematic illustrated in FIG. 2 represents common practice for solid state lighting in general but may be unsuitable for most metrology applications including solar simulators designed for better than class B performance.

Figure 3:
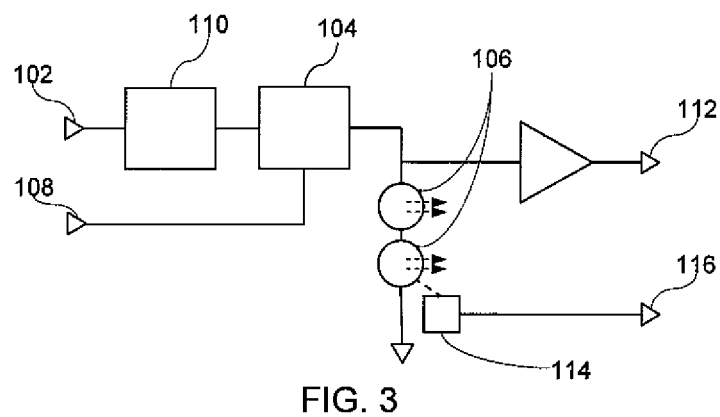
FIG. 3 is a precision brightness control scheme.
Figure 4:
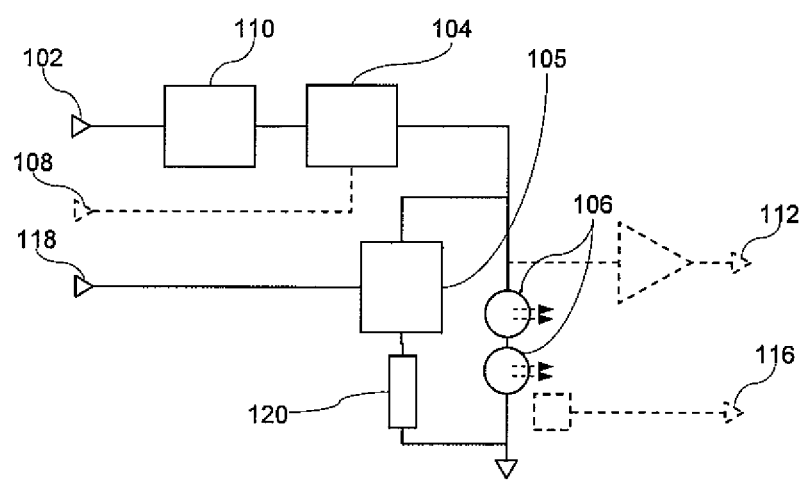
FIG. 4 is a precision brightness control scheme employing three levels of regulation.
Figure 5:
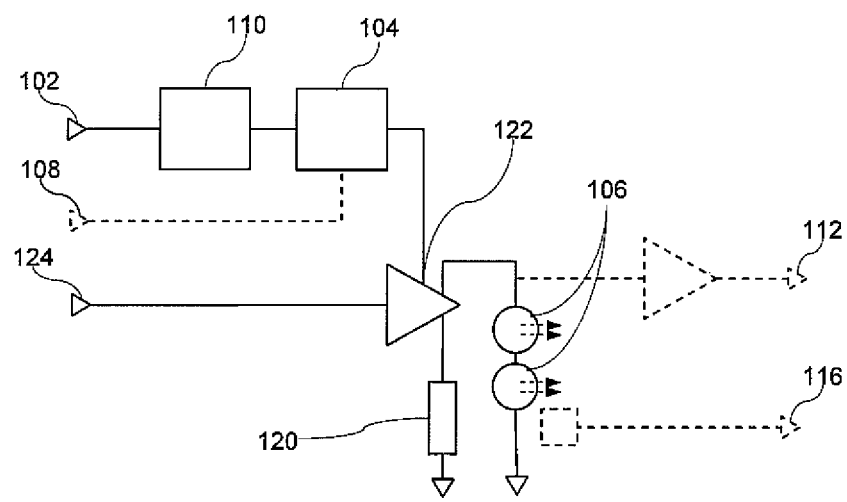
FIG. 5 illustrates a precision brightness control scheme employing differential transconductance.

The circuits shown in FIGS. 3 to 5 are intended to provide higher degrees of precision depending on the class of solar simulator being constructed and range of possible applications for the solar simulator. For example, design considerations for high dynamic applications such as flash testers, QE testers and other measurements requiring rapid modulation are somewhat more demanding than steady state applications. Also, for large arrays, approaches that reduce wiring complexity and potential crosstalk as well as those that promote power efficiency are preferred.

FIG. 3 illustrates an SSE control circuit with a more advanced scheme to thermally manage the SSEs 106 by controlling the drive current of the SSEs 106. As in FIG. 2, the circuit in FIG. 3 comprises the power supply 102, the current regulator 104, the SSEs 106 and the current regulation set point 108. In this scheme, a primary regulator 110 provides a regulated stable power input to the current regulator 104, improving power supply rejection and intending to isolate each channel in a multi-channel arrangement from others. The primary power regulator may also allow the circuit to respond to rapid changes, since the power supply may be stabilized and voltage adjusted by the primary power regulator 110 permitting the current regulator 104 to use a relatively fast acting buck topology or to be composed of a very fast linear regulator with relatively little efficiency penalty.

In FIG. 3, the circuit also includes an SSE junction voltage monitor 112, which senses the voltage of the SSE junction. As the junction's current/voltage (IV) characteristic is related to its temperature, this voltage monitor 112 provides feedback into a controller (not shown in FIG. 3) to assist with the current regulation of the SSE 106. Junction voltage in combination with known drive current provides a direct reading of the junction temperature of the emitter. The current regulator 104 or primary regulator 110 can be adjusted to compensate for the measured junction temperature and thus provide a more stable output from the SSEs 106.

Alternatively, or in addition, the circuit may include an SSE temperature sensor 114 to measure the SSE temperature directly. The SSE temperature sensor 114 may be integrated into an SSE package or mounted to the substrate or the like. Further, a thermal resistance model may be used to estimate junction temperature from measured temperature differences. The SSE temperature sensor 114 may then provide feedback 116 to the controller with temperature data to be used as part of a thermal regulation system, similar to the SSE junction voltage monitor 112.

Since substrate temperature and junction temperature can also affect light output, the use of temperature sensors integrated into the SSE substrate or mounting to monitor temperature directly or the monitoring of junction voltage to estimate junction temperature via IV characteristic can provide useful feedback for thermal management. Temperature readings may then be used to compensate brightness by feedback or feed forward methods and/or gauge brightness stability, resulting in better brightness control than current regulation alone.

In particular, there are several practical methods that can be used to monitor temperature. For example, a direct method consists of monitoring the junction voltage of the SSE, which has been shown to be a reliable way of monitoring at least variation in junction temperature and may have some accuracy when used with devices from one production lot and bin that have been calibrated. Another method comprises monitoring the anode temperature. Typical high brightness devices are mounted face down (flip chip); consequently, the electrode may have a close thermal coupling with it. For devices packed in metal packages where the package is also an electrode, the package temperature may be fairly close to the junction temperature. Alternatively, temperature sensors can be applied to the device package or mount. Taking into account the thermal resistance of the device mounting and the internal thermal resistance of the device, the differential between the measured temperature and the heat-sink temperature can be extrapolated to determine the junction temperature. Impulse tuning using external temperature sensors is a known method of further characterizing the thermal IV characteristic of actual devices so that junction voltage, after calibration may be used as an accurate measure of junction temperature. This can be advantageous as the dynamic response of this measurement will be superior to that of a temperature sensor 114 as described above.

FIG. 4 illustrates a further variation of the circuit for controlling the SSEs 106. In this circuit, a shunt current regulator 105 designed for fast switching and/or pulse synchronization is provided in parallel with the SSEs 106. In this case, the use of a shunt regulation scheme, where the total regulated current is divided between the SSEs 106 and a passive load 120, allows for regulation of the amount of current that is shunted away from the SSEs 106. A shunt current set point 118, which may be a fast current set-point or gates, is provided to control the current regulator 104 and allow for additional control of the brightness of the SSEs 106. This scheme can provide faster brightness variation particularly when the current regulator 104 is a switch-mode regulator and particularly when decreasing the drive current. This arrangement has potential for improved pulsed, e.g. solar flasher, precision. In some cases, the current regulator 104 may be used to determine brightness while the shunt current regulator 105 may be used to provide rapid synchronized pulsing. This arrangement is intended to be advantageous in that the combination of regulators 104 and 105 results in a push-pull drive arrangement, wherein the first regulator 104 remains in a stable current supply condition, while the shunt regulator 105 merely draws current away from the SSEs providing low impedance discharge path for the output capacitor of 104. This may also be advantageous in the instance of a plurality of similar circuits driving a matrix of multiple SSE strings, where each individual current regulator 104 can be controlled to provide an exact amount of current specific to its individual SSE string, while the various shunt regulators 105 can be operated by a single control resulting in very highly synchronized light pulses even in a matrix composed of several, possibly a large number of, SSE strings.

The braking load 120 may be a dummy load, such as a passive circuit, but may also involve power transistors or voltage regulators. The braking load 120 is intended to absorb excess current steered away from the SSEs 106, thus offloading power dissipation from the shunt current regulator 105.

FIG. 5 illustrates a further embodiment of a circuit for controlling the SSEs. This circuit is intended to control the brightness of the SSEs with high precision and fast switching times. This scheme uses current steering as an alternative to shunt regulation. In this case, a transconductance amplifier 122 divides the regulated current proportionally between two loads—the SSEs 106 and a shunt load 120. Preferably, the current source set point 108 determines the amount of current available while the transconductance amplifier 122 apportions the current based on the setting of a divider set point 124. Thus, current regulators 104 can be used to determine the maximum brightness on a string-by-string level while multiple strings can be controlled concurrently by transconductance amplifiers 122 from a single control signal 124. This process may be useful for synchronizing shaped pulses among large numbers of SSEs 106. This may be advantageous in the instance of a plurality of similar circuits driving a matrix of multiple SSE strings where each individual current regulator 104 can be controlled to provide an exact amount of current specific to its individual SSE string while the various transconductance amplifiers 122 can be operated by a single control resulting in very highly synchronized light pulses even in a matrix composed of several hundreds of SSE strings. Another possible advantage may be complex current waveforms may be supplied to the several SSE strings by their several drive circuits by a common set-point 124 without any real time adjustment of their individual current set-points 108.

Figure 6:
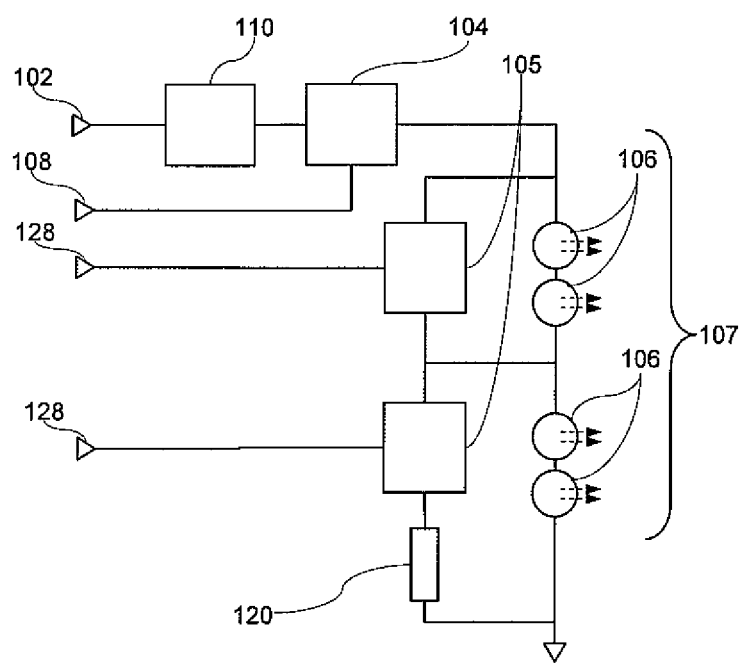
FIG. 6 is an example of a precision brightness control scheme employing three levels of regulation in a totem pole drive circuit arrangement.

FIG. 6 shows a further alternative relating to the circuit using the shunt current regulator 105 of FIG. 4. As shown in the schematic in FIG. 4, shunt regulation may provide fast charging and discharging resulting in a fast-switched response. In this arrangement, the shunt regulator 105 may be controlled by current sense feedback (not shown and internal to the circuit block), resulting in a programmable shunt current, or by duty cycle, resulting in a programmable division of current. Current division may be a desirable control mode, particularly in complex load configurations such as totem pole or branch, and has the advantage of being implemented in a purely digital fashion (in simple single channel driver circuits this is generally described as PWM dimming). This may also have the advantage of reducing cost/complexity when driving large arrays of devices and/or doing color mixing or other balancing in conjunction with variable brightness. An example of a totem pole circuit arrangement is shown in FIG. 6.

FIG. 6 further includes a plurality of shunt current regulators 105 and a plurality of proportional current set points 128. The proportional current set point 128 allows individual portions of an SSE string 107 to be independently modulated by shunting some of the drive current around each portion of the SSE string. This scheme is particularly useful as a means of simplifying wiring for large arrays and/or power saving, particularly when the individual substrings represent different spectral frequencies. In this case, the spectrum can be configured through the individual current set points 128 while overall brightness can be controlled by the common set point 108. In a simpler scheme, as shown in previous figures, N substrings would require 2N conductors instead of the N+1 conductors that would be needed in this scheme, where the substrings are connected in a larger series string, or, if a common conductor were used, would suffer from ground bounce, which would negatively impact precision. Also, of importance to large arrays, the total current in the system is reduced in proportion to the number of SSE strings stacked up in a totem pole arrangement (~1/N), for example, if this were applied to a solar simulator, the number of stacked strings could range from 3 to 15 or more (depending on precision and range of spectral match desired). Another advantage of this scheme is that a single current regulator 104 can be combined with multiple shunt regulators 105, which are simpler to construct, resulting in a lower cost control solution for large arrays. For example, by placing N substrings in series the number of current regulators 104 needed would be reduced proportionately by approximately (N−1)/N.

Figure 7:
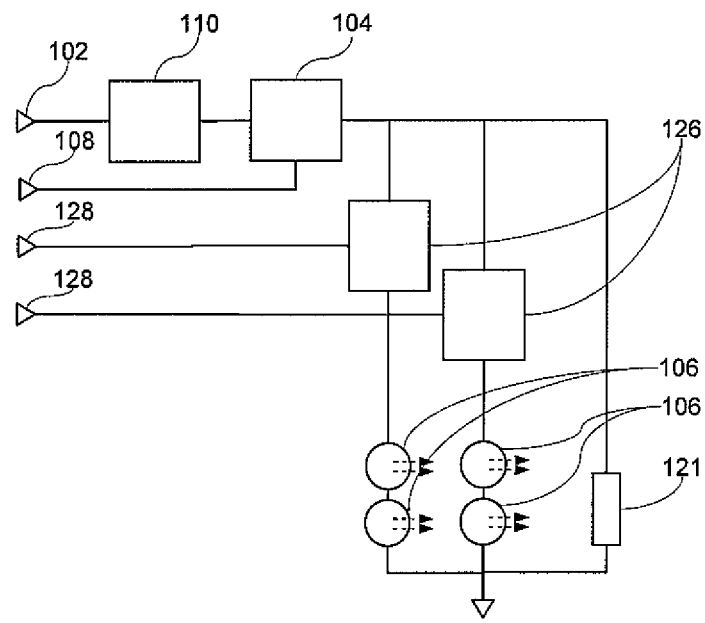
FIG. 7 is an example of a precision brightness control scheme employing three levels of regulation in a branching drive circuit arrangement.

FIG. 7 shows an alternative arrangement similar to FIG. 6 in that a single current regulator 104 is provided to control multiple strings of SSEs 106 connected in parallel. A series/parallel arrangement is fairly common in simple lighting applications; however, current regulation in each of the several parallel strings suffers. On the other hand, providing a separate regulator 104 for each individual string as shown in FIG. 3 becomes expensive when a large number of SSE strings is involved. In this arrangement the output of the current regulator 104 branches to a plurality of SSE strings but the current in each string is further regulated by secondary current regulators 126. When the several parallel strings are composed of nearly identical devices the voltage difference across each of the secondary regulators 126 can be quite similar and therefore relatively small permitting the use of a simple linear regulator since the efficiency penalty will be slight even when small adjustments are applied to each individual string using external controls 128.

This scheme can be used to control multiple SSE strings with the advantages of two-stage regulation but with sharing of common components e.g. primary power regulation 110 and primary current regulator 104. Current is distributed from a common bus with any excess current being dissipated by a passive load 121, primarily to prevent overvoltage, which can result from a lightly loaded current regulator 104. This arrangement may be improved if the current sensing voltage of current regulator 104 is supplied to each of the secondary regulators 126 as a reference voltage and concurrently control inputs 128 are used to provide a proportional division of that reference (a practical case being a programmable resistor) with the result being that the several branches are supplied with an exact fraction of the total current supplied by current regulator 104. As a consequence the light output of the plurality of SSE strings connected to current regulator 104 can be varied in concert by use of the current control input 108 of the current regulator 104.

Another aspect of controlling SSEs 106 to provide better stability involves using current control to adapt for transients during SSE drive cycles. For example, since SSE efficiency can have a negative temperature characteristic, the tracking of brightness versus drive current will typically exhibit transients; for instance, brightness will overshoot on the leading edge of a current pulse. In embodiments of the solar simulator, this behavior can be compensated electronically by introducing lag with an appropriate time constant in the control circuit, using for example, an inductance effectively in series or a capacitance effectively in parallel. These represent commonly practiced approaches which suffer from a degree of inexactness and are typically only effective for a limited range of operating conditions. A degree of improvement is achieved by monitoring the device temperature and making adjustments to set-points, closing the loop in the control system, having benefit of previously characterized complex behavior data relating temperature, current and brightness. In effect, a complex reactance may be simulated within the control system.

Figure 8A:
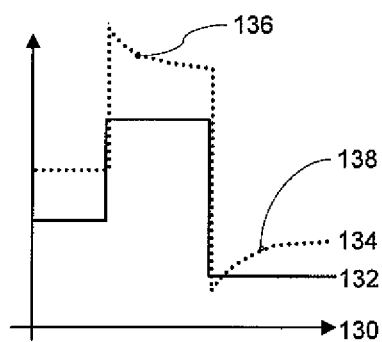
FIGS. 8A and 8B are graphs representing emitter drive current and light output as a function of time under uncompensated and compensated pulsed driving conditions.
Figure 8B:
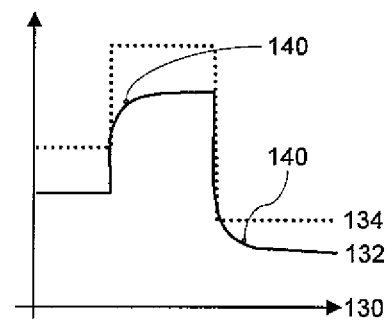

FIGS. 8A and 8B show graphs of SSE brightness as a function of time under two pulsed driving conditions showing thermal transient control. In these figures, a variable drive current (I) and resulting luminance (L) is shown versus time where the goal is to produce precise step changes in light intensity. A step change in drive current may result in a change in brightness, which drifts towards a stable state as the SSE temperature shifts to match the new drive condition. By compensating the drive condition, essentially by lagging the drive condition to match the thermal time constant of the SSE, a more ideal brightness profile can be obtained when pulsing or modulating the drive current. FIGS. 8A and 8B serve to show the common effect of thermal transient, as well as an approach to current control to alleviate or remove the effect. The pulse shape relates to the usefulness of the apparatus to generate sharp pulse edges of light.

FIG. 8A illustrates an uncompensated drive current while FIG. 8B illustrates a compensated drive current. The figures show the drive current 132 and the light intensity 134 as a function of time 130. The light intensity 134 illustrates the pulse shape of the light that is delivered to the target. FIG. 8A illustrates the case where step changes in the drive current result in a distorted light output specifically: after a rapid increase in drive current, the device temperature rises until a new equilibrium is established, while the efficiency of the SSE goes down resulting in decaying light output 136; conversely, when drive current is rapidly reduced the device temperature drops until a new equilibrium is established while the efficiency of the device goes up resulting in an increasing light output 138. In FIG. 8B, drive current compensation 140 can be used to adapt the current pulse shape at the leading and trailing edge of the pulse 132 to compensate for the thermal transient and maintain a more stable light intensity. FIG. 8B illustrates that introducing an appropriate amount of lag into the transient behavior of the drive current results in better tracking between the desired and actual light output. A sharp edge may be preferred for timing circuits and may make more of the pulse duration flat and constant, which may allow for more of the pulse to be used at the stable peak.

In some applications, associated metrology develops timing information from transitions in the light output on which measurements are based. In many applications, particularly solar simulator applications, a large number of measurements are made during the nominally stable portions of a light pulse. In some applications it is desirable to minimize the pulse duration to avoid heating of the product or for some other reason while still obtaining as many measurements as possible (under stable conditions). In other applications using lock-in gauging methods or other approaches which require rapid and predictable modulation of the light a light source capable of producing predictable and consistent results is desirable. In this example, a simple step function is shown; however, in certain applications, more complex waveforms may be used.

In choosing the current regulators and electrical components described above, there are several points for consideration:

'Buck' converters/regulators may provide a more dynamic response than other switch-mode type regulators;

A snubber may be applied to minimize switching transients as high power SSEs of almost any type are quite sensitive to current spikes and can be harmed by them;

Linear regulators may be a good choice for performance and may be used where efficiency is acceptable:

since an in-circuit voltage of approximately 0.3 to 0.9 V is unavoidable (typical of commonly available linear regulators), maximum possible efficiency of ~75% may be expected with a single SSE with a typical forward voltage of ~3.7V; however, an efficiency comparable to a switch-mode driver may be obtained when several SSEs are connected in series;

a two stage scheme such as a high-efficiency switching power supply to provide a low headroom input to the current regulator may be preferred;

Shunt regulation may be the best alternative for fast pulse operation if used; in this case, the braking load can be mounted to a same platform as the SSE to stabilize local power dissipation and minimize common path crosstalk; and Differential current amplifiers may also be used as they have similar advantages to shunt regulation but do not involve two current sensing devices, which may provide better precision.

If a braking load is included, a resistor may be used; however, diode strings, zener diodes or other voltage regulating devices may be preferred, to allow for constant power dissipation. Depending on electromechanical layout, one such braking load could be shared between multiple channels of control.

In order to achieve better performance, any current sensing devices should also be temperature stabilized. One practical way of doing this is to take advantage of the thermal management system provided for the SSEs themselves, for example, by mounting the current sensing devices to a temperature controlled heat sink that is provided to assist with thermal management of the SSEs.

The following points outline some of the intended goals for driving SSEs in order to provide a high quality light source suitable for metrology applications:

output current control of better than approximately 1% and preferably as low as 0.1% for a higher precision solar simulator such as one use for a scientific application;
reduce transient feed-through to reduce risk of damage to SSEs;
fast output modulation, preferably <5 microseconds;
precision intensity control input;
optional thermal management loop;
low cost/complexity;
voltage monitoring output for high-performance systems; and
dimming range ≥10:1.

As noted above, temperature monitoring is an important function and may consist of one or more of the following approaches:

monitor forward junction voltage of the SSE(s);
integrated temperature sensors, such as NTC resistors, integrated into the SSE;
external temperature sensor attached to the SSE, for example thermistors and thermocouples with integral lugs, which can be attached using the SSE mounting fastener or stud-mount temperature sensors which can be used as an SSE mounting fastener.

Further, thermal compensation and/or thermal protection may be incorporated into the control system itself. Still further, in order to prevent crosstalk between control circuits, intensity control is preferably provided by current-mode analog signaling or digital signaling.

Environmental Thermal Management

Figure 9A:
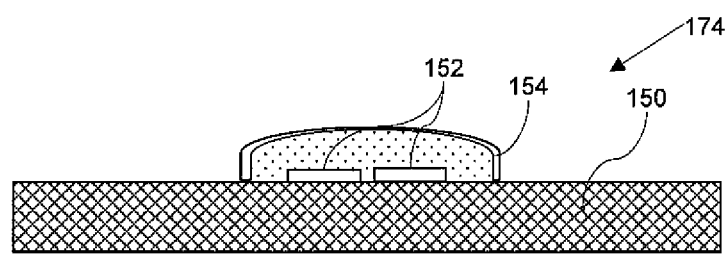
FIG. 9A illustrates a solid state emitter having a plurality of individual emitters (emitter chips) and an encapsulant.
Figure 9B:
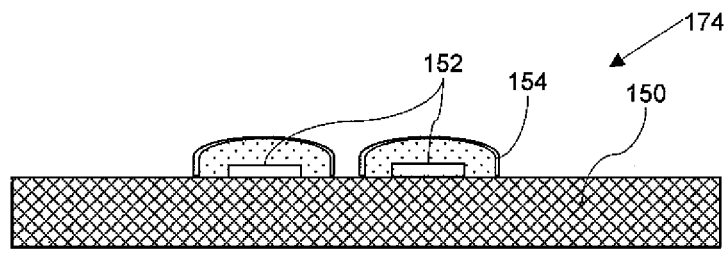
FIG. 9B illustrates a solid state emitter having a plurality of individual emitters (emitter chips) each having an encapsulant.

In order to provide stable output from the SSEs 106, it is also important to provide thermal management to the environment of the SSEs. As shown in FIGS. 9A and 9B an SSE 174 includes a substrate 150 or package, one or more individual emitters 152 and an encapsulant 154 that protects the individual emitters. Typically, the temperature of SSEs is somewhat controlled by providing the SSE 174 a heat sink material to control heat generated at the junction of the individual emitters. One challenge for solar simulators that has previously not been fully identified is the need to provide a substantially uniform ambient temperature to the lens and encapsulation of the device over and above what is obtained by managing the heat-sink temperature by drawing heat away from the solid state device through the substrate, which only provides very indirect cooling for the encapsulant. This challenge has been determined to be a primary factor in age-related loss of brightness and overall aging, of both the individual emitters, the associated light converting materials if present and of the encapsulant and may also apply to associated optical components made from polymers. The simple method of managing the temperature of the ambient air in contact with the encapsulant has been shown to significantly reduce age-related depreciation of device performance.

According to some embodiments herein, thermal management of the SSEs 174 can be improved by regulating the ambient temperature of the front surface of the SSEs and particularly the encapsulant 154 by providing air flow over the SSEs 174 or clusters of SSEs 175. However, there is a challenge in introducing the airflow in a way that does not intrude into optical paths, does not limit packing density of devices and does not entrain much unregulated ambient air. Further, the area over the SSEs 174 may be enclosed by collimating optics, which could impede airflow.

Figure 10A:
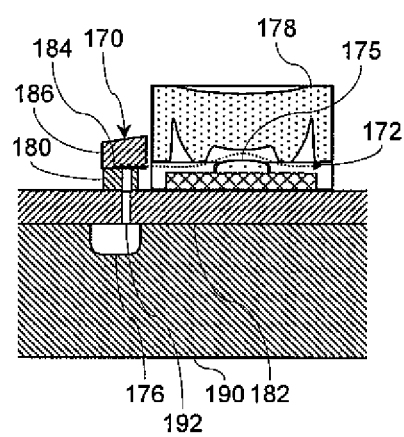
FIG. 10A illustrates an example cross flow cooling jet.
Figure 10B:
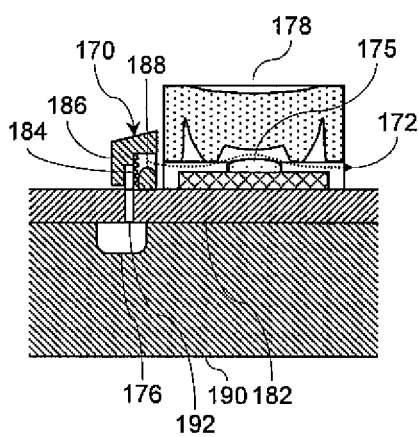
FIG. 10B illustrates am example cooling jet with Coanda flow management.

FIGS. 10A and 10B show cross sectional views of a possible integration of an SSE or cluster of SSEs 175 intended to accommodate optical, electrical and thermal requirements, and still remain suitable for various array arrangements. In particular, the SSE 106 or cluster of SSEs 175 is attached to a mounting plate 182 and the mounting plate 182 is attached to a heat sink 190. The heat sink 190 allows for heat dissipation from the backside of the SSE 106 or cluster of SSEs 175. The mounting plate 182 provides a common surface to mount the SSEs and related sensors while providing electrical and cooling service connections. Typically, this element also supports associated optical elements. In the scheme shown in FIGS. 10A and 10B, an air-jet subassembly 170 is provided adjacent to the SSE 106 on the mounting plate 182. An air supply plenum 176 runs through the heat sink 190 and provides airflow to the air-jet subassembly 170 via an air outlet 192. In this embodiment, since airflow passes through the temperature controlled heat sink 190, the airflow will have a regulated temperature. The air-jet subassembly 170 bridges the airflow 172 between the air supply plenum 176 and the gap between the SSE 174 and the optic element 178. The air-jet subassembly 170 may comprise a mechanical support 180 that brings air from the mounting plate 182 to a comb 184. The comb 184 then directs the airflow 172 over the surface of the SSEs 175 (see arrow 172). The turbulence characteristics and direction of the airflow 172 may be at least partially controlled by the shape and dimensions, of the comb. Airflow 172 may be conditioned to have a laminar flow with appropriate micro-turbulence to produce effective cooling of the emitter encapsulant using methods such as those used in industrial cooling nozzles.

FIG. 10A uses a cross flow cooling jet while FIG. 10B illustrates a more elaborate air jet subassembly 170 with directing surfaces that may make use of the Coanda effect. In particular, the air-jet subassembly 170 may further comprise an air dam 186 to help provide a seal with regard to the path between the optic 178 and the emitter 174 and minimize entrainment of ambient air. The air-jet subassembly 170 may also make use of an airfoil 188, which may help direct air down to hug the surface of the emitter 178. An appropriately shaped airfoil 188 may allow for the use the Coanda effect.

In FIGS. 10A and 10B, the optic 178 may be a collimating optic to redirect light from the emitter into a more collimated beam. Although FIGS. 10A and 10B show the optic as a cadiotropic refractive/reflective collimator, it may be a holographic, micro-electro mechanical system ("MEMS") or micro lens array or other such element. Various collimating strategies are described more explicitly below.

Cooling airflows are preferably finely structured to provide a stable laminar flow with a high degree of micro-turbulence. Known methods include the use of small pores and/or small apertures. One means of producing accurately structured airflow inexpensively is to machine passages into a thin sheet of metal (shim-stock), typically in a comb shape, which is sandwiched between solid materials. One attribute of this type of airflow is its strong Coanda effect, which makes the airflow track moderately smooth surfaces permitting the airflow to be redirected quite simply. Since the surface of the SSE is typically smoothly curved, the airflow may be structured to take advantage of this behavior, which will provide maximum thermal management for minimal airflow. The integration of cooling airflow illustrated by example in FIGS. 10A and 10B involves the application of this method using a separate device which is usefully compatible with some commercially available optics intended for use with SSEs; however, in large arrays possibly incorporating several different device types this is can be awkward to implement. Further examples detailed below describe the advantage of incorporating the components needed to manage airflow into the optics and/or other associated components to reduce the cost, complexity and effort needed to incorporate this useful functionality into a light generating device.

FIGS. 11A and 11B illustrate an alternative arrangement in which a cadiotropic collimating optic system includes an integrated air-jet system 194. The provision of the integrated air-jet 194 reduces the number of components and may allow for self-aligning to the optic 178. As with the embodiments of FIG. 10, the integrated air-jet 178 may make use of a comb 184, however, the function of the comb 184 may be integrated into the optical element. The integrated air-jet 194 may include a transition piece and seal 196, which may provide further mechanical support and bring air up from the air outlet 192. Other components of this system are similar to those described with regard to FIG. 10.

Collimating optic 178 is drawn like a cadiotropic collimator but could also be a simple lens, holographic or MEMS or micro lens array, etc. The Collimating optic could also be part of a common element of a grouping of SSEs. The comb 184, could consist of features molded into the optical part, an insert molded component or an inserted component. One approach may be to mold the fine passages of the comb 184 into the body of the optic 178. The collimating optic 178 may be constructed from a number of materials with a sufficiently broad spectral transmission for the required application which would commonly be 400 to 1100 nm but might extend down to 300 nm or up to 1400 nm or 1800 nm depending on the solar simulator sub-class as described elsewhere or alternatively constructed from various materials depending on the spectra of SSEs with which it is intended to be used. There are a number of polymers, glass ceramics and glasses can be shaped which exhibit the required optical properties. Further, although this device 178 is shown as a single piece, the part may comprise multiple elements that have been bonded together using optical adhesive, solvent welding or thermal/friction welding or other methods. Some acrylics, for example, present excellent optical properties and may readily be applied over 400 to 1100 nm with some particular products useful down to 300 nm and may be used with minor design constraints up to 1400 nm. The optical surfaces may be further enhanced by the selective application of a broad-band low refractive index film, optical grade Teflon being one example, which will significantly reduce the reflectance losses at first and last optical surfaces. Optical devices of this sort may be produced by a large number of inexpensive mass production techniques including casting, molding, hot compression forming, additive forming, embossing, machining, etc. Where needed, finer optical surfaces may be post-formed using such methods as embossing, hot stamping, surface casting, printing, etc.

SSE Configurations

Figures 12A, 12B:
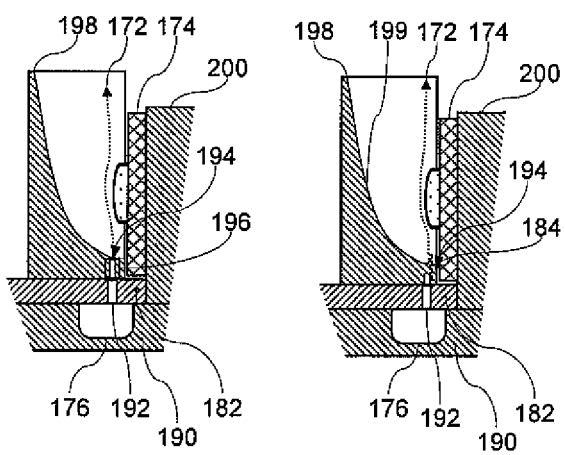
FIG. 12A illustrates reflective collimating optics with added flow features.
FIG. 12B illustrates reflective collimating optics with molded flow features.

FIGS. 12A and 12B show an alternate arrangement in which the SSEs are vertically mounted and reflective collimating optics 198 are used to direct the light from the SSEs. This arrangement may permit a higher packing density of SSEs in an array. As shown in FIGS. 12A and 12B, an integrated air-jet 194 can also be provided to the reflective collimating optics 198. In some cases the air jet 194 may make use of a comb 184. In a particular case, the reflective collimating optic 198 used may be in the form of an off-axis concave mirror that simultaneously redirects the light upwards and reduces the beam divergence. In this example embodiment, the shape of the reflector is close to parabolic although other shapes may also be contemplated. Here, a reflecting surface is illustrated as a collimating element which might typically be an off-axis parabolic reflector with a continuous surface. A micro-mirror array or MEMs might be substituted for a continuous surface. Further the reflector may be somewhat anamorphic in order to compensate SSEs which have an anamorphic angular power distribution. A reflective optical device is advantageous as compared to a refractive one as the number of optical surfaces is at least halved and the optical properties of the bulk material are unimportant, which greatly increases the choice of materials and manufacturing methods. There are a number of sources for high quality mirror plating that can be applied to a range of materials including cast or molded polymers, where the resulting mirror is more efficient than a refractive optic of comparable (low) cost. Additionally, reflective devices do not exhibit chromatic aberration, which makes them possibly more suitable for an extremely broadband application such as a solar simulator. This approach is best applied to relatively directional SSEs however it may be used with Lambertian emitters where the loss of peripheral light is offset by the reduction in reflection and absorption losses in transmissive devices such as that illustrated in FIG. 5. It may be understood that the acceptance angle of the reflector can be improved by mounting the SSE at greater than 90 degrees (i.e. pointing somewhat downward rather than horizontally as shown in FIG. 12). Here the collimating element 198 is depicted as solid structure but it could be composed in various ways so long as the reflecting surface 199 has the desired shape. In FIGS. 12A and 12B, an SSE mount 200 is visible and allows for the vertical mounting of the SSE 174 and for thermal and mechanical support for the SSE 174.

It will be understood that temperature regulated air may be supplied by a separate system or, as illustrated in, for example, FIG. 10, the air distribution plenum may be incorporated into the device heat-sink, which is already at regulated temperature in order to simplify and reduce cost. Since useful airflow must also pass over the package, it is generally preferable if that air is close to the same temperature as the package.

In order to further reduce cost and complexity, airflow passages could be molded into the collimating optic, which may typically be a molded acrylic structure, although other materials are contemplated.

As described above, SSEs are typically mounted on a mounting plate and also on a heat sink. Providing uniform cooling to a large matrix of SSEs assists with providing stable control and reproducible results. As such, it may be preferably to provide a mounting surface for each SSE that has a well-controlled temperature and a reasonably low thermal resistance. When considering a large array of devices with possibly independent operation of neighboring devices (for example, when using multi-spectral sources), it is also preferable to ensure a reasonable degree of thermal isolation between adjacent SSEs.

As an approximation, the required cooling capacity may be ~8 kW/m² (e.g. when producing 1.2 suns irradiance with 15% net efficiency) for typical flat-plate simulators and emitters if operated continuously.

In many applications, the simulator may be pulsed with a relatively low duty cycle. For example, a module tester might use a 10 msec. pulse to test 60 cell modules, which are produced at a rate of 60 UPH (units per hour) (e.g. 60 cells input at 3600 cells per hour/~100 MW/Y fab) resulting in a duty cycle of ≤0.17%. This would result in a cooling load of ≤13 W/m². Cell testers may have a higher duty cycle: say ≤10% at 3600 cells/hour, which would result in <350 W of cooling load. In principle, pulsed applications could be cooled using forced air; however, significant local thermal mass may still be required taking into consideration that the peak power dissipation may still be ~8 kW/m².

In many applications, it is preferred that the target (for example, a PV module) be at 25° C., or other low temperature, during testing. One of the potential advantages of an SSE solar simulator is that it is a flat bed simulator and has a short working distance; as such, the solar simulator may be maintained at a similar temperature to the target in order not to influence the target temperature. Another consideration is that any substantial gradient with ambient air might induce convection currents that could impair temperature regulation. The preferred case for upward facing simulators is generally to maintain a temperature that is somewhat below ambient temperature. In a solar simulator according to the present disclosure, it may alternatively be possible to use some wavelengths of light to heat the target (sometimes referred to as the unit under test ("UUT")) in a controlled fashion. For example, wavelengths of light that are not converted to energy will heat the target.

Figure 13A:
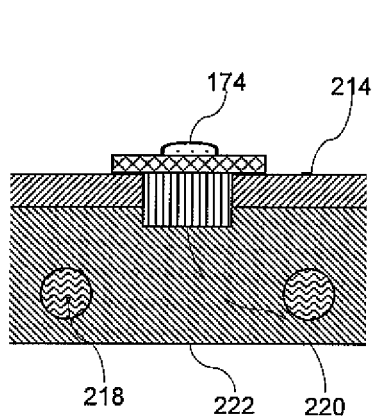
FIG. 13A shows a heat sink using liquid cooling.
Figure 13B:
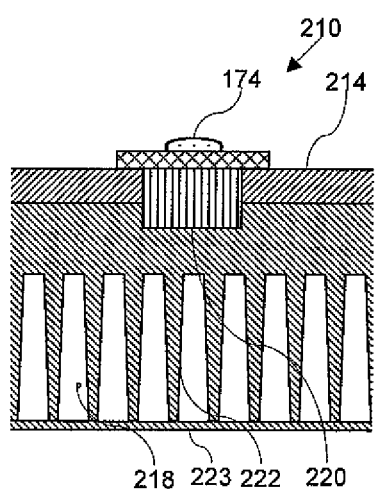
FIG. 13B shows a heat sink using air cooling.

In one embodiment of a temperature management or control system, as shown in FIG. 13A, a liquid cooling system is shown. An alternative embodiment, using air-cooling is shown in FIG. 13B. Both figures show additional aspects of a temperature control system 210 for an SSE array, in addition to the air-flow systems described above with respect to FIGS. 10 to 12. As shown in FIG. 13A, an SSE 174 is mounted on a top plate 214. The top plate 214 generally includes mounting features for the SSE and sensor assemblies. The top plate 214 is mounted on a heat sink 222. The heat sink 222 includes passages 218 for liquid flow. Since liquid requires a smaller exchange surface, liquid cooled arrays can be physically smaller and require less bulky connections. Also, the liquid itself may be used to provide thermal capacitance resulting in a reduced shipping weight (with liquid removed). When using liquid cooling temperature may be regulated either by circulating a cool liquid where temperature regulation is controlled by modulating flow rate or by providing a constant flow of coolant, which is at a controlled temperature (e.g. external chiller). For a large area array, achieving temperature uniformity is typically achieved by arranging fluid passages in interleaved cross-flows.

In some cases, such as those in small-area or low duty cycle solar simulators, air-cooling may be appropriate. FIG. 13B shows an example arrangement of an air-cooling system, which may be more suitable when the simulator is above or to one side of the product as it mitigates the risk of coolant dripping onto the product. Temperature may be regulated either by circulating air where temperature regulation is controlled by modulating flow rate or by providing a constant flow of air which is at a controlled temperature (e.g. external HVAC unit). For a large area array, achieving temperature uniformity is typically achieved by arranging plenum passages in interleaved cross-flows.

In some cases, a thermal transfer device 220 may be mounted between the SSE and the heat sink 222, and passing through the top plate 214 to provide improved heat transfer from the SSE to the heat sink 222. The thermal transfer device 220 may be, for example, a copper block (or other material with good thermal conductance), heat spreader, heat pipe or other high thermal conductive-component, which will conduct heat away from the SSE 174 and directionally distribute it to the heat sink 222. In a preferred case, the thermal transfer device 220 may be a simple heat-pipe such as a copper tube closed-circuit device. The thermal transfer device 220 allows for control of heat flow through conduction. The thermal transfer device 220 may be adjusted in its construction and various materials and configurations are contemplated, which may allow for control over where the heat is conducted. Preferably, heat will be isolated from neighboring SSEs. As an example, the thermal transfer device 220 may be configured to prevent heat flow parallel to fluid flow direction, and bringing the heat closer to the fluid.

Figure 13C:
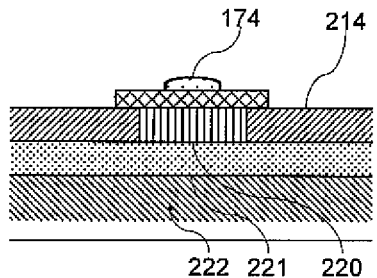
FIG. 13C illustrates SSE cooling employing a thermo-electric device (TEC)
Figure 13D:
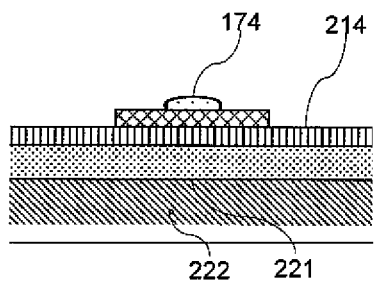
FIG. 13D illustrates SSE cooling with a the heat spreader.

FIG. 13C shows a further alternative arrangement of a temperature control system that makes use of a thermo-electric cooler (TEC) 221 between the top plate 214 and the heat sink 222. The TEC 221 is controlled by current flowing through the TEC 221, to provide a cooler side and a hotter side. The greater the current flow the larger the temperature differential. TECs are particularly useful for high stability temperature control. In some cases, a TEC may be provided for each SSE, SSE string or SSE module in order to provide more detailed programmable temperature control for the SSEs. FIG. 13D shows yet another alternative configuration, where the functionality of the thermal transfer device 220 is integrated into the top plate 214. This is a practical solution, which may be typically implemented by composing the top plate in the form of a metal core PCB (MCPCB) or a conventional PCB.

It will be understood that thermal management may be provided by some combination of the thermal control systems shown in FIGS. 13A to 13C and/or the air flow control shown in FIGS. 10-12. It will be further understood that airflow may also be ducted in order to move heat away from the test area. Air-cooling in general can be provided in several practical ways:
  Forced air system with an integral air-conditioning system (e.g. standard HVAC unit);
  Facilities HVAC cooling connection with temperature controlled flow valve or draft fan (low cost solution); and
  Dual loop forced air with a temperature controlled heat exchanger, for low dissipation systems the heat exchanger could be a thermoelectric device.

In order to maintain essentially uniform cooling across a large area a combination of horizontal thermal conduction and cross-flow cooling may be preferred. In practical materials, copper may be the best thermal conductor followed by extruded aluminum and then cast aluminum. Steel may be worse but the combination of thermal conductance and capacitance makes it a fairly good top plate for a uniformly temperature controlled plate. In a preferred structure, and as shown in FIGS. 13A, 13B, and 13C, copper (or other high conductance material) gathers and distributes the point heat load of the SSEs, while more practical metals such as aluminum or steel provide the surface area for heat conductance. Materials with their related specific heat, capacity and conductivity are listed in table 3.

TABLE 3

Materials and related heat, capacity and conductivity

| Material | Specific heat (J/g/° K) | Capacity (J/cm³/° K) | Conductivity (W/m/° K) | Comment |
|---|---|---|---|---|
| Water | 4.183 | 4.186 | 0.6 | Excellent coolant & heat storage |
| P. Glycol | 2.51 | 2.44 | 0.206 | Good coolant |
| Air | 1.0005 | 0.0008 | 0.0257 | Poor coolant but low cost |
| Copper | 0.385 | 3.45 | 401 | Excellent conductor & storage; obvious choice for heat spreaders |
| Aluminum | 0.897 | 2.422 | 120→180 | Fair conductor and storage; good choice for heat exchange. |
| Steel | 0.420 | 3.537 | 43 | Moderate conductor/good storage; good choice for heat exchange. |

A further factor in achieving a stable light output from a solar simulator is to provide a collimated light field that approximates the collimation of light arriving from the sun. For example, sunlight subtends ~0.53 degrees of arc. Conventional simulators (with some exceptions) are typically less well collimated; however, in applications such as PV module testing, divergence up to several degrees may have little effect, for example, 12 degrees of variation in angle of incidence represents <5% error in applications where the target is essentially normal to the dominant direction of radiation. For highly technical precision, collimation to ≤6 degrees should be generally sufficient and is expected to present <0.5% error in the result.

SSEs are commonly available with several possible radiation patterns. The more common patterns are referred to as Lambertian, batwing (off-axis Lambertian) and side emitting but other distributions may also be available.

Figure 14:
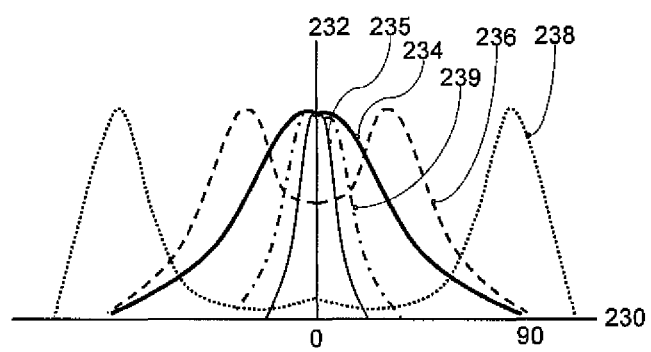
FIG. 14 shows typical light distribution emission profiles from various types of solid state emitters.

In any of these cases, the underlying radiation pattern has Lambertian components, which may be a good case for blending or combining of radiation patterns into a uniform field. SSEs can be modeled as a point source or small constellation of point sources for design purposes. Lambertian and batwing emitters have a rather broad pattern, which requires complex collecting optics in order to harvest the maximum amount of light. Side emitting SSEs have a relatively small divergence angle, requiring redirection more than collimation. In a few cases the SSE may be too directional, requiring some negative collimation. FIG. 14 illustrates general emission profiles where the horizontal axis 230 is the angle as measured from the surface normal. The radiant intensity 232 represents the light power versus angle. The 'Lambertian' emitter 234 is singly peaked while the 'Batwing' emitter 236 is doubly peaked with a dip in the centre angle. The planar emitter 235 can be a fairly highly directional Gaussian emitter but divergence can vary considerably from one part number to another as it is a readily adjusted property of these devices. The vertical emitter 239 typically has a moderately divergent Gaussian bean but this can also be of axis as with the batwing emitter type. Finally, the side emitter 238 is shown where the emission is out of the edge or edges of the SSE instead of the top surface. It may be understood that these distributions are only representative; importantly, SSE output may not be radially symmetric and may possibly require anamorphic optical elements or other accommodations: in simple terms, the projected 'spot' may be round but it could also be oval, toroid, lozenge or bow-tie—all distributions commonly exhibited by SSEs—or possibly some other distribution. It may further be understood that many practical COTS devices are packaged in such a way that the packaging vignettes some of the radiation (altering the spot size/shape). It may be further observed that many lighting class devices incorporate a concave reflector into the structure of the package itself intentionally altering the distribution of light to be more centrally directed.

Conventional SSEs are typically paired with refractive optics. However, reflective optics may be preferred since optical losses will typically be less, there are fewer critical surfaces and aging of the material will be less of an issue. Since typical radiation patterns are wide-angle, appropriate optics may consist of separate optical elements handling wide and narrow angle light differently.

In this application, it is desirable to keep the divergence of the light within at least approximately 12 degrees and preferably 10 degrees or 6 degrees or even 2 degrees depending on application and classification of the lighting device. A typical Lambertian SSE has an angular distribution of brightness given by $I=I_{max}*\cos(\theta)$ (at a constant distance) with the divergence as described by $I=I_{max}/2$ is ~60 degrees and the viewing angle for most devices (angle where some light is still observable) is close to 90 degrees. Since the target is typically approximately planar, the irradiance of off-axis light is further attenuated by increasing distance such that the intensity at the target is $I=I_{max}*\cos 3(\Theta)$. While a single emitter cannot produce a uniformly illuminated field, it has been shown that in combination, a matrix of emitters in combination can produce a substantially flat field. For a high intensity lighting application, efficiency is of the essence, consequently the output of SSEs is concentrated to the extent that the beam divergence is preferably less than ⅔rd of the required divergence at the target, that is, substantially all of the light lies within the specified angle of incidence. For example, in order to satisfy a 10 degree divergence specification, a Lambertian SSE would need to have its angular divergence reduced by a factor of ~9x which is roughly equivalent to an 8x demagnification, which may be accomplished by a collimating optic. While there are a few SSE types that may have an acceptably small divergence, some lattice LEDs and laser diodes being possible examples, the majority of functional devices will require collimation in order to produce a practical apparatus. Further, light at the periphery of the angular power distribution may simply be discarded by means of an aperture stop in order to ensure a consistent/well controlled directionality at the target.

Figure 15:
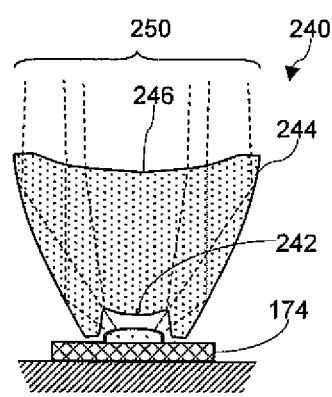
FIG. 15 shows a cross-sectional view of collimating optic employing reflection, refraction and diffraction.

In one embodiment, as shown in FIG. 15, a collimating optic 240 is shown that uses three means of light redirection: refraction, reflection and diffraction. Nearly normal rays are collimated by a lens element 242, off-axis rays are collimated by a parabolic mirror element 244 (using total internal reflection) and the emerging radiation may be homogenized and/or diffused by a diffractive and/or refractive front surface 246. In this case, the SSE 174 may be a side emitting solid state emitter or another type. As described above, the SSE may be comprised of one or more chips, possibly individually driven and emitting at different wavelengths. With this arrangement, collimated or nearly collimated output 250 can be generated. This optical arrangement is relatively versatile in that it can accommodate a fair variety of emitter types, is fairly efficient with AR coated examples exceeding 90% and can be produced as a simple casting or molded part; consequently, optics of this type are COTS items. Currently available parts may have some limitations, which would impact solar simulator applications specifically poor UV and/or IR transmission and poor or radically different performance at some wavelengths due to chromatic aberrations which become severe for wavelengths far away from the design values (typically 400-700 nm).

Figure 16:
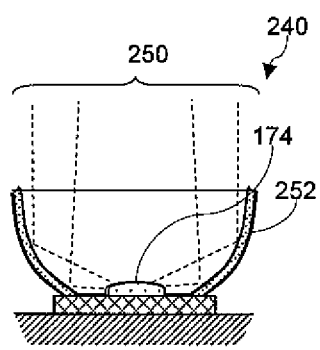
FIG. 16 shows a cross-sectional view of reflective collimating optic.

Side emitting SSEs may provide an advantage in some configurations if it allows a purely reflective collimator to be used, which may potentially be less expensive and more efficient as noted above. The use of reflective optics may also eliminate direct viewing of the individual emitter thereby reducing any ocular hazard from viewing the SSE directly. FIG. 16 illustrates an arrangement involving a reflective collimating optic applied to a side emitting SSE 174. As the direction for side emission is typically narrow, a collimating mirror 252 can be used to reflect light from the solid state emitter 248 to collimated or nearly collimated output 250 to be directed at the target. It can be understood that this type of reflector is generally useful in collecting light emitted at high angles and can be applied to various types of emitters providing a degree of collimation which can be quite good with essentially side emitting devices and may be sufficient in some applications; consequently, COTS devices are available. Devices of this type can be produced very inexpensively, for example by casting, molding or metal stamping, can be quite efficient and don't suffer from chromatic aberration.

Figures 17A, 17B:
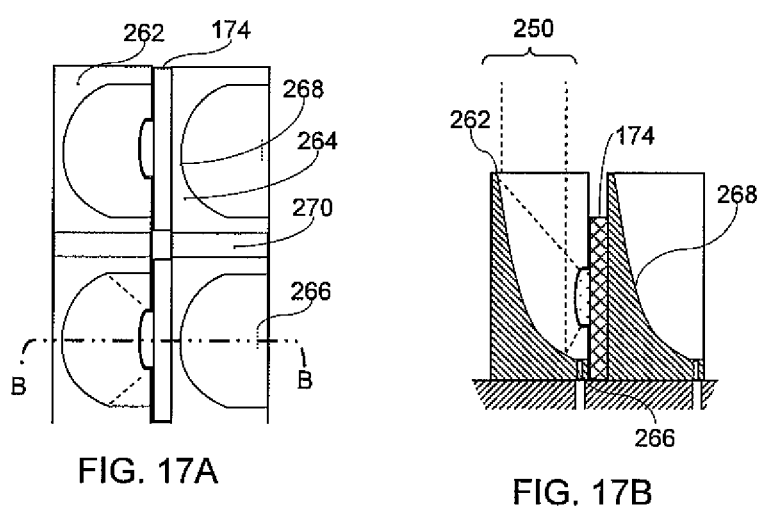
FIG. 17A shows a plan view of partial lengths of adjacent SSEs mounted to a reflective collimating optic.
FIG. 17B illustrates a cross-sectional view of FIG. 17A at line B-B.

FIGS. 17A and 17B illustrate an alternative stacking arrangement for SSEs that makes use of mode an off-axis collimating reflector, which both collimates and redirects the light; this approach is best applied to relatively directional SSEs however it may be used with Lambertian emitters where the loss of peripheral light is offset by the reduction in reflection and absorption losses in transmissive devices such as that illustrated in FIG. 5. As shown best in FIG. 17B, the SSEs are arranged in a vertical orientation, which generally allows for a greater packing density than horizontally mounted SSEs. This arrangement lends itself to relatively dense packing, ease of maintaining airflow and modular assembly. It can be noted that devices in array configuration are typically arranged in a mosaic of various emitter types, which is intended to achieve a broad and programmable spectrum with a uniform distribution. The packaging factor may further permit higher light output from the array, which may raise the capability of solar simulator technology. FIG. 17A illustrates a plan view of unitized reflective collimating optics and mount for high-density emitter arrays, while FIG. 17B illustrates a cross-section view at line B-B of FIG. 17A.

In this embodiment, vertically mounted SSEs 174 are provided with reflective collimating optics 262 to redirect light from the SSE 174. In this case, the collimating optics of an adjacent SSE also serve as a device mount and heat pipe for the SSE 174. In some cases, the collimating optics 262 may also include an integrated air-jet 266 as described in relation to FIG. 12. The collimating optics 262 include off-axis parabolic reflectors 268 to aid in collimating and reflecting the light from the SSE 174. In this embodiment, a gap or thermal break 270 is provided to isolate one SSE from another in the horizontal direction. This thermal break 270 is intended to allow SSEs 174 to be used at different current levels and encourage heat conduction into the heat sink rather than neighboring SSEs. The thermal break 270 may be considered a part of the thermal management system for the SSEs.

Figures 18A, 18B:
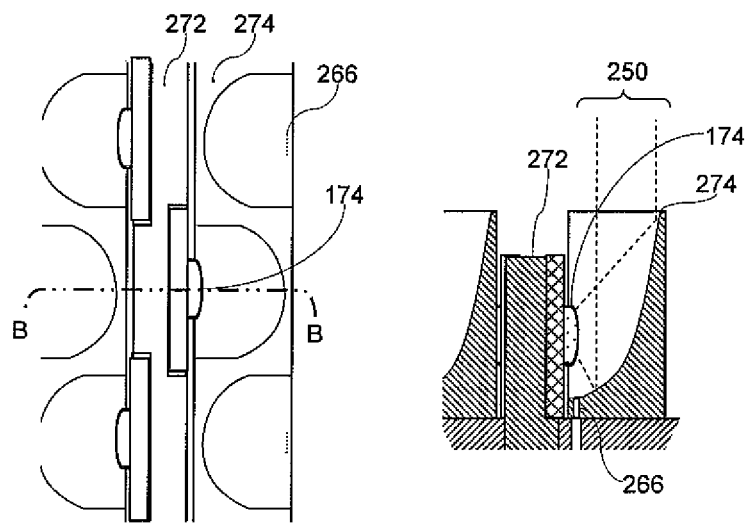
FIG. 18A illustrates a plan view of partial lengths of adjacent SSEs mounted in a back-to-back configuration.
FIG. 18B is a cross section of the FIG. 18A at line B-B.

FIGS. 18A and 18B show an alternative stacking arrangement that is a variation of FIGS. 17A and 17B. In this arrangement, the SSE mount and heat pipe 272 is a separate element from the collimating optics 274. FIG. 18B illustrates a cross-sectional view of FIG. 18A at line B-B. The collimating optics 274 in this case is a double-sided reflector array 274 comprised of a linear array of double sided reflectors. The double-sided mount and heat pipe 272 may provide mechanical support for a string of SSEs as well as conduct heat to a heat sink (not shown) and provide electrical connections. The double sided mount 272 may further be fitted with passages to conduct cooling fluid flows. Also the integrated air jet 266, as described above, may be integrated into these arrangements for greater thermal control. This arrangement permits devices to be densely packed into either a rectangular or hexagonal array depending on geometric details of the mosaic.

Figure 19A:
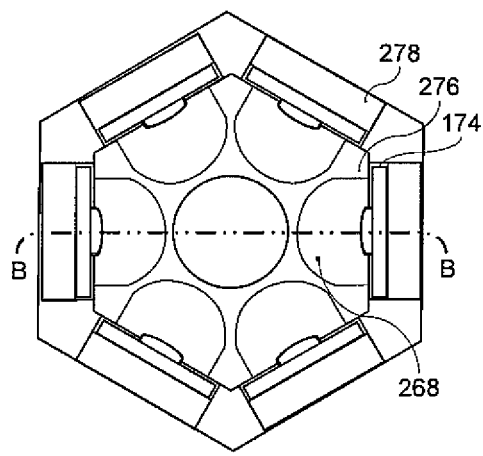
FIG. 19A is a plan view of a cluster of SSEs arranged around a multifaceted reflector to form a modular sub-assembly.
Figure 19B:
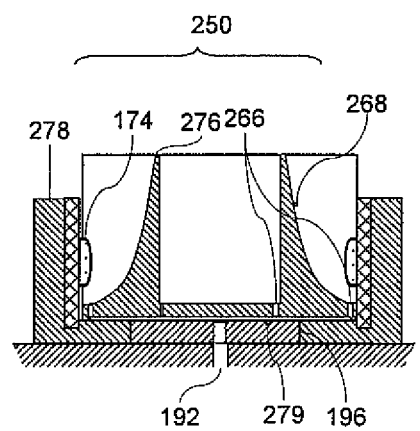
FIG. 19B is a cross sectional view of FIG. 19A at line B-B.

FIG. 19A to 19D illustrates a further arrangement for SSEs employing similar schemes as depicted in FIGS. 17A to 18B. In this case, a multifaceted SSE array subassembly is provided in which the solid state emitters 174 are arranged around multifaceted reflective collimating optics 276 in a radial arrangement as opposed to the linear arrangement described above. FIG. 19B illustrates a cross-section at line B-B of FIG. 19A. FIG. 19A shows a hexagonal configuration but other numbers of facets may also be used depending on the application, size or cost constraints or other factors. In one particular case, the number of SSEs in such a cluster may be related to the number of SSEs of different wavelength being used in the solar simulator. This modular subassembly is intended to reduce assembly time and improve serviceability of the solar simulator as it could facilitate unit replacement of an entire cluster approach. It is also believed that a modular subassembly may result in improved chromatic uniformity since the outputs of SSEs with a plurality of wavelengths can be collected into a small area with all SSEs at a constant radial distance from the center of the cluster.

Here, a simple mirror is shown as a collimating element, which might typically be an off-axis parabolic reflector. A micro-mirror array might be substituted, which could be generally curved or flat. A slight inclination of the reflector optics may be used to cause the area illuminated by the SSEs to overlap at a given/nominal working distance giving the appearance of a single spot of light. It is also possible to centralize the spot by mounting the SSEs at a slight angle. Further, the reflector 276 as shown has apparent symmetry but it can be understood that each of the several individual reflectors 268 may be of a shape, which is adapted to suit the angular power distribution of each of the several SSE types. Additionally, the several reflective surfaces may be selectively plated to optimize the spectral reflectance for the various spectra of the several SSE types. In a modular array such as that shown, it is also more convenient to provide pluggable cooling air connections and pluggable electrical connections to engage the modular subassembly with the solar simulator control systems. The reflector 276 may be a single unit as shown with integrated cooling jets 266 supplied by integrated air distribution passages 279 which are supplied from a single regulated supply inlet 192 which is coupled to the reflector by means of an adapter/seal 196. As shown in the figures, the SSEs may each be mounted on an independent mount and heat pipe 278 or the module may be provided with an integrated mount and heat pipe that extends around the exterior of the module and may interact with mounts/heat pipes from other modules.

Figure 19C:
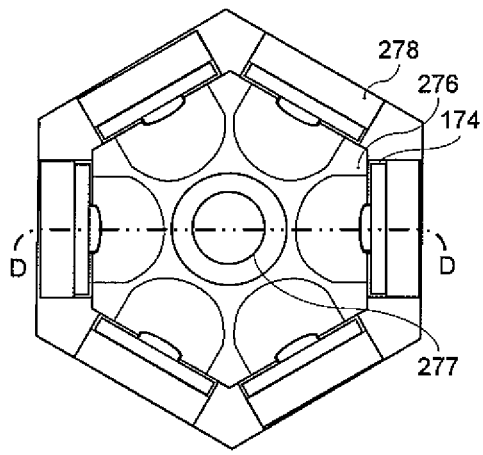
FIG. 19C is a plan view of a multifaceted reflector assembly as illustrated in FIG. 19A with a built-in optical sensor.
Figure 19D:
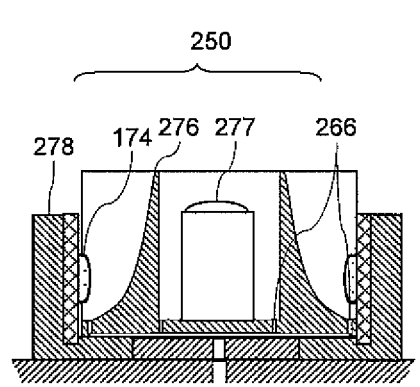
FIG. 19D is a cross sectional view of FIG. 19C at line D-D.

FIGS. 19C and 19D show a similar arrangement to that of FIGS. 19A and 19B, however, an optical detector 277 has been added to the SSE pod. FIG. 20 provides an example embodiment of how optical detectors can be placed within an SSE array. The optical detectors are then interspersed throughout the SSE array to form a detector array that provides the ability to monitor reflected light (i.e. light reflected from a target of the solar simulator, which may include a unit under test or a calibration related object). It will be understood that, depending on the arrangement of optical detectors and on any optical elements provided to the detectors, the optical detectors can be configured to make spatially resolved reflectance measurements. Spatial resolution allows the selection of zones of interest or the exclusion of unwanted features on the target, such as metalized contacts. Such a detector array is useful for measuring a target's reflectance over its area. Reflectance measurement is used for IQE (internal quantum efficiency) measurement and can also be useful for QA (quality assurance) on the anti-reflection coating process or other color measurement applications. In addition, the optical detectors can be used for SSE array intensity and spectral calibration by reflectance targets, which could be arbitrary uniformly reflective surfaces and/or standard reflectance targets and/or traceable reflectance standards. The integral sensor 277 would typically be composed of a sensor with collecting/imaging optics and could be a single cell sensor, a calibrated or traceable reference cell, a 4-quadrant sensor or other multi-element sensor, a camera, a spectral camera, pyrometer or other optical radiation sensor device.

Having optical detectors interspersed into the matrix of emitters takes advantage of the short working distance possible and the distributed nature of the light source. Since the spectrum of the solar simulator can be modulated at will (by using SSEs having various wavelengths as described in further detail below), reflectance measurements including spectral reflectance and color of the unit under test can be obtained. Optical detectors (reflectance sensors) can be calibrated simply by placing a reflectance standard (e.g. NIST traceable) in place of the unit under test. In operation, reflectance measurements may be obtained during an IV or other test, by briefly modulating the spectrum while capturing reflectance sensor readings during a test sequence. This is conventionally performed at a separate gauging station but is unnecessary in this case. This approach is particularly advantageous as it provides spectral reflectance measurements which are coordinated with spectral response measurements, which might be made on the unit under test leading to greater precision than would be obtained by combining data from two different metrology systems. Additionally, uniformity of spectral reflectance can be measured.

The optical detectors (reflectance sensors) can be any of various known or to be developed detectors or sensors such as an ordinary broadband sensor which is calibrated against a traceable reference sensor. Alternately, reflectance sensors can be traceable reference cells. As one more particular example, the optical detectors may be, for example, simple silicon p-i-n devices. The optical detectors may be part of, for example, a transimpedence amplifier circuit, or biased RC circuit. Silicon detectors are generally suitable for 400 nm-1100 nm detection. For detection of 1100-1800 nm, Ge or InGaAs detectors may be used in addition to or instead of silicon devices. The detectors may be assembled as discrete components throughout the SSE array, for example, provided in gaps within the SSE array as shown in FIG. 19C. Alternatively, the detectors may be integrated within the SSEs themselves as an additional element within the encapsulant of the SSE.

Further, the sensor may be a 4-quadrant sensor or similar multi-element device, preferably a broad spectrum device such as an InGaAs array. When fitted with suitable optical filters, such a device can provide fast spectrally sensitive intensity measurements. Four way or greater spectral selectivity is at least preferable for coverage of a broad spectrum, typically a 800 nm span, which is twice the visual spectrum. Alternatively, the sensor may by a linear array such as a 16 element InGaAs array that when fitted with an optical grating and additional optics can be used as a fast line spectrometer. Still further, the sensor may be a digital camera. In particular, chip scale cameras are of a size comparable to or smaller than typical high power SSE packages and can be readily integrated into a cluster of SSEs as depicted in FIGS. 19C and 19D. This device could be a mosaic color camera with a 3-way or preferably 4-way mosaic sensor, for example a CYGK sensor, or a monochrome sensor or preferably an IR enhanced monochrome sensor. It may be further understood, that if a monochrome line camera or area camera is fitted with spectral imaging optics, it may function as an imaging spectrometer. The required number and location of sensors will be application specific; however, sensors would preferably provide coverage such that individual spatial samples as required by the classification standards—see table 4A and 5A below— are obtainable, which would have the advantage of enabling the solar simulator to be entirely self-sufficient for calibration and validation.

It will be understood that it is also possible to use the SSEs themselves as optical detectors instead of emitters. For example, an SSE can be biased such that the SSE can function as a detector. In some cases, the SSE can be operated as a detector in, for example, a reverse biased RC circuit, or a transimpedence amplifier circuit, or simply treated as a photocurrent sensor. It will be understood that other circuit configurations may also be available. The SSE may be photosensitive to a selective spectral band, for example, a conventional LED will absorb light at shorter wavelengths relative to its bandgap. The SSE array operated as a detector array can therefore be operated as a spectrometer with some limitations. Note that an individual SSE cannot generally be simultaneously be operated as an emitter and a detector. However, the SSE array can arbitrarily be divided into emitter and detector devices. In a typical configuration, a given SSE may be used to sense the output of neighboring SSEs when a suitable target is present.

It may be necessary to control the extent of light collection into each component of the detector array, depending on its intended use. For detectors integrated within the SSE, the collection area is similar to the emission area determined by the SSE optic element. For discreetly placed detectors, a dedicated optic element can be used to control the light collection at the detector, if necessary.

Figure 20A:
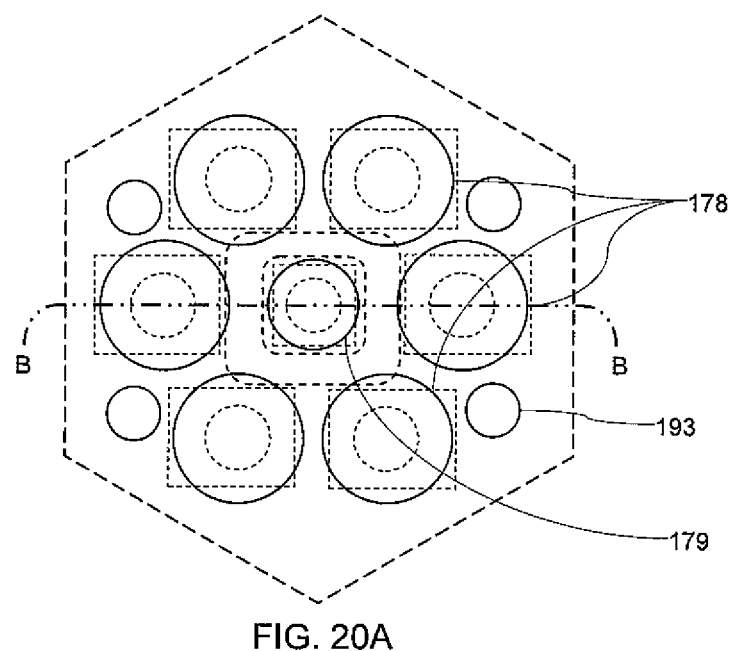
FIG. 20A is a plan view of a cluster of SSEs with a built-in optical sensor.
Figure 20B:
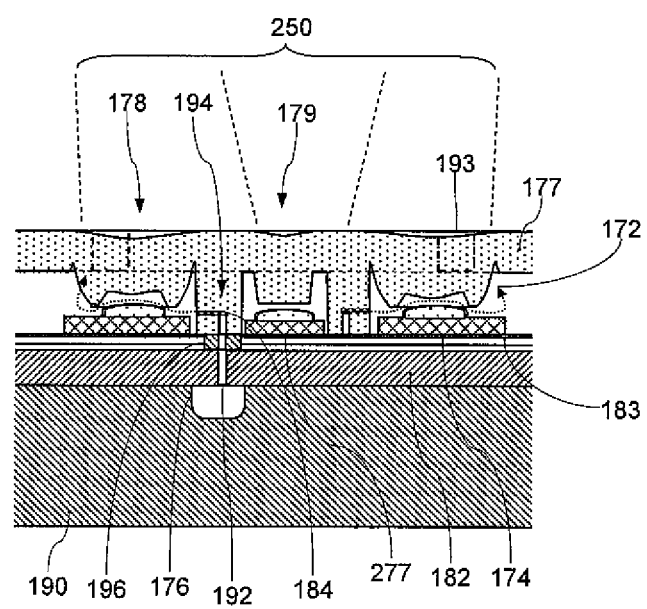
FIG. 20B is a cross sectional view of FIG. 20A at line B-B.

FIG. 20A and FIG. 20B depict a similar cluster of SSEs, as depicted in FIGS. 19C and 19D, except that these figures illustrate the use of transmissive optics where the collimating optic 178 as shown combines reflection and refraction as fully described above for the device of FIG. 15. FIG. 20A depicts a plan view of a cluster of SSEs while FIG. 20B is a sectional view along line B-B. Although this approach introduces the limitations of employing transmissive optics, it is conversely advantageous in that a completely planar construction is possible where SSEs 174 and associated sensors 277 and other associated devices possibly drive electronics can be mounted to a conventional planar circuit board 183 which might preferably be an MCPCB or a thin flex circuit which would advantageously incorporate cut-outs to accommodate air flows 196, thermal transfer devices, etc.

As shown, a multifunction optical device 177 incorporates several SSE optics 178 and sensor optics 179 as well as several cooling air-jets 194 which may incorporate a comb or other air-flow regulating elements 184. Further, this multifunction optical device 177 may be extended to incorporate multiple clusters of optical elements to accommodate multiple clusters of SSEs and sensors as shown up to and including an entire simulator. Air is supplied from a plenum 176 through an outlet 192 in the mounting plate 182 and is coupled into the multifunction device by means of a transition piece and seal 196, where it is then distributed via passages in the multifunction device to several air-jets 194. The air-jets 194 provide cooling airflows 172 across the several SSEs, sensors and other devices finally escaping at the edges or through vents 193. Collimating optic 178 is drawn as a cadiotropic collimator but could also be a simple lens, holographic or MEMS or micro lens array, etc. Light sensor optic is drawn as a collection lens plus a light guide but other similar light gathering arrangements are possible depending on sensor type and requirement. Further, the multifunction device 177, as shown, has apparent symmetry but it can be understood that each of the several individual collimators 178 may be of a shape that is adapted to suit the angular power distribution and wavelength of each of the several SSE types.

The multifunction device 177 may be constructed from a number of materials with a sufficiently broad spectral transmission for the required application, which would commonly be 400 to 1100 nm but might extend down to 300 nm or up to 1400 nm or 1800 nm depending on the solar simulator subclass as described elsewhere. There are a number of polymers as well as glasses that can be readily shaped which exhibit the required optical properties. Optical devices of this sort may be produced by a large number of inexpensive mass production techniques including casting, molding, hot compression forming, additive forming, embossing, machining, etc. Where needed, finer optical surfaces may be post-formed using such methods as embossing, hot stamping, surface casting, printing, etc. The relatively planar configuration would also permit other shaping processes such as roll-forming. Further, although this device 177 is shown as a single piece, it may comprise multiple elements that have been bonded together using optical adhesive, solvent welding or thermal/friction welding or other methods. Some acrylics, for example, present excellent optical properties and may readily be applied over 400 to 1100 nm with some particular products useful down to 300 nm and may be used with minor design constraints up to 1400 nm. The optical surfaces may be further enhanced by the selective application of a broad-band low refractive index film, optical grade Teflon being one example, which will significantly reduce the reflectance losses at first and last optical surfaces.

FIG. 21A shows a further alternative arrangement making use of side emitting solid state emitters 280. FIG. 21B illustrates a cross-section at line B of FIG. 21A. The side emitting SSEs 280 emit light that is generally less divergent and more collimated than other types of SSE. The use of side emitting SSEs 280 can make use of additional folding of the optical path, which may result in a more compact arrangement than that of FIG. 20 for example. In this arrangement, two stages of reflection are used to redirect and collimate the light from the side emission profile. In particular, in this alternative embodiment, two optic elements may be used, a multifaceted reflective relay reflectors or collecting reflectors 282 and collimating or combining reflectors 284. Reflectors will sometimes be referred to as mirrors for readability and should be understood to mean any reflective surface. The collecting mirrors 282 are used to reflect light from the sides of the emitter 280 directing it towards the combining mirrors 284. Collecting mirrors 282 are typically concave or conical reflector and may be anamorphic, converting the side emitter distribution into a forward directed distribution. Here, the reflecting surface is illustrated as a simple mirror which might typically be a parabolic reflector; however, a micro-mirror array might be substituted for a continuous surface. As shown in FIG. 21B, the reflective relay collecting mirrors 282 may also have integrated air-jets 266, in this case, on a bottom reflector similar to those described in many previous instances. The collimating combining reflector 284 is configured to then reflect the two side emission profiles to the target and redirect the light towards the target combining the outputs of the several SSEs. Combining mirror 284 may be a segmented or continuous quasi-conical reflector depending on the overall two stage optical system. Here, a reflecting surface is illustrated as a simple mirror which might typically be an off-axis spherical reflector. A micro-mirror array might be substituted for a continuous surface that might be generally curved or flat. A slight tilt in these surfaces may be used to cause the area illuminated by each emitter to overlap with the remainder at a given/nominal working distance. As above, the number of facets depends primarily on application requirements. In some cases, clusters (or rings) of devices may be practically collimated by a single optical device with the addition of relay optics. As shown, the combining reflector 284 may incorporate air passages 279 which are used to conduct airflow from the supply inlet 192 to the several cooling jets 266. Further, the reflectors as shown have apparent symmetry but it can be understood that each of the several individual reflectors may be of a shape which is adapted to suit the angular power distribution of each of the several SSE types. Additionally, the several reflective surfaces may be selectively plated to optimize the spectral reflectance for the various spectra of the several SSE types.

By providing alternate stacking arrangements for the SSEs as described above, it is possible to increase SSE density within a matrix. Since irradiance uniformity may be achieved by allowing individual sources to diverge and overlap, a higher density of SSEs results in the ability to provide more highly collimated light without needing to increase the working distance for the solar simulator. In addition, a higher density of SSEs may reduce output power required for each SSE, increase the power of the array, allow a variety of SSE types to be added without suffering from spectral-spatial non-uniformity and make room for other elements in the array such as detectors.

Solar simulator applications will typically involve combining and mixing the output of several different SSEs in order to produce a uniformly illuminated field. It will be understood that overall solar simulator performance and capability will be enhanced by producing a uniformly illuminated field, and doing so at a reduced working distance.

Simply permitting overlapping coverage may accomplish a uniform field but generally at the cost of increased working distance. Further, although a goal is to provide a more collimated light source, collimation results in an increase in the working distance. In some cases, a secondary lens/optic may be used to compress the optical track length. For convenience, this may be incorporated into a protective front window. An additional aspect of this secondary optic is that it does not need to be as tightly coupled mechanically so that it may be used for beam steering by mechanical displacement of the principle point.

The radiation pattern produced by SSEs and reformatted by their associated optics is typically a softly focused spot with moderate divergence, which may retain the essentially Lambertian Gaussian angular power distribution that is common to many SSE types and consequently can be combined relatively easily, that is, allowing multiple spots to overlap at any given target point, without any significant discontinuity. This is particularly true when the array is relatively densely packed i.e. closely spaced relative to the working distance of the target.

The primary means of achieving good spatial uniformity is typically to adjust the working distance relative to the SSEs such that the overlap condition is substantial. Overlapping coverage improves uniformity by averaging a cluster of neighboring emitters.

Experience shows that averaging the output of approximately six nearest neighbors (in a regularly pitched array) where all of the emitters are from the same production lot and the same intensity bin may produce better than 2% uniformity that is sufficient for many applications i.e. adjustment of individual device intensity is not required. However, as noted above, it is also important to reduce the working distance in order to reduce space requirements and the like.

A rectilinear arrangement of emitters or clusters of emitters may be the simplest to manage practically; however, a hexagonal packing may be superior due to increased packing density and overlap. In either case, for a given degree of directionality of the individual emitters there is a certain working distance beyond which a given level of uniformity can be obtained (this distance is generally somewhat longer for rectilinear arrays than hexagonal arrays).

The following paragraphs discuss SSE overlap based on the output of several light sources in a matrix. "Near field" and "Far field" are optical terms known in the field. In this context, near field loosely refers to the light distribution in a plane "near" the optical source. For this application, near is on the order of 1.4 times SSE spacing or less where the illumination is contributed mostly by on SSE or cluster of SSE and is highly variable and grainy.

In order to achieve field uniformity, individual emitters are imperfectly collimated: practically divergence in the range of 4 to 8 degrees may be preferred. As described above, the radiation of neighboring emitters can be summed at a distance producing a relatively flat field. Hexagonal packing produces a more uniform field versus square, packing at a similar working distance and emitter density. There is an increase in field uniformity with distance. As the distance to the target increases in proportion to the pitch of the array of emitters, the spatial uniformity improves.

In many cases, the field uniformity can also be improved by remapping (also called reshaping) the light output using a refractive or reflective micro-optical element, for example MEMS. For example, a circular light output can be reshaped to a square, hexagonal or other shape output to provide better field uniformity. The 'natural' coverage of an emitter with simple collimating optics is circular or ovoid so no packing arrangement may provide perfectly uniform combining of light output. Simple secondary optics may be used to achieve this coverage. Generally, the secondary optical element, if present, will be a refractive element. This could be a Fresnel lens but could also be a micro-optic array. Micro-optic arrays are commonly used to reformat and/or 'homogenize' a beam of light. Depending on scale factors a cast polymer or MEMS device could be applied. Both refractive and reflective devices are commonly available. In this application, a MEMS device that creates a rectangular or hexagonal light distribution may be useful.

Figure 22A:
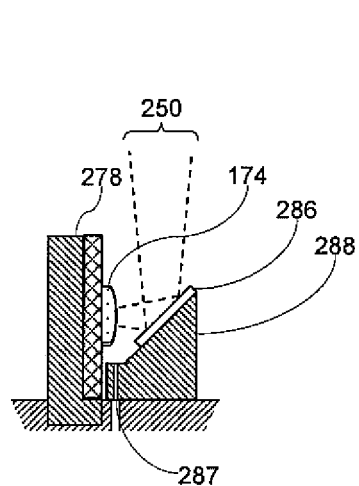
FIG. 22A illustrates reformatting or reshaping the light from an emitter using a micro-optic reflector.
Figure 22B:
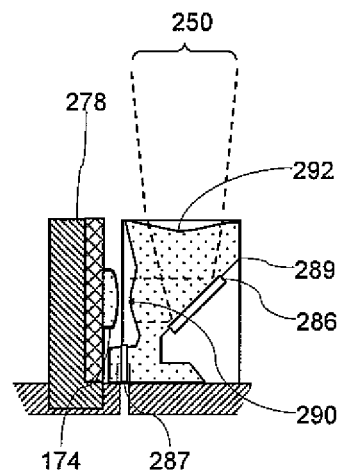
FIG. 22B illustrates reformatting or reshaping the light from an emitter using a micro-optic reflector which has been incorporated into a refractive optic.
Figure 22C:
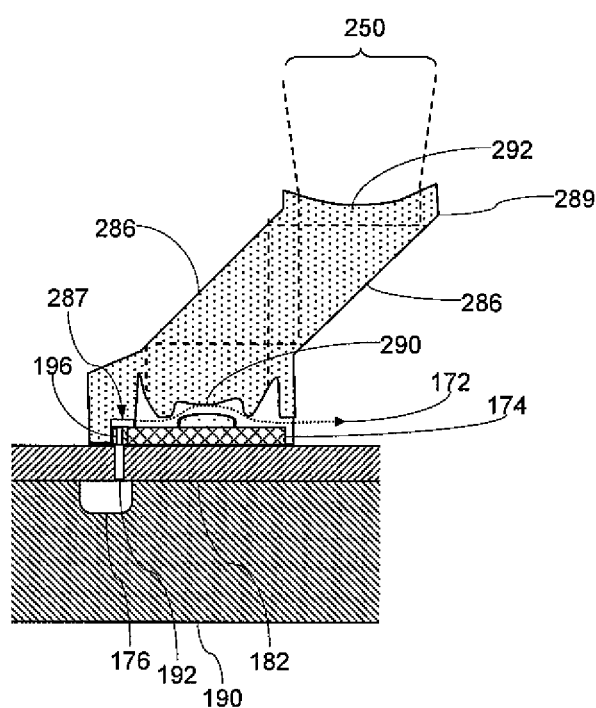
FIG. 22C illustrates reformatting or reshaping the light from an emitter using a micro-optic reflector which has been incorporated into a refractive optic in a way which permits planar SSE mounting.

FIGS. 22A, 22B and 22C illustrate the possible application of the approach where a non-linear optical element, as opposed to a continuous optical surface, is used to redirect the light from an SSE. FIG. 22A is a cross sectional view that illustrates a micro-optic arrangement for handling light from a vertically arranged SSE 174. In this design, the SSE 174 is vertical mounted on an optical a SSE mount 278, and directed towards a reflecting micro-optic element 286 which is a component of the optical device 288. The micro-optic element 286 includes is a light reshaper such as a holographic mirror or reflective micro-optic device, such as a MEMS mirror array for reshaping the light distribution from the SSE 260 174. The reflector may further be a separate device bonded to the optical device 288 (as shown) or may be formed directly onto a facet of this item where it could be engraved, molded, embossed, cast into the surface or printed onto the surface of the mount. The reflector may further use a reflective or diffractive principle to modify the distribution of light. The optical device 286 may be a substantially planar object where the required optical structures are more readily formed, which may prove to be advantageous. These structures may be formed by molding or casting, embossing and/or laser marking, printing, tampon printing, etching, etc.

Another advantage may be the provision of the capability of redistributing the light in many ways without changing the main details of construction and further, distributions can be accomplished which would be difficult or impossible to obtain with conventional optics. Also, it may be possible to intertwine several optical functions into a single element. Use of a micro-optic or MEMS element 286 is intended to allow collimation, redistribution and homogenization of the radiation to be accomplished by a single optical surface. Still further, this approach possibly provides for programmability in the case where the micro-optic device 286 is a DLP or optical cross-point switch device. The optical device 288 may include an integrated air jet 287 as described in detail elsewhere. This design is intended to allow for reshaping the light from each SSE to better line up with the light from neighbor SSEs to produce a more uniform illumination field or possibly reduce working distance and divergence. This design may also be combined into an array as an element of a linear or multifaceted cluster as similar to those shown previous examples. In this arrangement, the micro-optical device may work more clearly as a reshaper of the light from the SSE. Since the SSE is an approximate point source, its image will be approximately circular. A holographic mirror can reshape the circular pattern to other patterns to provide more uniform coverage. It may be understood that an SSE with moderate divergence would be practical and preferable in this instance since it is generally desirable to capture as much of the output of the SSE as possible. Some SSE types such as lattice emitters would be ideally suited. As an alternative, the SSE could first be directed through a collimating element.

Limitations of the approach shown in FIG. 22A are that it may constrain the choice of SSEs that can be employed, that the critical optical surface is exposed and that the optical surfaces will need to be plated. The example of FIG. 22B provides a solution, which integrates a light collecting/condensing optical element 290 along with the micro-optical element 186 and a projective optical element 292 into an optical device 289. This may facilitate the use wide divergence SSEs in combination with a micro-optic. There may be an additional cost advantage if the micro-optic 286 is formed directly into the optical device 289, in which case, total internal reflection may be exploited eliminating the need for plating or alternatively a diffractive optic might be simply printed onto this surface. Since this surface is not functional on the outside it can be protected if need-be by a simple cap or enclosure. It may be understood that this optical device could well be a segment of the multi-faceted clusters shown above and in particular is a nearly exact analogy of the two stages optical assemblies illustrated in FIGS. 20A and 20B and more particularly 21A and 21B with the exception that a $3^{rd}$ functional optical surface 292 is possible. FIG. 22C is a further example which incorporates the aspects of FIG. 22A and FIG. 22B while facilitating a planar mounting of a SSE 174 while providing an additional surface which could be used for a micro-optic device 286. This optical device 289 incorporates a primary light collecting/condensing optic 290, two micro-optic devices 286, either or both of which could alternatively be reflectors, and an output optic 292, as well as an integrated air jet 287. This is a versatile configuration that can be configured to function in a number of ways depending on the optical structure given to each of the four optical surfaces. As shown, the first surface 290 is shown as a cadiotropic collimator, second and third surfaces as mirrors or micro-optic elements, and fourth surface 292 as a diverging field lens or diffuser.

Applications for a solar simulator can include requirements that vary from steady state operation to pulsed operation to complex waveform generation. Since most practical test applications are software driven, programmable control capability is a useful feature.

Figure 23:
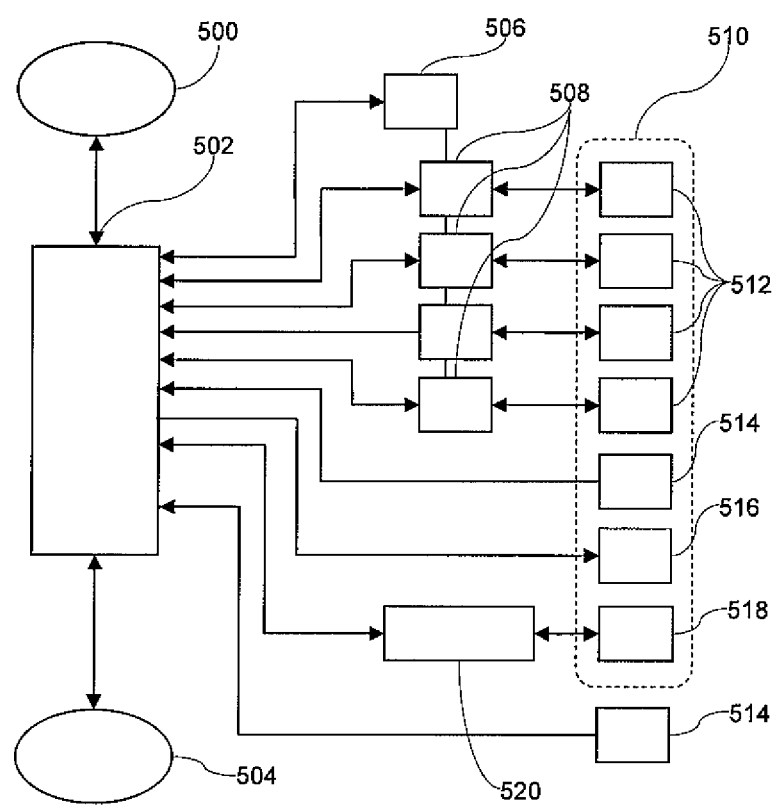
FIG. 23 illustrates a block diagram of an example control system for a solar simulator.

An example control system is shown in FIG. 23. A host system 500 connects the solar simulator to an outside user or external control logic circuitry. The host system 500 interacts with the simulator control 502, which, in this embodiment, is programmable and handles the data flow, logic and data structure for the solar simulator. The simulator control allows for a user to program the logic for the solar simulator such that the simulator control can make decisions based on programmable routines or feedback from other components in the solar simulator or control system. It will be understood that the host system and simulator control may include software/program code on a physical medium that when executed on a processor causes the processor to function in accordance with the program code. Additional metrology 504 may provide further information about the target, or the environment, for example, calibration sensors, and timing from external equipment. The additional metrology 504 may also allow the simulator control 502 to use and process sensors necessary for achieving control or executing measurement routines using the solar simulator to achieve desired performance and versatility. Additional metrology typically includes reference cell feedback, one or more test loads, probe travel/force monitoring, test fixture temperature regulation and/or monitoring, unit under test temperature monitoring, and other devices used to support various test and measurement functions associated with the operation of a solar simulator. It will be understood that the host system, simulator control and additional metrology may include computer processors, PLCs (programmable logic controls) or other control systems that may be known in the art. These elements may also include memory or other forms of storage for tracking data and include input and output systems and the like.

The control system may further interact with a power regulator 506 to run the control system and SSE drivers 508, which further drive power into the SSEs and process integrated sensor feedback signals. The SSE drivers 508 provide the stability management discussed above with regard to current regulation. FIG. 23 also shows the SSE matrix assembly 510, which can convert electrical power into optical power. The SSE matrix 510 is comprised of at least one SSE string 512, may include additional light sensors 514 and also optionally, opto-mechanical actuators 516. The SSE matrix 510 may also contain thermal management elements 518. SSEs can incorporate temperature sensors, optical sensors, junction voltage monitors and other items integrated into them. Although only one "box" is shown for each of sensors 514, opto-mechanical actuators 516 and thermal management elements 518, it will be understood that these elements may be integrated within the SSE matrix and among SSE strings 512 as needed to perform the functions required. The light sensors 514 may measure light reflected from the target, which relates to the measurement and calibration capability of the solar simulator. The sensors 514 may relay this information to the simulator control 502. The opto-mechanical actuators 516, if used, may be controlled by the simulator control 502 and may function by steering alignment of the collimating optics or properties within the collimating optics to control the direction or position of the light output from an SSE. In solar simulators, opto-mechanical actuators typically include probe cards, electronic clods, fixtures, fixture temperature controls and other elements used to measure the product. The thermal management elements 518 refers to the heat sink and air-flow and related elements that are used for controlling the temperature of the SSEs. Thermal management devices with the SSE matrix assembly are generally supported by external drivers and controllers.

For best performance in pulsed applications, driver controls may be divided into set point and gating controls so that the groups of SSEs can be driven to individually adjusted set-point values but multiple groups of SSEs are controlled to modulate their brightness in synchronism to a master control signal.

In considering the proposed new standards for solar simulators referred to above, the highest class (class X) precision of control, is defined as ≤0.1% with a turndown ratio of 10, and will typically require digital controls with ≥14 bit precision. For the lower levels of advanced precision (e.g. class A+, class Z), a ≤0.2% over 6:1 range may be sufficient, which is generally equivalent to 12 bit digital precision. For achieving even higher levels of precision, I/O devices with bit resolution may be used.

In providing control systems, current mode signaling (e.g. 0-10 mA or 4-20 mA) may be preferred for extended cable runs in order to achieve good noise immunity and minimized cross-talk. In particular, use of balanced circuits may be desirable in order to minimize cross-talk between channels of control particularly under transient conditions. Uniformity of output under dynamic conditions including tracking between separately controlled SSE strings will also generally be desired.

Alternatively, integrated device drivers with digital interfaces for distributed control could be used. For example, industry standards include DMX512A, which provides multi-channel digital lighting control incorporating temperature feedback, or other standard lighting protocols such as DALI or LEDsync. Although these networks are likely to be too slow for programmable control of pulse waveforms, they may be used for configuration management. Distributed I/O modules using an industrial fieldbus might also be used. Fast (e.g. Ethernet based) fieldbuses are also believed to have the bandwidth necessary for dynamic and interactive pulse control. For example, EtherCAT provides time based I/O event scheduling with a resolution and synchronization of less than 1 microsecond. Preferably, SSE drivers and sensors are implemented as I/O nodes on a fast or very fast digital network. Ideally, this network would be one of Ethernet, in its various versions, or USB, in its various versions.

When used with or embedded in external systems, for example a metrology system, additional control interfaces may also be required such as a trigger handshake and/or mode selection along with possible proportional feedback.

Additional interfaces may include temperature regulation and coolant circulation monitoring, control of opto-mechanical devices, etc.

It will be further understood that the control system may include various feedback loops among sensors and controls to allow the solar simulator to have some self-learning capabilities.

Field Division/Edge Reflector

In some applications, it may be desirable to constrain the illumination field or subdivide an illumination field of the solar simulator into well-defined segments. Conventionally, a simple barrier or nothing was used but these resulted in a region where the intensity falls off gradually towards the edges. Any issues were typically handled by extending the size of the solar simulator or notifying a user of the fall-off. Although not readily apparent, it has been determined that constraining the illumination field or breaking the illumination field can be accomplished without an umbra by using vertically oriented barriers that are reflective. This approach has the effect of virtually extending the SSE matrix beyond the physical boundary or of allowing portions of a test module to be tested separately. In particular, since there can be some reflection loss, the barrier is preferably tilted and/or shifted slightly, which serves to slightly compress the virtual image and compensate for any reflection loss.

Figure 24:
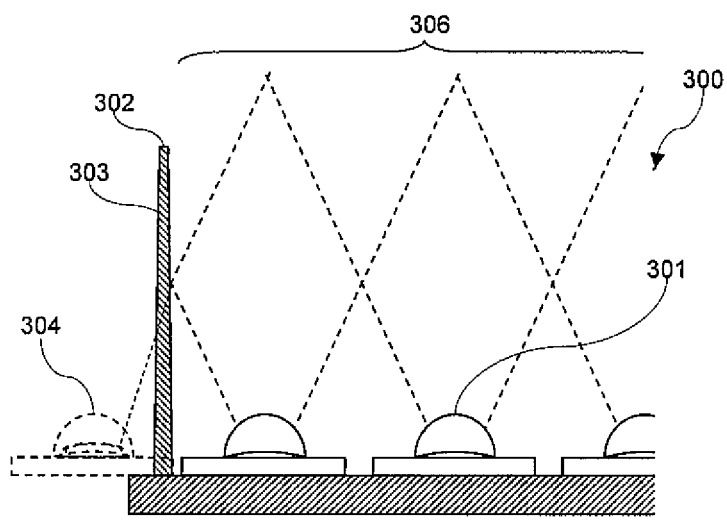
FIG. 24 shows a sectional view of an example of the use of an edge reflector.

FIG. 24 illustrates a barrier 302, which creates or allows for a sharp edge or segmentation to the illumination field. FIG. 24 illustrates a cross section view of an SSE matrix 306 composed of SSEs with collimating optics and a reflective barrier 302 to achieve, in this example, a sharp edge to the illumination field. Divergence of the emitted light is exaggerated for clarity. The surface 303 is reflective and may preferably incorporate a pitch adjustment, slight curvature and slight tilt to compensate for reflectance loss, resulting in virtual images of near perimeter SSEs 304 with brightness much the same as that of the SSEs 301 in the actual array. Preferably, the barrier would be placed at a distance of approximately one-half the pitch of the array from the perimeter row/column of SSEs, preferably slightly less, and the tilt would be in the range of 0 to 15 degrees but set appropriately for the conditions to create an appropriate reflected image, which, in combination with the direct output of nearby SSEs, may result in nearly uniform irradiance at the target.

Figure 25A:
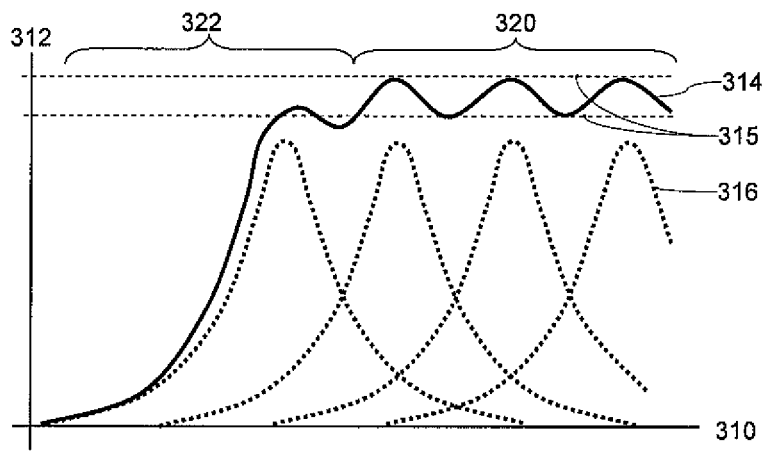
FIG. 25A illustrates the light intensity distribution at the edge of a typical SSE array.
Figure 25B:
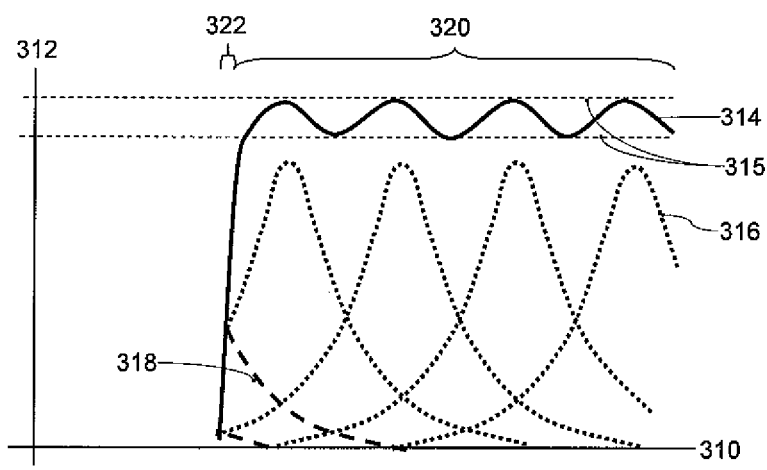
FIG. 25B illustrates the light intensity distribution at the edge of a SSE array with the use of a reflective stop.

The advantages of this design may include not having to extend the area of the array to be substantially larger than the target to be illuminated and the ability to unobtrusively segment the illuminated area, which facilitates the independent measurement of individual target regions within a larger area of the target. For example, the ability to unobtrusively segment the illuminated area would facilitate the independent measurement of individual cells within an array of cells in a PV subassembly which is a unique capability of this solar simulator. It may be understood that a barrier 302 as described here could be incorporated with or without the aspects of collimation and SSE clustering without altering the usefulness of this device. The angular distribution of the emitted light is of no consequence other than to affect the geometry of the apparatus as the illumination at a working distance is composed of overlapping output from several SSEs. FIG. 25 shows an illustration of the effect of the reflective barrier on the illumination field for at a nominal working distance. FIG. 25A illustrates the intensity distribution at the perimeter of an unbounded array of SSEs while FIG. 25B illustrates the intensity distribution at the same or similar array with a reflective barrier in place. In particular, FIG. 25A illustrates irradiance 312 at a distance equal to approximately 2 pitches from an array of emitters along a line normal to the perimeter 310 where the output of individual SSEs 316 is produces a combined illumination 314, which exhibits a modulated intensity for the most part of the field 320 which is within specification (indicated by lines 315) and an extended portion 322 where intensity tails off and falls out of specification. FIG. 25B illustrates an arrangement similar to that of FIG. 25A with the addition of a reflective barrier as described above. In this case, the combined illumination 314 of individual SSE outputs 316 plus the reflected image of several perimeter SSEs 318 results in substantially all of the illuminated field 320 being in specification with only a very minor portion 322 where it tails off and is out of specification. As shown, the use of a mirror/reflective barrier provides a much sharper edge to the illuminated area while providing a greater area that is illuminated within specification using a given array of SSEs. With a two sided reflective barrier, this same effect can be used to segment the field.

Figure 26A:
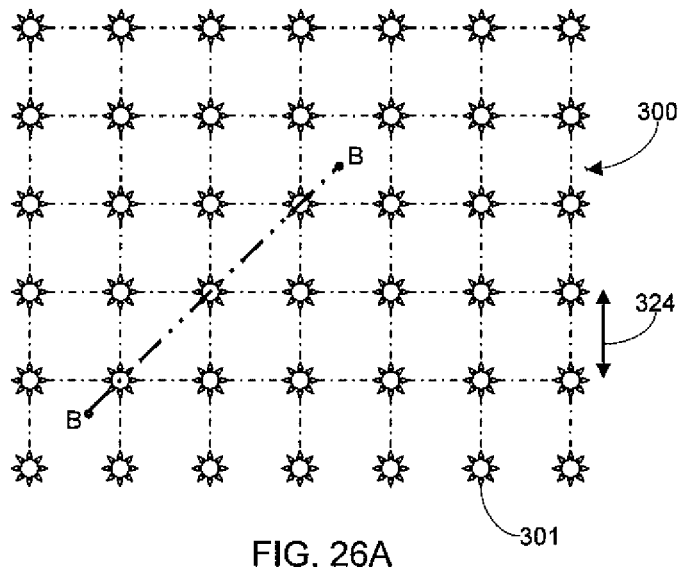
FIG. 26A illustrates the layout of a typical array of SSEs.
Figure 26B:
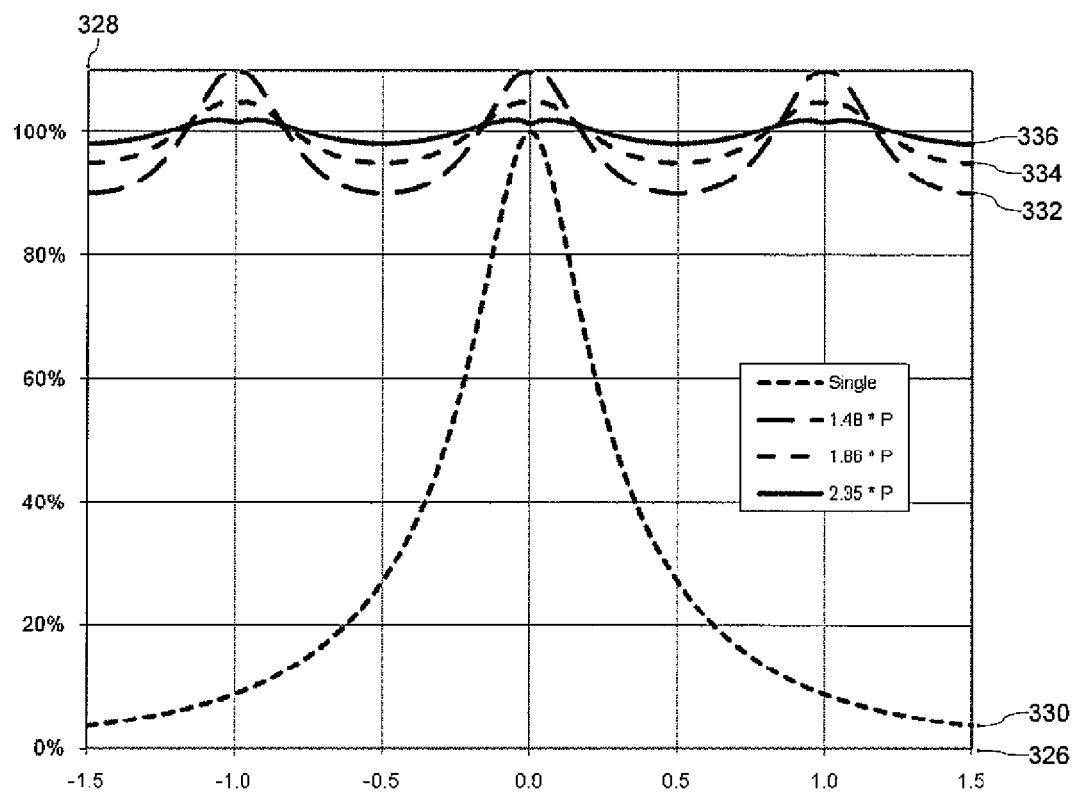
FIG. 26B shows a graph of light intensity variation along the line B-B of FIG. 26A.

FIG. 26A provides a schematic plan view of an array or part array of SSEs while FIG. 26B graphically represents the theoretical output of an array of Lambertian emitters, each collimated using a simple lens, blended to yield a high class of uniformity. FIG. 26A provides a schematic plan view of an array or part array 300 of SSEs or clusters of SSEs 301 which are disposed on a rectangular matrix of nearly constant pitch 324. In practice, devices of several different types will be combined in order to produce a complete spectrum but all that is needed is that all devices of each particular type are related by the grid pitch. A hexagonal array would have some advantages however the rectangular arrangement is demonstrated here as it represents a less good case for field uniformity. FIG. 26B shows various intensity distributions along a line B-B in FIG. 26A which represents the line where the greatest non-uniformity can be observed. The vertical scale 328 represents the intensity normalized to the median intensity along the entire line. Intensity is plotted against linear position in units of 1 pitch 326. The central curve 330 represents the near field irradiance of a single SSE at a working distance of equal to 1 pitch. In this example, Lambertian emitters with a collimating optic with mag=0.18 and NA=22 is depicted. This may vary from one instance to the next; nevertheless, the same principles apply.

The other curves in the graph illustrate the irradiance from a theoretical infinite array of emitters in a square matrix array at various working distances as would be observed along the line B-B from FIG. 26A. Graph line 332 shows the irradiance along the line B-B at a working distance equal to 1.48 times the pitch. The variation is seen to be within 10 percent indicating class C uniformity is just met. Irradiance at a working distance equal to 1.86 times the pitch, graph line 304 334, exhibits a variation of approximately plus or minus 5 percent indicating that class B uniformity is just being met. Irradiance at a working distance equal to 2.35 times the pitch, graph line 336, exhibits a variation of about plus or minus 2 percent, indicating that class A uniformity is just being met. From the graph of FIG. 26B, one may extrapolate that a relatively small working distance is sufficient to achieve acceptable spatial uniformity given that pitch would typically be in the order of 70 mm. This distance may permit testing of even very large products to be done with the product only a short distance from the light source, thus conserving floor-space and enabling user and automation friendly flat-bed test station configurations and even sunny side down configurations (i.e. with the light collecting side of the PV module facing down). Sunny side down testing may be more compatible with standard cell fabrication lines.

One of the primary challenges of any solar simulator is the ability to accurately match the solar spectrum. A further challenge is to provide some control over the emission spectrum to allow selectability with regard to frequency output so that the solar simulator can be used for various types of tests, including those that may require a more limited or varied spectrum. In order to provide a range of frequencies, an SSE may be composed of multiple individual SSEs, each emitting in a predetermined wavelength band. Alternatively, a plurality of SSEs, each having a predetermined wavelength band, can be organized in a matrix. The desired spectrum can be divided among the individual emitters or the plurality of SSEs, with the spectral sum giving the desired output spectrum. It will be understood that spectral uniformity is still desired and various wavelengths would need to be distributed throughout the array. As the number of individual emitters of different wavelengths increases, the resolution of control over the spectrum increases. The relative spectral components can be directly controlled by controlling the current driving the corresponding individual emitter or SSE. When properly calibrated, the programmable logic then has direct control over the output spectrum. This may also be used in conjunction with broad band individual emitters or SSEs, which reduces the number of individual emitters or SSEs required, though may constrain the range of achievable spectra.

Figure 27A:
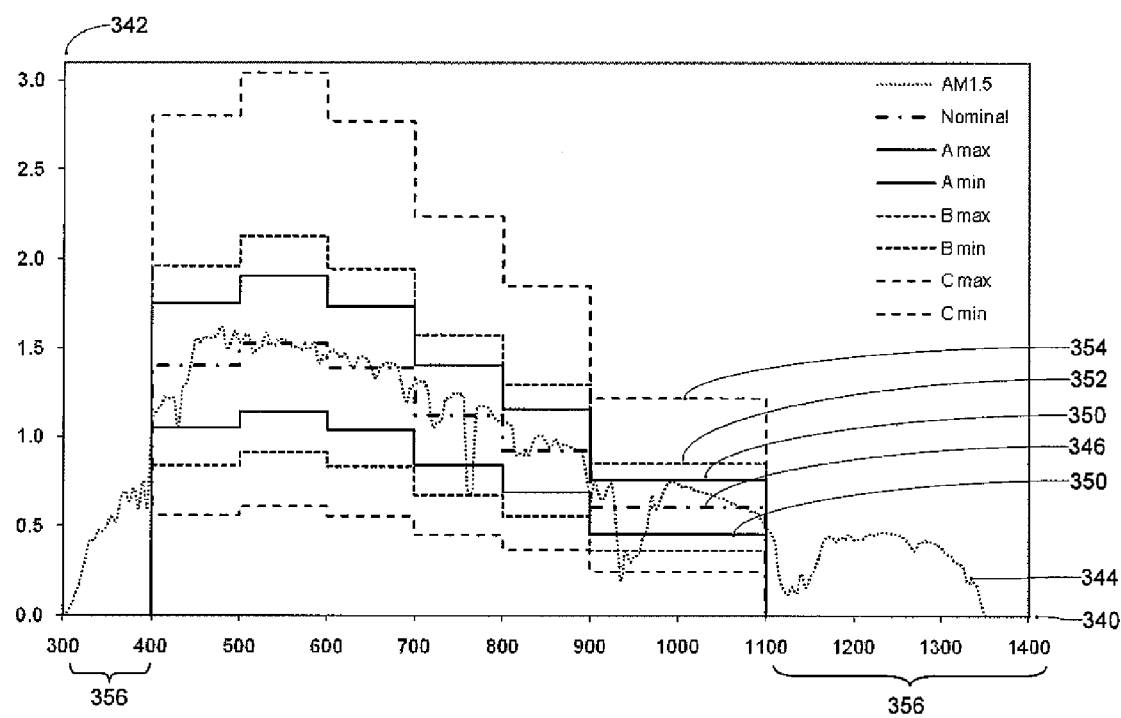
FIG. 27A shows a graphical representation of spectral match limits as defined in the IEC 60904-9 versus AM1.5 spectrum.
Figure 27B:
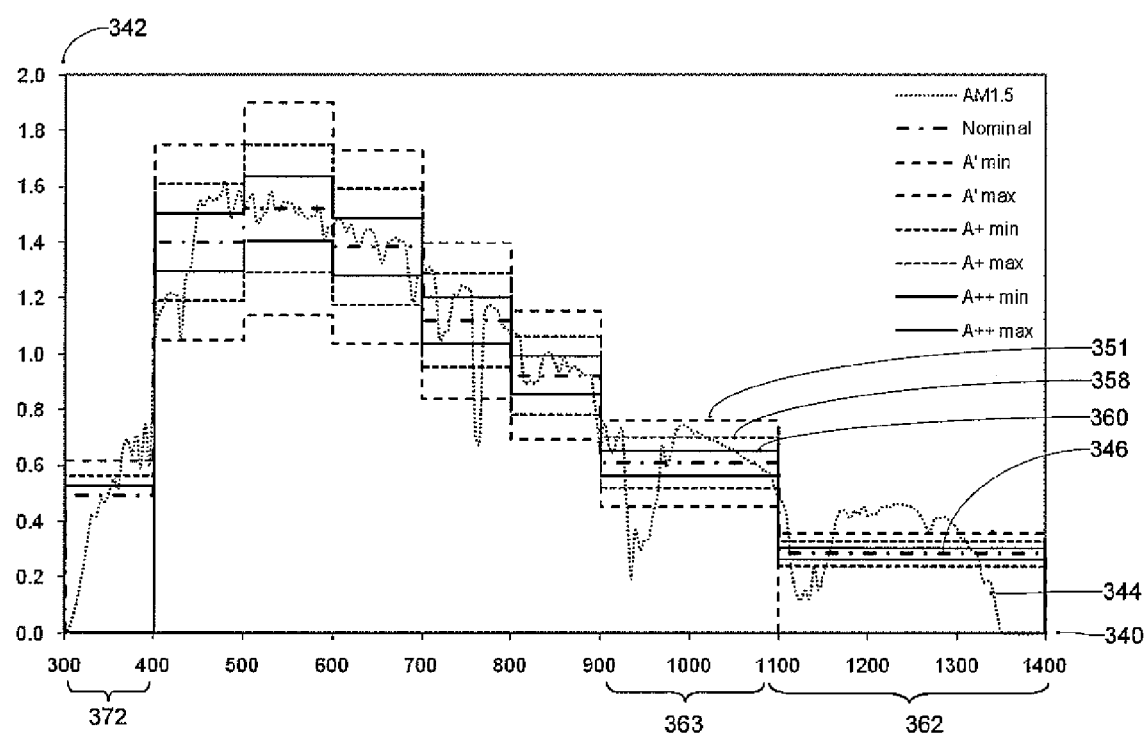
FIG. 27B shows a graphical representation of spectral match limits as defined in the IEC 60904-9 versus AM1.5 spectrum with the proposed addition of UV and IR bands.

FIG. 27A is a graph that shows the AM1.5G standard solar spectrum which solar simulators generally try to emulate, particularly for gauging of terrestrial flat-plate PV modules, as well as the upper and lower limits for the three currently defined classifications A, B, C. FIG. 27B is a graph similar to FIG. 27A, which shows the limits for inventive extensions to the existing standard introducing new classes A', A+ & A++.

FIG. 28 is a graph that shows the standard AM1.5G solar spectrum as well as the proposed upper and lower limits for proposed new classes of solar simulators, X, Y and Z.

An important aspect is that these new classes cover more of the solar spectrum and have tighter limits on spectral match than the existing classifications illustrated in FIG. 27A. FIG. 27A depicts spectral irradiance 342 in units of W/m2/nm versus wavelength 340 (nm). The standard AM1.5 spectrum 344 is shown with the nominal irradiance defined by the standard 346 superimposed and bracketed by class A limits 350 (solid lines), class B limits 352 (small dashes) and class C limits 354 (large dashes). The specified spectrum is divided into 6 spectral bands delineated by steps in the nominal value 346. Some portion of the spectrum 356 is not controlled by the standard hence simulators are not evaluated for their output in these bands, which may be a potential source of non-reproducibility. The standard AM1.5 spectrum 344 is shown with the nominal irradiance defined by the standard 346 superimposed and bracketed by class A++ limits 360 (solid lines), class A+ limits 358 (small dashes) and class A' limits 351 (large dashes). Extended spectral bands for sub-class *.U (UV) 372 and sub-class *.H (IR-A) 362 are indicated as well reduced spectral band for sub-class *.C (NIR) 363. This information is also shown in tabular form in tables 4A and 4B.

FIG. 28 depicts the innovative new scheme of classification. FIG. 28 depicts spectral irradiance 342 in units of W/m2/nm versus wavelength 340 (nm). The standard AM1.5 spectrum 344 is shown with the nominal irradiance defined by the standard 376 superimposed and bracketed by class X limits 364 (solid lines), class Y limits 366 (small dashes) and class Z limits 368 (large dashes). The specified spectrum is divided into 6 main spectral bands within the standard spectral range 370 delineated by steps in the nominal value 364. Extended spectral bands for sub-class *.U (UV) 372, *.H (IR-A/'Hot') 374, *.T (IR-A & IR-B/'Thermal') 376 and spectrum reduction sub-class *.C (NIR/'Cold') 375 are indicated. This information is also presented in tabular form in tables 5A and 5B.

TABLE 4A

Novel Extended Classification Scheme Summary

| | Class | | | | | |
|---|---|---|---|---|---|---|
| | A++ | A+ | A' | A | B | C |
| tandard Description | Q/A | Extensions to IEC 60904-9 Production | Production | Current best | IEC 60904-9 Non-critical | Non-guaging |
| Nominal gage R&R | ±1.5% | ±2% | ±4% | ±4% | ±10% | N/A |
| Operating range | 0.2 ... 1.3 suns | 0.3 ... 1.2 suns | 0.5 ... 1.2 suns | | N/S | |
| | | | Spectral content (nm) | | | |
| Standard | | 400 ... 1100 | | | 400 ... 1100 | |
| Out of band | <3% | <5% | <10% | | N/S | |
| *.C (cold) | | UL = 900 | | | N/A | |
| *.U (UV) | | LL = 300 | | | N/A | |
| *.H (hot) | | UL = 1400 | | | N/A | |
| *.T (thermal) | | N/A | | | N/A | |
| Sample area | Same as uniformity | Same as uniformity | Same as uniformity | | N/S | |
| Spectral Match | 1.075/.925 | 1.15/0.85 | 1.25/.075 | 1.25/.075 | 1.4/0.6 | 2.0/0.4 |
| AM1.5 correlation | | N/S | | | N/S | |
| | | | Spatial distribution | | | |
| Uniformity | ≤1% | ≤2% | ≤2% | ≤2% | ≤5% | ≤10% |
| Divergence | ≤6 deg | ≤10 deg | ≤12 deg | | N/S | |
| Sample area | <1/64th & | <1/64th & | <1/64th & | | <1/64th & | |

TABLE 4A-continued

Novel Extended Classification Scheme Summary

| | Class | | | | | |
|---|---|---|---|---|---|---|
| | A++ | A+ | A' | A | B | C |
| | <100 cm² | <100 cm² | <200 cm² | | <400 cm² | |
| Spectral uniformity | ≤3% | ≤5% | ≤7% | | N/S | |
| Stability & reproducibility | | | | | | |
| Short term stability | <0.3% | <0.5% | <0.5% | <0.5% | <2% | <10% |
| Long term stability | <0.7% | <1% | <1% | <2% | <5% | <10% |
| Spectral instability | <2% | <3% | <5% | N/S | N/S | N/S |
| Reproducibility | <3% | <4% | <5% | N/S | N/S | N/S |
| Sample size | | 250 psec | | | Arbitrary | |

TABLE 4B

Novel Extended Classification Scheme Spectral Power Distribution

| | Band | | | | | | | |
|---|---|---|---|---|---|---|---|---|
| | 0 | 1 | 2 | 3 | 4 | 5 | 6 | 7 |
| | Sub-class | | | | | | | |
| | U | | | | | | C | H |
| LL (nm) | 300 | 400 | 500 | 600 | 700 | 800 | 900 | 1100 |
| UL (nm) | 400 | 500 | 600 | 700 | 800 | 900 | 1100 | 1400 |
| Proportion | 6.5% | 18.5% | 20.1% | 8.3% | 14.8% | 12.2% | 16.1% | 11.3% |
| W/m² | 49.17 | 140.42 | 150.88 | 138.78 | 112.72 | 93.46 | 120.48 | 85.31 |

TABLE 5A

Novel New Classification Scheme

| Class | X | Y | Z | A, B, C |
|---|---|---|---|---|
| Standard | | New standard | | Reference |
| Description | Research grade | R&D, QC | Quality standard | |
| Nominal gage R&R | ±1% | ±1.5% | ±2% | |
| Operating range | 0.2 ... 1.3 suns | 0.2 ... 1.3 suns | 0.3 ... 1.2 suns | N/S |
| Spectral content (nm) | | | | |
| Standard | | 400 ... 1130 | | 400 ... 1100 |
| Out of band | <2% | <3% | <4% | N/S |
| *.C (cold) | UL = 900 | UL = 900 | UL = 900 | N/A |
| *.U (UV) | LL = 300 | LL = 300 | LL = 300 | N/A |
| *.H (hot) | UL = 1400 | UL = 1400 | UL = 1400 | N/A |
| *.T (thermal) | UL = 1800 | UL = 1800 | UL = 1800 | N/A |
| Sample area | Same as uniformity | Same as uniformity | Same as uniformity | N/S |
| Spectral Match | 1.05/0.95 | 1.10/0.90 | 1.15/0.85 | 1.25/0.75 2.00/0.40 |
| AM1.5 correlation | <0.45 W/m²/nm | <0.9 W/m²/nm | <1.3 W/m²/nm | N/S |
| Spatial distribution | | | | |
| Uniformity | ≤1% | ≤2% | ≤2% | ≤2% ... 10% |
| Divergence | ≤6 deg | ≤10 deg | ≤12 deg | N/S |
| Sample area | <1/64th & <100 cm² | <1/64th & <200 cm² | <1/64th & <200 cm² | <1/64th & <400 cm² |
| Spectral uniformity | ≤3% | ≤5% | ≤7% | N/S |
| Stability & reproducibility | | | | |
| Short term stability | <0.2% | <0.33% | <0.5% | <0.5% <10% |

TABLE 5A-continued

Novel New Classification Scheme

| Class | X | Y | Z | A, B, C |
|---|---|---|---|---|
| Long term stability | <0.5% | <1% | <1.5% | <2% <10% |
| Spectral instability | <1% | <2% | <3% | N/S |
| Reproducibility | <3% | <4% | <5% | N/S |
| Sample size | 100 psec | 200 psec | 200 psec | Arbitrary |

TABLE 5B

Novel New Classification Scheme Nominal Spectral Power Distribution

| | Band | | | | | | | | |
|---|---|---|---|---|---|---|---|---|---|
| | 0 | 1 | 2 | 3 | 4 | 5 | 6 | 7 | 8 |
| | | | | | Sub-class | | | | |
| | U | | | | | | C | H | |
| LL (nm) | 300 | 400 | 490 | 575 | 665 | 770 | 900 | 1130 | 1400 |
| UL (nm) | 400 | 490 | 575 | 665 | 770 | 900 | 1130 | 1400 | 1800 |
| Proportion | 6.4% | 16.6% | 16.7% | 16.7% | 16.6% | 16.7% | 16.7% | 10.2% | 5.7% |
| W/m² | 49.17 | 124.83 | 129.71 | 129.25 | 125.07 | 127.4 | 128.09 | 77.70 | 43.43 |

Figure 29A:
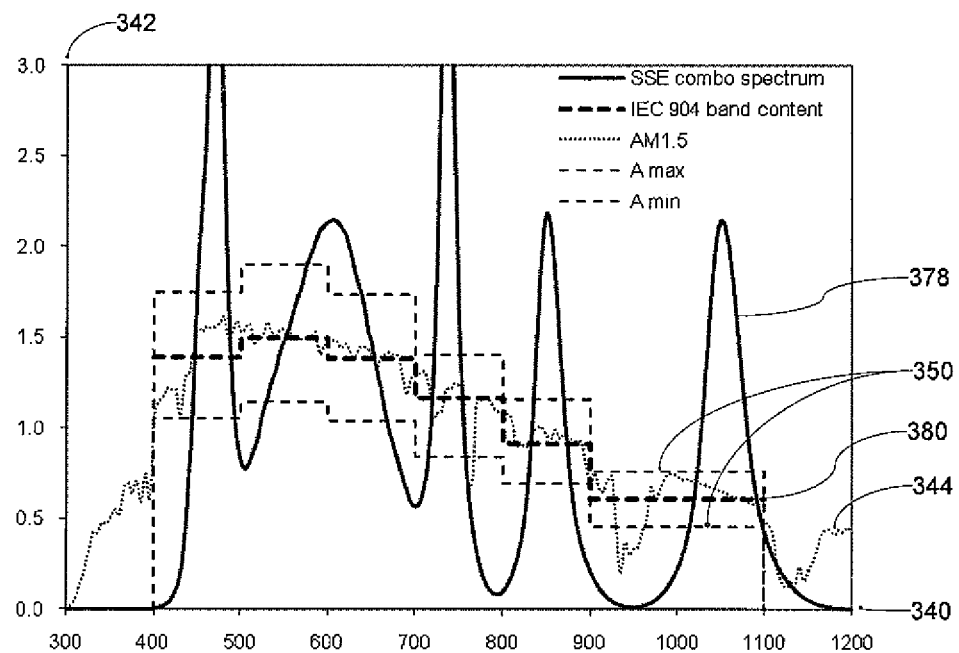
FIG. 29A illustrates the spectral irradiance of a solar simulators composed of 5 different emitter types selected to meet or exceed class A performance.
Figure 29B:
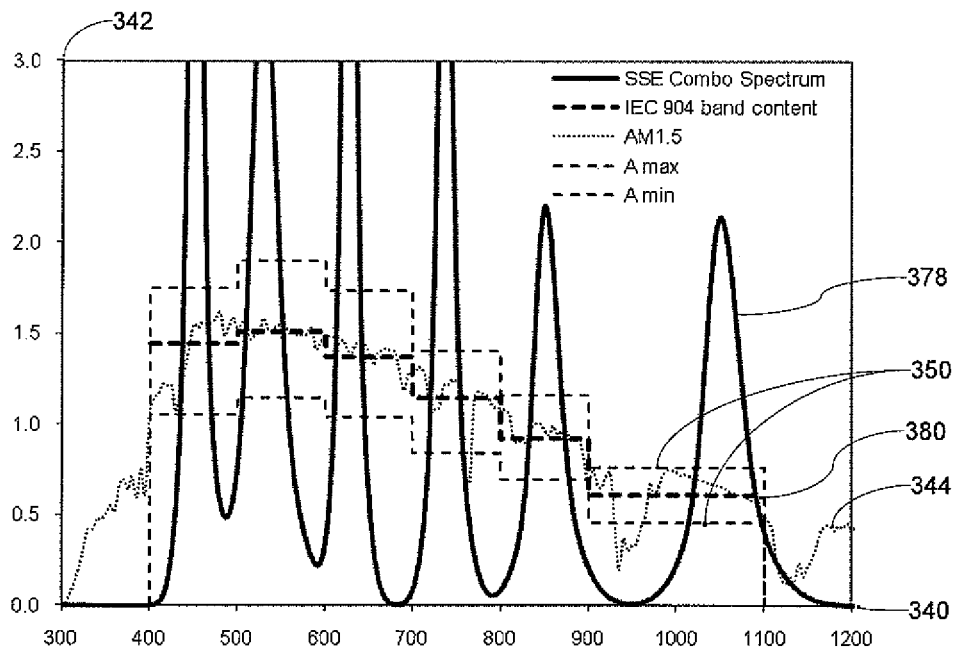
FIG. 29B illustrates the spectral irradiance of a solar simulators composed of 6 different emitter types selected to meet or exceed class A performance.

FIG. 29A and FIG. 29B illustrate the spectral irradiance of practical simulators capable of meeting or exceeding class A or new class A+ or class A++ defined in the proposed extensions to the standard. FIG. 29A depicts the spectral irradiance of a practical simulator composed of 5 different SSE types—blue, warm white, far red and infrared selected from COTS devices. FIG. 29A shows spectral irradiance 342 in units of W/m2/nm versus wavelength 340 (nm). The standard AM1.5 spectrum 344 is shown with the combined spectrum of the SSEs 378 superimposed along with the SSE spectrum averaged over each band of the standard 380 which is bracketed by class A limits 350. FIG. 29B depicts the spectral irradiance of a practical simulator composed of 6 different SSE types—royal blue, green, red, far red, and infrared(2) selected from COTS devices. FIG. 29B shows spectral irradiance 342 in units of W/m2/nm versus wavelength 340 (nm). The standard AM1.5 spectrum 344 is shown with the combined spectrum of the SSEs 378 superimposed along with the SSE spectrum averaged over each band of the standard 380 which is bracketed by class A limits 350.

Figure 30:
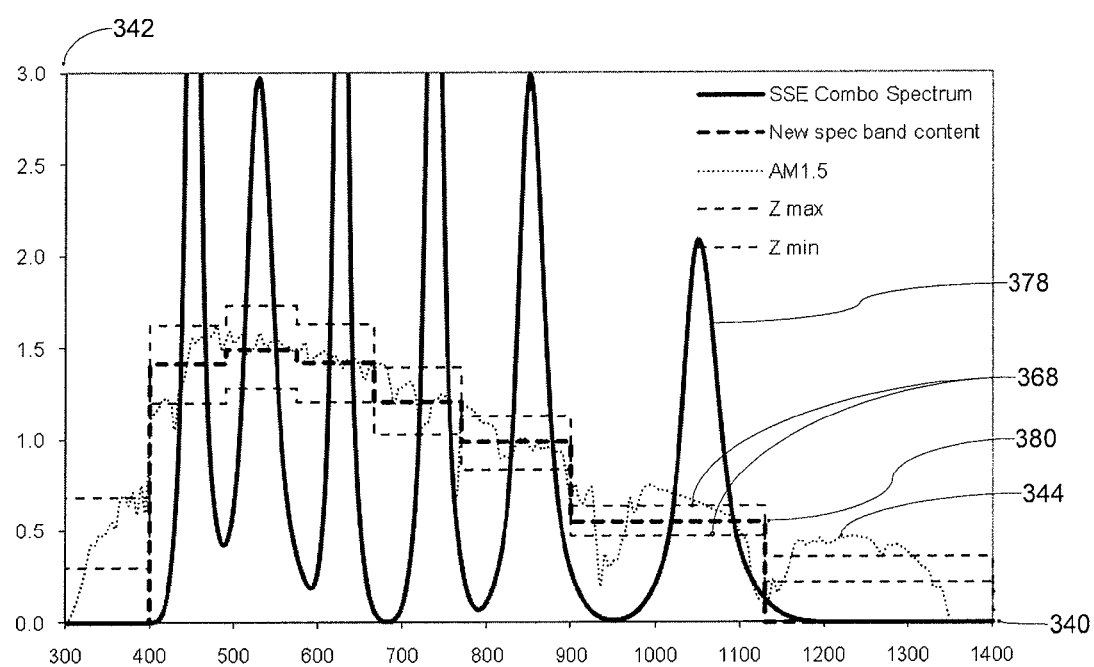
FIG. 30 illustrates the spectral irradiance of a solar simulator comprised of 6 different emitter types selected to meet or exceed class Z performance.

FIG. 30 illustrates the spectral irradiance of a solar simulator composed of 6 different SSE types (different wavelengths) intended to be capable of producing or exceeding a class Z spectral performance or class Y, which would generally be suitable for Q/A metrology and which has sufficient spectral definition to perform Q/A, reflectance and carrier mobility measurements. FIG. 30 shows spectral irradiance 342 in units of W/m2/nm versus wavelength 340 (nm). The standard AM1.5 spectrum 344 is shown with the combined spectrum of the SSEs 378 superimposed along with the SSE spectrum averaged over each band of the standard 380 which is bracketed by class Z limits 368.

Figure 31A:
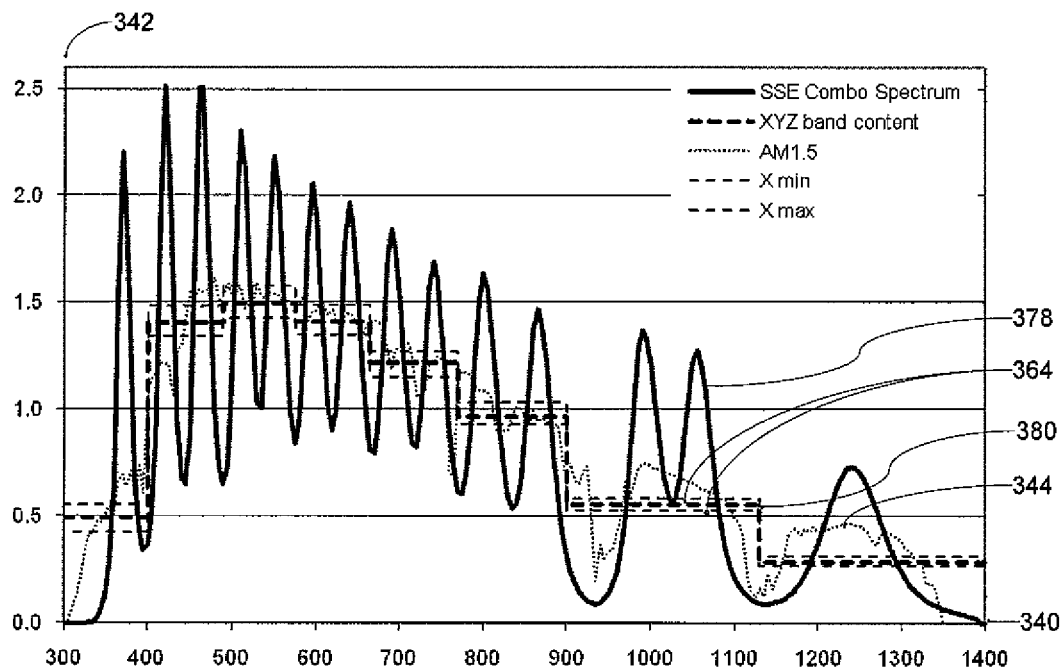
FIG. 31A illustrates the spectral irradiance of a solar simulator comprised of 14 different emitter types selected to meet or exceed class Z performance.
Figure 31B:
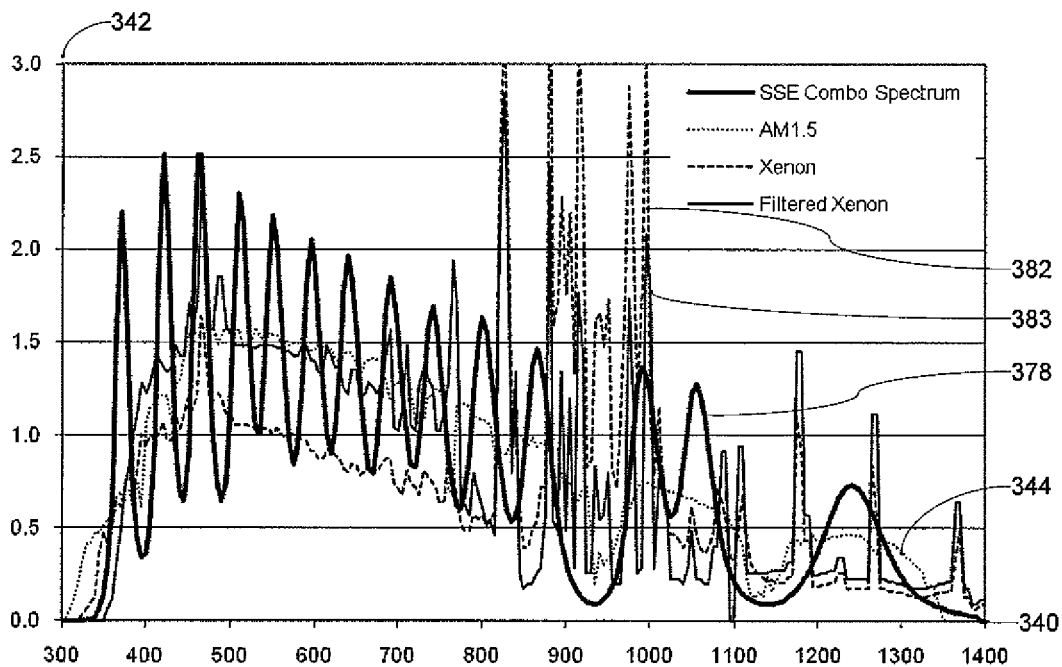
FIG. 31B illustrates the comparison between the spectral irradiance of the solar simulator shown in 31A versus conventional xenon lamp solar simulators.

FIG. 31A illustrates the spectral irradiance of a solar simulator composed of 14 different individual emitter types (different wavelengths) capable of producing class X. UH spectral performance, which would be suitable for scientific quality and certification quality measurements with both single and multi-junction devices. FIG. 31A shows spectral irradiance 342 in units of W/m2/nm versus wavelength 340 (nm). The standard AM1.5 spectrum 344 is shown with the combined spectrum of the SSEs 378 superimposed along with the SSE spectrum averaged over each band of the standard 380 which is bracketed by class X limits 364. This simulator provides the standard spectrum extended to include UV and IR-A wavelengths. FIG. 31B shows the same spectra as shown in FIG. 31A where the combined SSE spectrum 378 is superimposed with the spectrum of a xenon lamp based solar simulator meeting class B spectral performance 382 and a filtered xenon lamp based solar simulator meeting class A spectral performance 383. Note the large spikes in output in the range of 800 to 1000 nm which are problematic.

Figure 32:
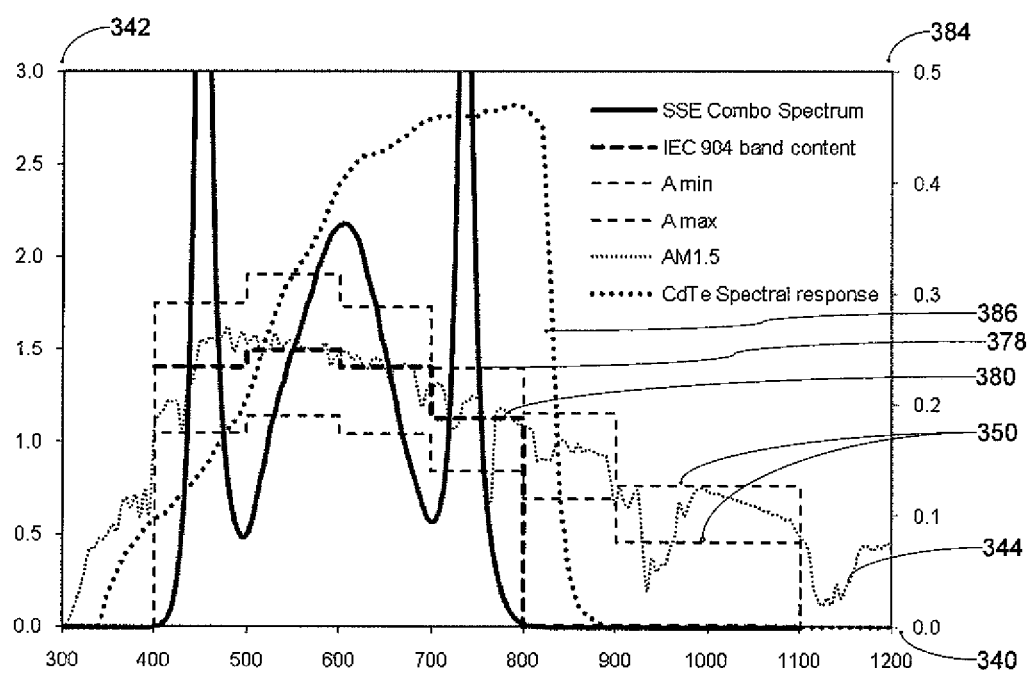
FIG. 32 illustrates the spectral irradiance of a modified class A solar simulator comprised of 3 different emitter types optimized for use with CdTe based targets.
Figure 33:
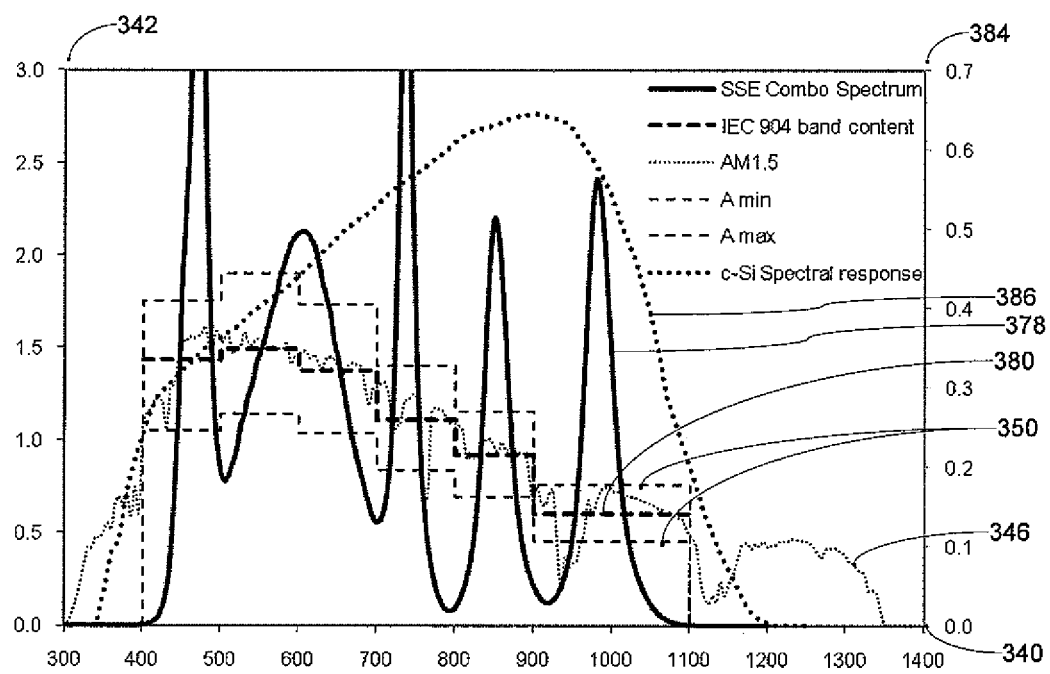
FIG. 33 illustrates the spectral irradiance of a class A solar simulator optimized for use with a silicon based target.
Figure 34:
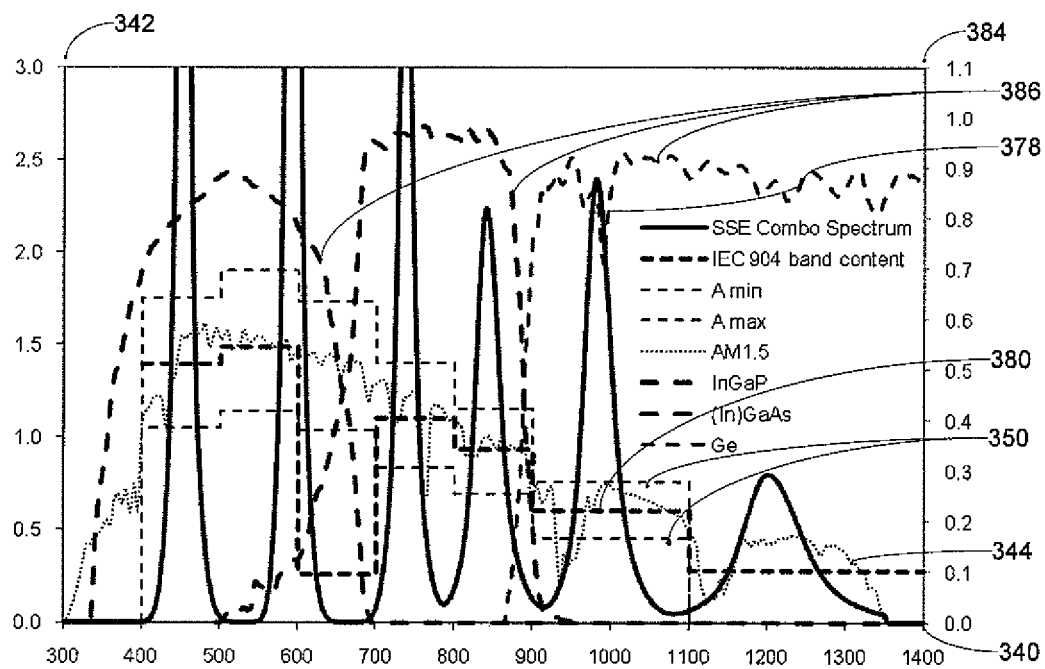
FIG. 34 illustrates the spectral irradiance of a modified class A solar simulator optimized for use with targets employing Ge/(In)GaAs/InGaP and similar triple junction technologies.

FIG. 32, FIG. 33 and FIG. 34 illustrate the spectra of practical simulators optimized for use with specific PV technologies. FIG. 32 depicts the spectrum of a simulator optimized for CdTe technology; FIG. 33 depicts the spectrum of a simulator optimized for c-Si technology; and FIG. 34 depicts the spectrum of a simulator optimized for triple junction Ge/(In)GaAs/InGaP technology. FIG. 32 depicts a practical simulator composed of 3 different SSE types—deep blue, warm white, far red—selected from COTS devices. FIG. 32 shows spectral irradiance 342 in units of W/m2/nm versus wavelength 340 (nm). The standard AM1.5 spectrum 344 is shown with the combined spectrum of the SSEs 378 superimposed along with the SSE spectrum averaged over each band of the standard 380 which is bracketed by class A limits 350. The spectral sensitivity 386 of the product, a CdTe device, is also shown.

In this application only the spectral bands entirely within the spectral response of the product are used and still achieve better than class A performance over the useful part of the spectrum which is advantageous in that it simplifies the solar simulator and reduces unnecessary heating of the product which in this case may need longer flash durations due to potentially slower dynamic response of the product (so more likely to be heated). Also, the long wave cut-off (shown at ~840 nm) which tends to be quite sharp may vary so this simulator avoids having spectral output in this band in order to ensure best reproducibility and to further improve the reproducibility that can be obtained over variations within a given product and between different similar products. This is in contrast to and an improvement over commonly used xenon lamp based simulators which have a cluster of spectral lines in this band as shown in FIG. 31B.

This simulator also embodies the ability to modulate deep red and blue light which facilitates measurement of secondary properties e.g. effect of CdS 'window' layer which is particularly sensitive to blue light. FIG. 33 depicts a practical simulator composed of 5 different SSE types—blue, warm white, far red and infrared—selected from COTS devices. FIG. 33 shows spectral irradiance 342 in units of W/m2/nm versus wavelength 340 (nm). The standard AM1.5 spectrum 344 is shown with the combined spectrum of the SSEs 378 superimposed along with the SSE spectrum averaged over each band of the standard 380 which is bracketed by class A limits 350. The spectral sensitivity 386 of the product, a c-Si PV device, is also shown. This configuration may provide a complete spectrum with better than class A performance using a relatively small number of SSE types while retaining the ability to programmably adjust or modulate the spectrum. As a further optimization this configuration uses an SSE with a peak wavelength of ~980 nm for coverage of the NIR band which is selected to minimize interactions with the band-gap limit of units under test, as opposed to the simulator depicted in FIG. 30 which uses a commonly available SSE wavelength of ~1055 nm. Practically, the configuration shown in FIG. 33 may incorporate at least one VCSEL type SSE. Additionally, this combination use a blue SSE as opposed to a deep blue SSE as shown in FIG. 30 for example in order to keep away from the upper limit of spectral response (shown here at ~390 nm) which can be variable in order to further improve the reproducibility that can be obtained over variations within a given product and between different similar products.

FIG. 34 depicts a simulator composed of 6 different SSE types—blue, yellow, far red and IR—selected from COTS devices. FIG. 34 shows spectral irradiance 342 in units of W/m2/nm versus wavelength 340 (nm). The standard AM1.5 spectrum 344 is shown with the combined spectrum of the SSEs 378 superimposed along with the SSE spectrum averaged over each band of the standard 380 which is bracketed by class A limits 350. The spectral sensitivity 386 of the product, a triple junction PV device, is also shown. This configuration may provide a complete spectrum with better than class A' performance, with one exception, using a relatively small number of SSE types while retaining the ability to programmably adjust or modulate the spectrum. In this configuration an equal number SSE types is provided to have dominant wavelengths within the spectral response of each of the several sub-cells which provides a spectrum in a way which enables the isolated testing of individual subcells by independently modulating the output of each of these groupings of SSEs.

Better than class A spectral performance may be achieved with the exception of the 600-700 nm band, which is intentionally suppressed in order to avoid the cross-over in response between the two top sub-cells (shown here at ~650 nm). It is possible to avoid this compromise while avoiding the cross-over in spectral response between the bottom two sub-cells (shown here at ~890 nm) since the spectral bands defined by the IEC 904 standard have a division near this wavelength. The practical spectrum shown in FIG. 34 avoids having any substantial light output near the upper and lower limits of the spectral responses of each of the several sub-cells which can be variable in order to further improve the reproducibility that can be obtained over variations within a given product and between different competitive products.

Figure 35A:
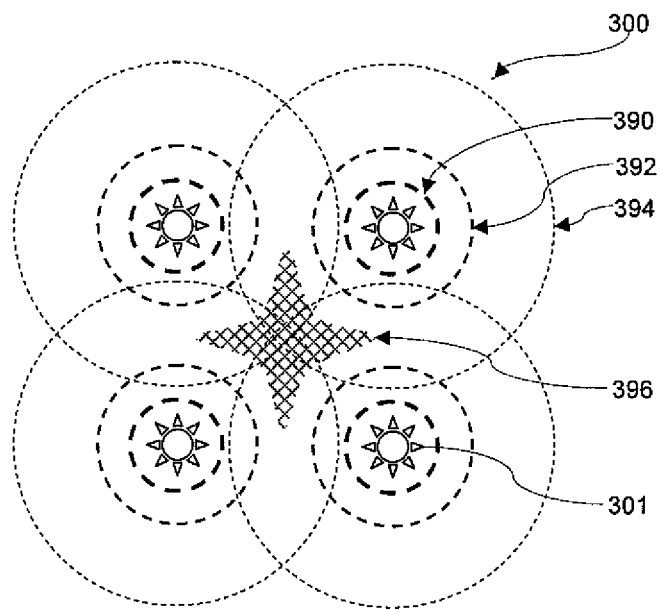
FIG. 35A illustrates the intensity distribution of a typical SSE array with ordinary collimation.
Figure 35B:
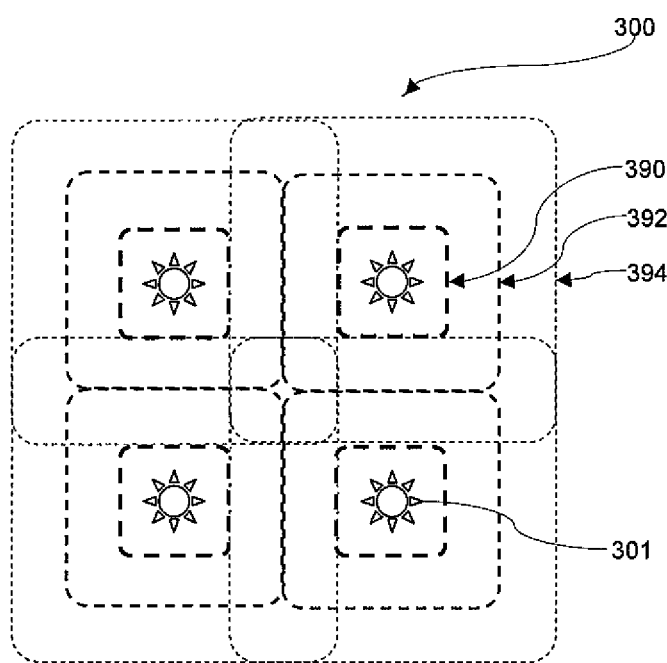
FIG. 35B illustrates the intensity distribution of a typical SSE array with beam shaping optics exhibiting much improved spatial uniformity.

FIG. 35A and FIG. 35B illustrates one possible advantage of using an optical device to remap the distribution of light from an SSE. FIG. 35A depicts a portion of an array of SSEs 300 where the individual SSEs 301 are shown surrounded by light intensity contours produced at a working distance by them in combination with their optical elements: 75% of peak brightness 390, 50% 392 and 25% 394. FIG. 35A is a representation of the result of combining SSEs with ordinary collimating optics that produce an approximately radially uniform intensity distribution which exhibits a significant dip 396 in the interstitial area between SSEs. This effect is previously depicted in a different way by means of FIGS. 26A and 26B. FIG. 35B depicts a similar arrangement to that of FIG. 35A with the exception that the SSE has been tightly collimated and then remapped using an optical device such as a multifaceted mirror for example into an essentially square distribution with the result that the uniformity of the combined output of the SSEs is much improved. This may be advantageous either because it permits a shorter working distance to be used while achieving a required class of spatial uniformity or alternatively it permits a wider spacing of SSEs to be used which can result in fewer (although necessarily brighter) devices to be used.

It will be understood that a solar simulator is typically employed as a part of a larger system. For example, in an assembly line environment, the larger system may include material handling systems, fixturing elements, sensors, data collection and other elements as needed for the particular application of the solar simulator. Similarly, the solar simulator, or more generally, light generator, may be operated in various modes depending on the particular application, for example, a pulsed mode may be used at some times while a continuous mode may be used at others. It will be understood that continuous mode may include continuous wave operation, in which various parameters may be varied even during continuous operation.

As described above, various improved elements are used either alone or in combination to provide an improved solar simulator. For example, some improved elements include:
  advanced measures for individual emitter or SSE stability (thermal management, thermal feedback, programmable control)
  air cooling of SSEs (including the encapsulant) using:
    comb structure to provide appropriate flow
    Coanda surface to provide appropriate flow
    air jet integrated into optic/SSE mount
  dense packing of SSEs
  spatial illumination intensity control using electrical current control
  optical field segmentation resulting in a sharp edge using a tilted and sloped mirror
  textured micro-element on a curved surface to shape and/or collimate the light output of the SSEs Based on these improvements, it is believed that a solar simulator incorporating some or all of these elements will significantly improve solar simulator performance and, in particular, the reproducibility of solar simulator based PV testing. Improved performance may include: better spectral match, temporal stability, spatial uniformity versatility (i.e. types of tests available) and service lifetime.

Versatility includes the ability to control the spectrum and thus allow quick measurement of spectral response and spectral reflectivity. This further allows the measurement of QE as a function of pulse duration, pulse intensity. These measurements allow carrier mobility measurements, lifetime measurements, etc. Versatility also allows for the ability to perform QE testing, color inspection and reflectance measurement concurrently with IV testing.

It should be understood that various modifications can be made to the exemplary embodiments described and illustrated herein, without departing from the general scope of this application. In particular, it will be understood that all embodiments that are functional or mechanical equivalents of the specific embodiments and features that have been described and illustrated herein are included. Further, the various features and embodiments described herein may be combined or used in conjunction with or without various other features and embodiments as described and illustrated herein.

I claim:

1. A light generating system comprising:
   a plurality of solid state emitters (SSEs); and
   a stability control system for controlling the short term spectral stability of the SSEs to be less than approximately 0.5% variation, the stability control system comprising:
      a junction voltage monitor configured to sense the voltage at a junction of at least one of the plurality of SSEs and provide voltage metrology data to a controller.

2. The light generator system of claim 1, wherein the stability control system further comprises:
   a power regulator to regulate power supplied to a sub-set of the plurality of SSEs;
   a constant current circuit connected to the power regulator to provide a constant current to the sub-set of SSEs;
   a current regulation set point connected to the constant current circuit; and
   the controller configured to set the regulation set point based on metrology relating to the state of the SSEs.

3. The light generator system of claim 2, wherein the stability control system further comprises:
   a temperature sensor that senses the temperature of at least one junction of the sub-set of SSEs and provides metrology data to the controller for adjusting the regulation set point.

4. The light generator system of claim 1, wherein the plurality of SSEs comprise an encapsulant and the light generator system further comprises:
   a thermal management system configured to cool at least one of the encapsulant and the at least one solid state emitter.

5. The light generator system of claim 4, wherein the thermal management system comprises a gas cooling system comprising:
   a gas delivery system; and
   a gas jet configured to receive gas from the gas delivery system and direct it over the encapsulant.

6. A solid state emitter element comprising:
   at least one solid state emitter, the solid state emitter comprising a junction;
   an encapsulant covering the at least one solid state emitter;
   a thermal management system configured to monitor a temperature of the junction and cool at least one of the encapsulant and the at least one solid state emitter based on the monitoring; and
   a stability control system comprising a junction voltage monitor configured to sense the voltage at the junction and the stability control system configured to regulate power supplied to the solid state emitter based on the sensed voltage.

7. The solid state emitter element of claim 6, wherein the thermal management system comprises a first thermal management system configured to cool the encapsulant and a second thermal management system configured to cool the at least one solid state emitter.

8. The solid state emitter element of claim 6, wherein the thermal management system comprises a gas cooling system comprising:
   a gas delivery system; and
   a gas jet configured to receive gas from the gas delivery system and direct it over the encapsulant.

9. A solid state emitter element comprising:
   at least one solid state emitter;
   an encapsulant covering the at least one solid state emitter; and
   a thermal management system configured to cool at least one of the encapsulant and the at least one solid state emitter;
   wherein the thermal management system comprises a gas cooling system comprising:
      a gas delivery system; and
      a gas jet configured to receive gas from the gas delivery system and direct it over the encapsulant; and
   wherein the gas jet comprises an airfoil to provide gas flow with the Coanda effect.

10. The light generating system of claim 1, further comprising:
    a thermal management system configured to monitor a junction temperature of the SSEs and adjust the temperature of the SSEs based on the junction temperature.

* * * * *